(12) United States Patent
Okojie

(10) Patent No.: US 10,515,804 B1
(45) Date of Patent: Dec. 24, 2019

(54) SINGLE CONDUCTOR ALLOY AS DIFFUSION BARRIER SYSTEM AND SIMULTANEOUS OHMIC CONTACT TO N- AND P-TYPE SILICON CARBIDE

(71) Applicant: United States of Americas as represented by the Administrator of NASA, Washington, DC (US)

(72) Inventor: Robert S. Okojie, Strongsville, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 16/055,951

(22) Filed: Aug. 6, 2018

Related U.S. Application Data

(63) Continuation of application No. 15/722,668, filed on Oct. 2, 2017, now Pat. No. 10,056,259.

(Continued)

(51) Int. Cl.
  H01L 29/15 (2006.01)
  H01L 21/04 (2006.01)
  (Continued)

(52) U.S. Cl.
  CPC ...... H01L 21/0485 (2013.01); H01L 21/2855 (2013.01); H01L 21/32134 (2013.01);
  (Continued)

(58) Field of Classification Search
  CPC .......... G01D 11/245; B81B 2201/0264; B81B 2201/0235; B81B 2207/095; B81B 7/0061; B81B 2203/0109; G01B 7/02; G01B 7/044; G01B 7/06; G01B 7/08; G01N 17/04; G01N 27/20; G01N 27/24; G01N 3/56; H01L 21/0485; H01L 2924/0002; H01L 21/2855; H01L 21/30625; H01L 2924/00; H01L 29/1608; H01L 29/45; H01L 21/02378; H01L 21/02447; H01L 21/02529; H01L 21/28518; H01L 21/28568; H01L 21/31053; H01L 21/32133; H01L 21/32134; H01L 21/32139; H01L 21/324; H01L 21/6835; H01L 21/7685; H01L 21/76864; H01L 2221/68313; H01L 22/12; H01L 22/26; H01L 23/53261; H01L 23/53266; H01L 2924/3025; H01L 29/78684; H01L 29/84; B81C 1/00182; B81C 1/00301; B81C 2201/0133; B81C 1/0015; B81C 1/00158; B81C 1/00531; B81C 1/00555;
  (Continued)

(56) References Cited

U.S. PATENT DOCUMENTS

| | | | |
|---|---|---|---|
| 6,759,683 B1 * | 7/2004 | Cole | H01L 21/0485 257/198 |
| 8,373,175 B1 | 2/2013 | Okojie | |

* cited by examiner

*Primary Examiner* — Robert G Bachner
(74) *Attorney, Agent, or Firm* — Robert H. Earp, III; William M. Johnson

(57) ABSTRACT

Use of a single alloy conductor to form simultaneous ohmic contacts (SOC) to n- and p-type 4H—SiC. The single alloy conductor also is an effective diffusion barrier against gold (AU) and oxygen ($O_2$) at high temperatures (e.g., up to 800° C.). The innovation may also provide an effective interconnecting metallization in a multi-level metallization device scheme.

16 Claims, 59 Drawing Sheets

Related U.S. Application Data

(60) Provisional application No. 62/402,131, filed on Sep. 30, 2016.

(51) Int. Cl.
*H01L 21/285* (2006.01)
*H01L 21/768* (2006.01)
*H01L 21/3213* (2006.01)
*H01L 23/532* (2006.01)

(52) U.S. Cl.
CPC .... *H01L 21/7685* (2013.01); *H01L 21/76864* (2013.01); *H01L 23/53261* (2013.01); *H01L 23/53266* (2013.01)

(58) Field of Classification Search
CPC ........ B81C 1/00595; B81C 2201/0132; B81C 2201/0136; F02M 61/18; G01F 1/28; G01L 19/0084; G01L 19/0681; G01L 19/147; G01L 7/00; G01L 9/0042; G01L 19/0645; G01L 9/0035; G01L 9/0054; G01L 9/007
See application file for complete search history.

|  | Sputtering conditions | | |
|---|---|---|---|
| Pressure | 18.5 mTorr | Sputter time | 30 min |
| Spacing | ~5 in. | Pre-sputter | 20 min |
| Gas flow | 25 sccm | Power | 20 W RF |
| Chamber | UHV | Gun | 2 |
| UHV base | $6.1 \times 10^{-8}$ torr | DC bias 1 | −411 V (A) |
| UHV base | $7.7 \times 10^{-8}$ torr | DC bias 2 | −407 V (B) |
| UHV base | $8.2 \times 10^{-8}$ torr | DC bias 3 | −408 V (C) |

FIG. 1

| | Run 1 n=30 | Run 2 n=30 | Run 3 n=30 | All runs n=90 |
|---|---|---|---|---|
| Mean (Å) | 3574 | 3542 | 3539 | 3552 |
| Std dev (Å) | 63 | 77 | 49 | 65 |
| Minimum (Å) | 3415 | 3281 | 3419 | 3281 |
| Maximum (Å) | 3682 | 3659 | 3616 | 3682 |
| Range (Å) | 268 | 377.4 | 197 | 401 |
| % error | 3.7 | 5.3 | 2.8 | 5.6 |

|  | Run 1 n=30 | Run 2 n=30 | Run 3 n=30 | All runs n=90 |
|---|---|---|---|---|
| Mean (Å) | 1.99 | 1.97 | 1.97 | 1.97 |
| Std dev (Å) | 0.03 | 0.04 | 0.03 | 0.04 |
| Minimum (Å) | 1.90 | 1.82 | 1.90 | 1.82 |
| Maximum (Å) | 2.05 | 2.03 | 2.01 | 2.05 |
| Range (Å) | 0.15 | 0.21 | 0.11 | 0.22 |

FIG. 2C

| Sputtering conditions | | | |
|---|---|---|---|
| Pressure | 18.5 mTorr | Sputter time | 30 min |
| Spacing | ~5 in. | Pre-sputter | 20 min |
| Gas flow | 25 sccm | Power | 20 W RF |
| Chamber | UHV | Gun | 2 |
| UHV base | $6.1 \times 10^{-8}$ torr | DC bias 1 | −411 V |
| UHV base | $7.7 \times 10^{-8}$ torr | DC bias 2 | −407 V |
| UHV base | $8.2 \times 10^{-8}$ torr | DC bias 3 | −408 V |

FIG. 2D

| Sputtering conditions | | | |
|---|---|---|---|
| Pressure | 3.5 mTorr | Sputter time | 1 hr |
| Spacing | ~5 in. | Presputter | 20 min |
| Gas flow | 25 sccm | Power | 20 W RF |
| Chamber | UHV | Gun | 1 |
| UHV base | $8.0 \times 10^{-8}$ torr | DC bias 1 | −404 V (A) |
| UHV base | $2.4 \times 10^{-7}$ torr | DC bias 2 | −406 V (B) |
| UHV base | $2.7 \times 10^{-7}$ torr | DC bias 3 | −406 V (C) |

FIG. 3

| | Run 1 n=30 | Run 2 n=30 | Run 3 n=30 | All runs n=90 |
|---|---|---|---|---|
| Mean (Å) | 2449 | 2478 | 2470 | 2466 |
| Std dev (Å) | 71 | 89 | 71 | 77 |
| Minimum (Å) | 2319 | 2296 | 2327 | 2296 |
| Maximum (Å) | 2547 | 2606 | 2589 | 2606 |
| Range (Å) | 228 | 310 | 261 | 310 |
| % error | 4.7 | 6.3 | 5.3 | 6.3 |

|  | Run 1 n=30 | Run 2 n=30 | Run 3 n=30 | All runs n=90 |
|---|---|---|---|---|
| Mean (Å) | 0.68 | 0.69 | 0.69 | 0.68 |
| Std dev (Å) | 0.02 | 0.025 | 0.02 | 0.02146 |
| Minimum (Å) | 0.64 | 0.64 | 0.65 | 0.64 |
| Maximum (Å) | 0.71 | 0.72 | 0.72 | 0.72 |
| Range (Å) | 0.06 | 0.09 | 0.07 | 0.09 |

FIG. 4C

| Sputtering conditions | | | |
|---|---|---|---|
| Pressure | 3.5 mTorr | Sputter time | 1 hr |
| Spacing | ~5 in. | Presputter | 20 min |
| Gas flow | 25 sccm | Power | 20 W RF |
| Chamber | UHV | Gun | 1 |
| UHV base | $8.0 \times 10^{-8}$ torr | DC bias 1 | −404 V (A) |
| UHV base | $2.4 \times 10^{-7}$ torr | DC bias 2 | −406 V (B) |
| UHV base | $2.7 \times 10^{-7}$ torr | DC bias 3 | −406 V (C) |

FIG. 4D

| W70-Ni30 |  |
| --- | --- |
| Measured (810 nm laser) | |
| Thickness, Å | Stress, MPa |
| 488 | 796.5 |
| 1086 | 898.4 |
| 1494 | 1192 |
| 2105 | 645.7 |

| W70-Ni30 |  |
| --- | --- |
| Calculated (810 nm laser) | |
| Thickness, Å | Stress, MPa |
| 488 | 918 |
| 1086 | 900 |
| 1494 | 1190 |
| 2105 | 647 |

| W100% | |
|---|---|
| Measured (810 nm laser) | |
| Thickness, Å | Stress, MPa |
| 1182 | 113 |
| 2364 | 133.1 |
| 3546 | 94.16 |
| 5183 | 68.03 |

| W100% | |
|---|---|
| Calculated (810 nm laser) | |
| Thickness, Å | Stress, MPa |
| 1182 | 124 |
| 2364 | 133 |
| 3546 | 94.3 |
| 5183 | 68.15 |

| Annealing conditions | |
|---|---|
| Time | 5s |
| Temperature | 1000 °C |
| Pressure | 239 mTorr |
| Gas backfill | None |

| Doping level | $1.4 \times 10^{19}$ (n-type) |
|---|---|
| Metal deposited | W75-Ni25 (1000 Å) |
| | Si (200 Å) cap |

| Annealing conditions | |
|---|---|
| Time | 5 s |
| Temperature | 1000 °C |
| Pressure | 239 mTorr |
| Gas backfill | None |

| Doping level | >2×10¹⁹ (p-type) |
|---|---|
| Metal deposited | W75-Ni25 (1000 Å) Si (200 Å) cap |

|  | Pre-anneal | | |
|---|---|---|---|
| Doping level | W90–Ni10 | W75–Ni25 | W50–Ni50 |
| $>2\times10^{19}$ n-type | Ohmic | Rectifying | Ohmic |
| $1.4\times10^{19}$ n-type | Ohmic | Rectifying | Ohmic |
| $>2\times10^{19}$ p-type | Ohmic | Rectifying | Ohmic |
| $1.6\times10^{19}$ p-type | Rectifying | Rectifying | Rectifying |

FIG. 23A

|  | Post 5 s 1000 °C anneal | | |
|---|---|---|---|
| Doping level | W90–Ni10 | W75–Ni25 | W50–Ni50 |
| $>2\times10^{19}$ n-type | Ohmic | Ohmic | Ohmic |
| $1.4\times10^{19}$ n-type | Ohmic | Ohmic | Ohmic |
| $>2\times10^{19}$ p-type | Ohmic | Ohmic | Ohmic |
| $1.6\times10^{19}$ p-type | Rectifying | Rectifying | Rectifying |

FIG. 23B

|  | Post 60 min 900 °C anneal | | |
|---|---|---|---|
| Doping level | W90–Ni10 | W75–Ni25 | W50–Ni50 |
| $>2\times10^{19}$ n-type | Rectifying | Ohmic | Ohmic |
| $1.4\times10^{19}$ n-type | Rectifying | Ohmic | Ohmic |
| $>2\times10^{19}$ p-type | Ohmic | Ohmic | Ohmic |
| $1.6\times10^{19}$ p-type | Rectifying | Rectifying | Rectifying |

*For our tests an IV curve is ohmic if it has an $R^2$ value of greater than 0.99.

FIG. 23C

| Carbides | Work function | Silicides | Work function |
|---|---|---|---|
| Al | | x | |
| TiC | 3.8/4.1 | Ti$_5$Si$_3$ | 3.7 (n-type) |
| | | TiSi | 3.9 (n-type) |
| | | TiSi$_2$ | 3.95 to 4.18 (n-type) |
| VC | 4.3 | VSi$_2$ | 4.63 |
| Cr$_3$C$_2$ | 5.10 to 5.20 (p-type) | CrSi$_2$ | 4.32 |
| Mn | x | Mn | |
| Co | x | Co$_2$Si | 4.87 |
| | | CoSi | 4.55 |
| | | CoSi$_2$ | 4.56 |
| Ni | x | Ni$_2$Si | 4.79 (n-type) |
| | | NiSi | 4.93 (n-type) |
| | | NiSi$_2$ | 4.54 (n-type) |
| Cu | x | Cu | |
| Se | | Se on Si | 5.9 |
| Pd | x | Pd$_2$Si | 5.04 (p-type) |
| Rh | | Rh on SiO2 | 5.43 |
| Ru | | Ru | 4.71 |
| Mo$_2$C | 3.5 to 3.8 | MoSi$_2$ | 4.9 |
| NbC | 4.1 | NbSi$_2$ | 4.3 |
| ZrC | 3.70 | | |
| HfC | 4.63 | | |
| TaC | 4.38 | TaSi$_2$ | 4.71 |
| TaC$_x$N$_y$ | 4.6 to 5.2 | | |
| WC-C | 6.3 (p-type) | W$_5$Si$_3$ | 4.31 |
| WC-W | 5.3 (p-type) | WSi$_2$-Si | 4.76 (n-type) |
| | | WSi$_2$-W | 5.1 (p-type) |
| Re | | Re | |
| Os | | OsSi$_{1.8}$ | 4.75 |
| Ir | | IrSi | 5.08 |
| Pt | x | PtSi, Pt$_2$Si | 5.15 to 5.75 (p-type) |

FIG. 24

FIG. 33
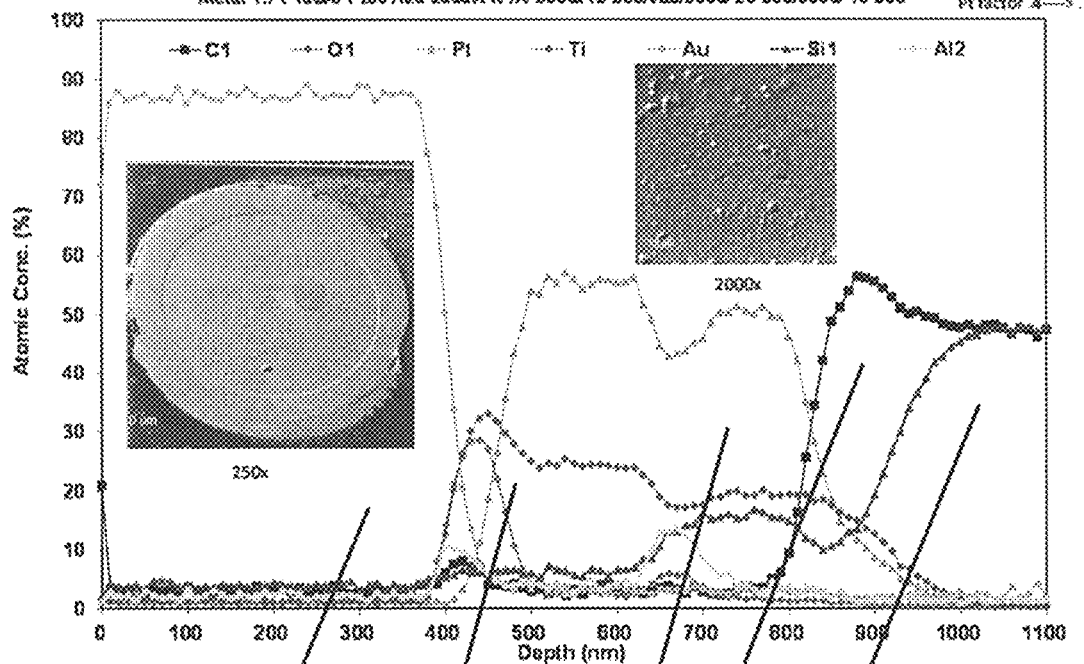
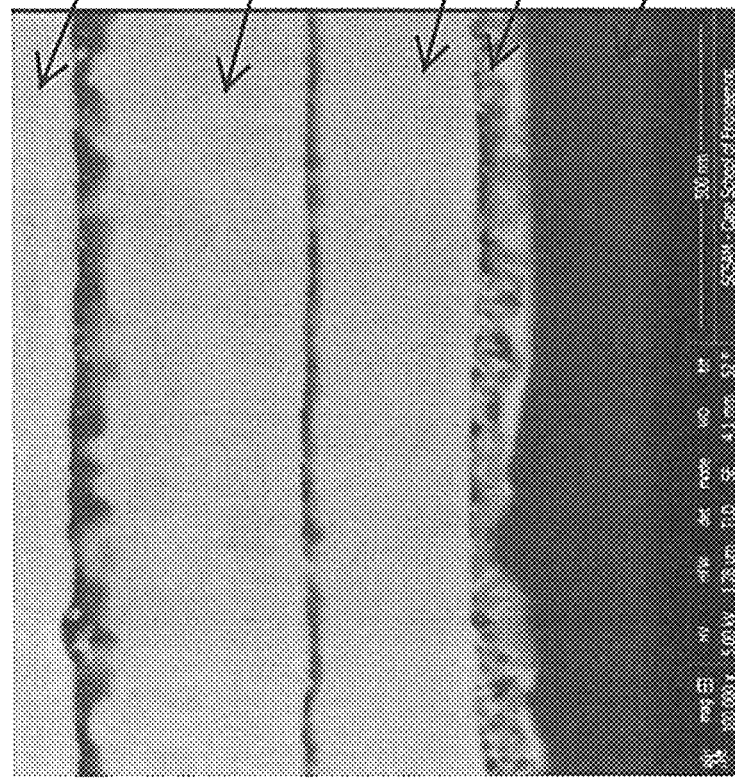

800
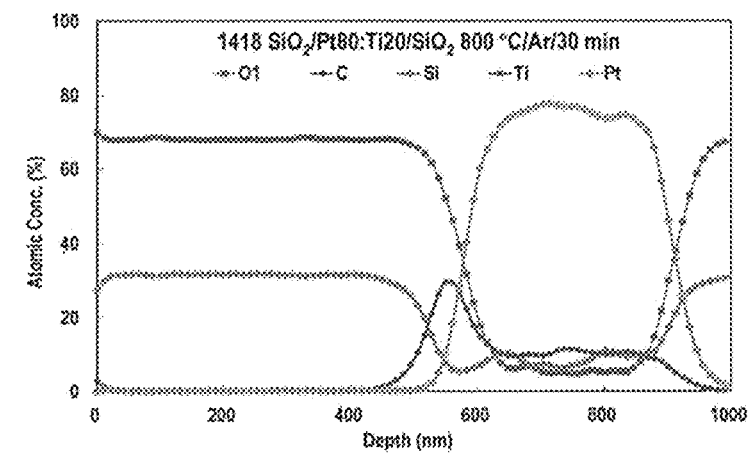
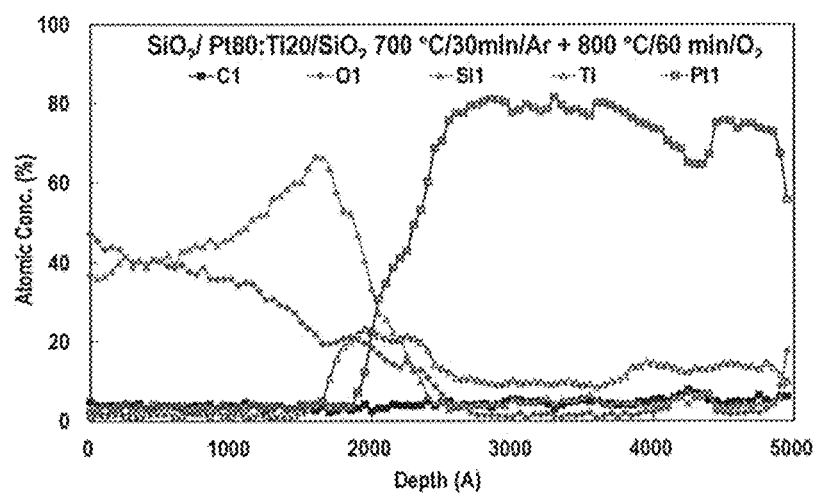
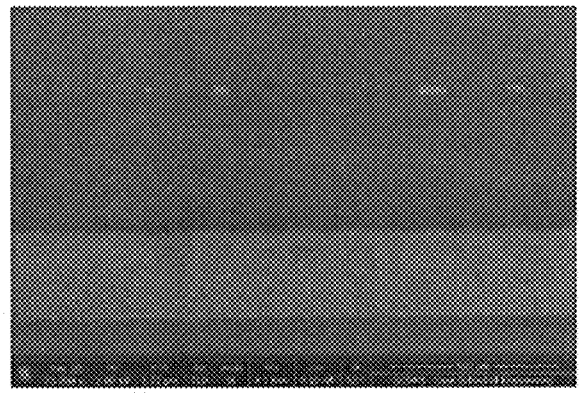
$R_s = 3.13 \, \Omega/\square$
FIG. 39B

SINGLE CONDUCTOR ALLOY AS DIFFUSION BARRIER SYSTEM AND SIMULTANEOUS OHMIC CONTACT TO N- AND P-TYPE SILICON CARBIDE

CROSS-REFERENCE TO RELATED APPLICATIONS

This application is a Continuation of U.S. patent application Ser. No. 15/722,668 entitled "Single Conductor Alloy as Diffusion Barrier System and Simultaneous Ohmic Contact to N- and P-Type Silicon Carbide" filed on Oct. 2, 2017 which claims the benefit of U.S. Provisional Patent Application Ser. No. 62/402,131 entitled "Single Conductor Alloy as Diffusion Barrier System and Simultaneous Ohmic Contact to N- and P-Type Silicon Carbide" filed on Sep. 30, 2016, the entirety of which each application is incorporated herein by reference.

ORIGIN OF THE INVENTION

The invention described herein was made by an employee of the United States Government and may be manufactured and used only by or for the Government for Government purposes without the payment of any royalties thereon or therefore.

BACKGROUND

Traditional high temperature devices are generally placed several distances from high temperature environments in order to prevent them from failing, due to the inability to survive the high temperature. Generally, the failure of these devices (e.g., sensors and electronics) is due to the instability or lack of robustness of the contact metallization and packaging. Unique problem characteristics are the effects posed by temperature on semiconductor sensors and electronics as they are further inserted into the higher temperature sections of the monitored environment. This is primarily because, as the devices with traditional electrical ohmic contacts are inserted further into higher temperature sections, their performance characteristics degrade dramatically to the point that they fail catastrophically.

As a result of the aforementioned scenario, devices with conventional ohmic contact metallization are generally placed several distances away from environments having extreme temperatures. In other words, the devices are positioned in lower temperature sections (e.g., of an engine) where the temperature would not adversely impact the contact metallization or the package.

In addition to the above disadvantage of conventional metallization on devices, there is also a problem of complexity and production costs that is associated with their fabrication. Most semiconductor electronic and some sensing devices operate in bi-polar mode, which means that the device's physical configuration contains sections that are doped either n- or p-type. As a result, the metallization needed to make ohmic contact to either of the layers is exclusive to that layer. This means that below a certain doping level, a metal (or metal compound/mixture) that is ohmic on an n-doped layer generally would be rectifying on a p-doped layer. Conversely, a metallization that is ohmic on a p-doped layer would be rectifying if deposited on an n-doped layer.

Therefore, on a bi-polar device, multiple process steps of successive depositions, photolithography, and etches are required to deposit and pattern the desired ohmic contact metallization. This process is time consuming and expensive. For example, in some instances, one of the layers is degenerately doped (usually the p-type SiC) so that the exclusivity is removed, thereby making it possible for a single metal to be ohmic on both n- and p-type layers. The process of forming a degenerately doped layer in the contact area is by high-energy ion implantation. This entails surface preparation prior to ion implantation, usually performed at temperatures around 1100° C. As can be appreciated, the process not only adds cost, but the implantation process itself causes damage to the lattice structure of the device. The induced damage can only be partially reversed after annealing. Post ion implantation also requires that the implant be activated at temperature as high as 1200° C., and it is known that not all the implants are fully activated.

SUMMARY

The following presents a simplified summary in order to provide a basic understanding of some aspects of the innovation. This summary is not an extensive overview of the innovation. It is not intended to identify key/critical elements or to delineate the scope of the innovation. Its sole purpose is to present some concepts of the innovation in a simplified form as a prelude to the more detailed description that is presented later.

The innovation disclosed and claimed herein, in one aspect thereof, comprises a simultaneous formation of electrical ohmic contacts to silicon carbide (SiC) semiconductor having donor and acceptor impurities (n- and p-type doping, respectively). More particularly, the ohmic contact can be formed on SiC layers having n- and p-type doping at one process step during the fabrication of the semiconductor device. Accordingly, the multiple process steps for fabricating contacts on to n- and p-type surfaces can be greatly reduced, thereby reducing time and cost, and increasing yield.

Additionally, the innovation discloses a metallization scheme that can serve as a non-discriminatory, universal ohmic contact to both n- and p-type SiC, without compromising the reliability of the specific contact resistivity when operated at temperatures in excess of 600° C.

According to an aspect, the innovation provides a structure and method of use of a single alloy conductor to form simultaneous ohmic contacts (SOC) to n- and p-type 4H—SiC. In addition to forming SOC to n- and p-type 4H—SiC, the single alloy conductor is an effective diffusion barrier against gold (Au) and oxygen ($O_2$) at high temperatures (e.g., as high as 800° C.).

In addition to forming SOC and diffusion barrier against Au and $O_2$, the single alloy conductor is an effective interconnecting metallization in a multi-level metallization device scheme.

In one embodiment, Phase Segregation Annealing was applied to co-sputtered Pt:Ti composition ratios on p- and n-type 4H—SiC to form simultaneous ohmic contacts. This significantly reduces the time and cost to fabricate semiconductor SiC devices.

The application of the same Pt:Ti composition above the ohmic contact layer to act as a diffusion barrier Compositions of the innovation may be used to manufacture devices includes SiC electronics and sensors. The innovation will enable these devices to operate reliably at desired temperatures.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

BRIEF DESCRIPTION OF THE DRAWINGS

FIG. 1 illustrates example specifications of a Tungsten (W) uniformity experiment in accordance with the innovation.

FIGS. 2A-2D illustrate example results of a W uniformity experiment in accordance with the innovation.

FIG. 3 illustrates an example Silicon (Si) uniformity experiment in accordance with aspects of the innovation.

FIGS. 4A-4D illustrate example results of a Si uniformity experiment in accordance with the innovation.

FIGS. 11A-19C illustrate example comparative graphs for each sample (N5, N6, N7, N8, N9, NX, P5, P7 and P95) and their three different measurements in accordance with aspects of the innovation.

FIGS. 23A-23C illustrate an example summary chart of a WNi scheme in accordance with aspects of the innovation.

FIG. 24 illustrates an example work function table of metal silicides and carbides in accordance with aspects of the innovation.

FIG. 33 depicts an AES depth profile and corresponding cross section FIB-FESEM image of an example embodiment according to the innovation.

FIGS. 39A-39C depict AES depth profiles and corresponding cross section FIB-FE-SEM image of the co-sputtered Pt80:Ti20 at. %.

DETAILED DESCRIPTION

Figures 2A, 2B:
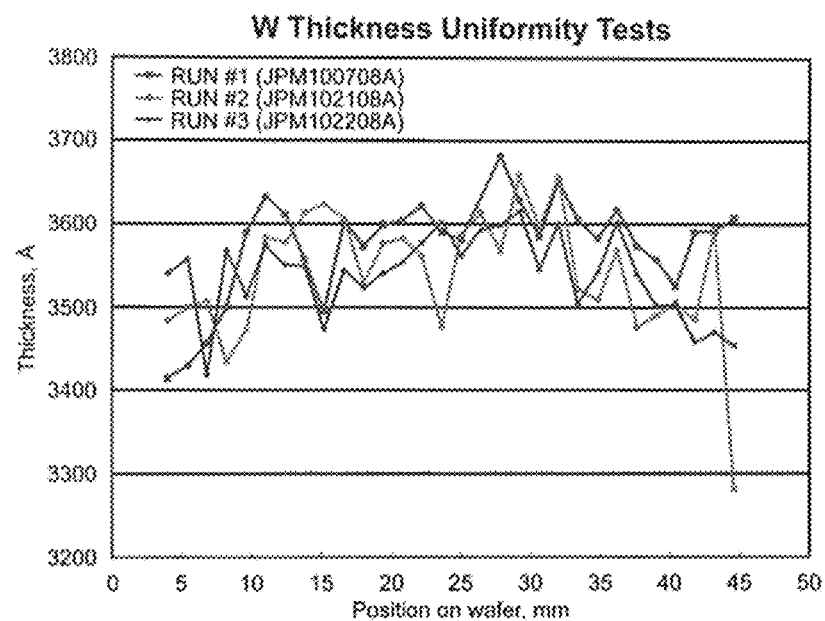
Figures 4A, 4B:
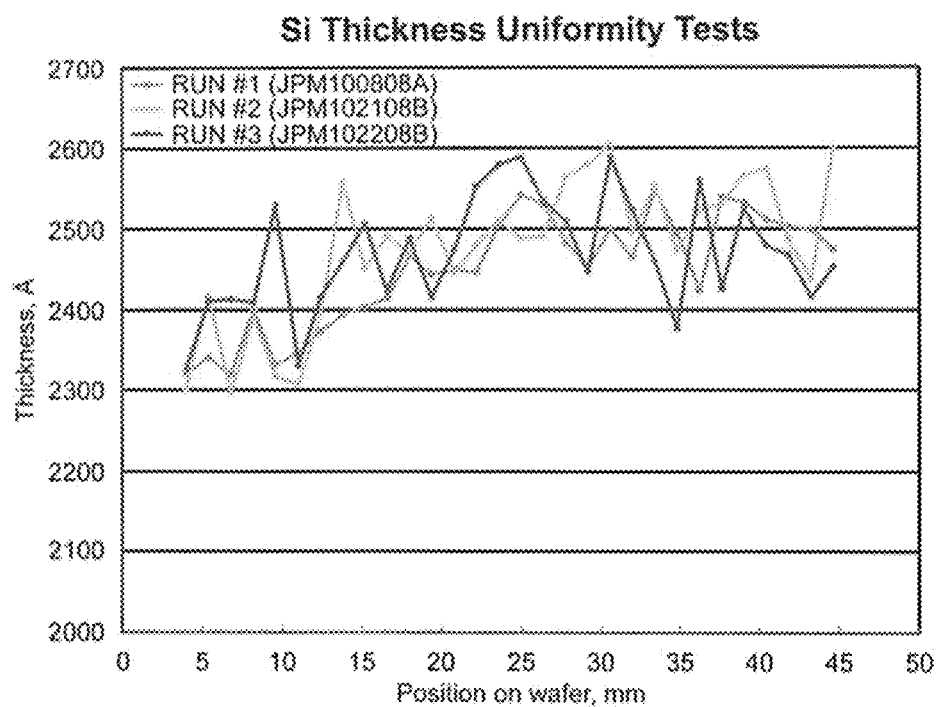
Figure 5:
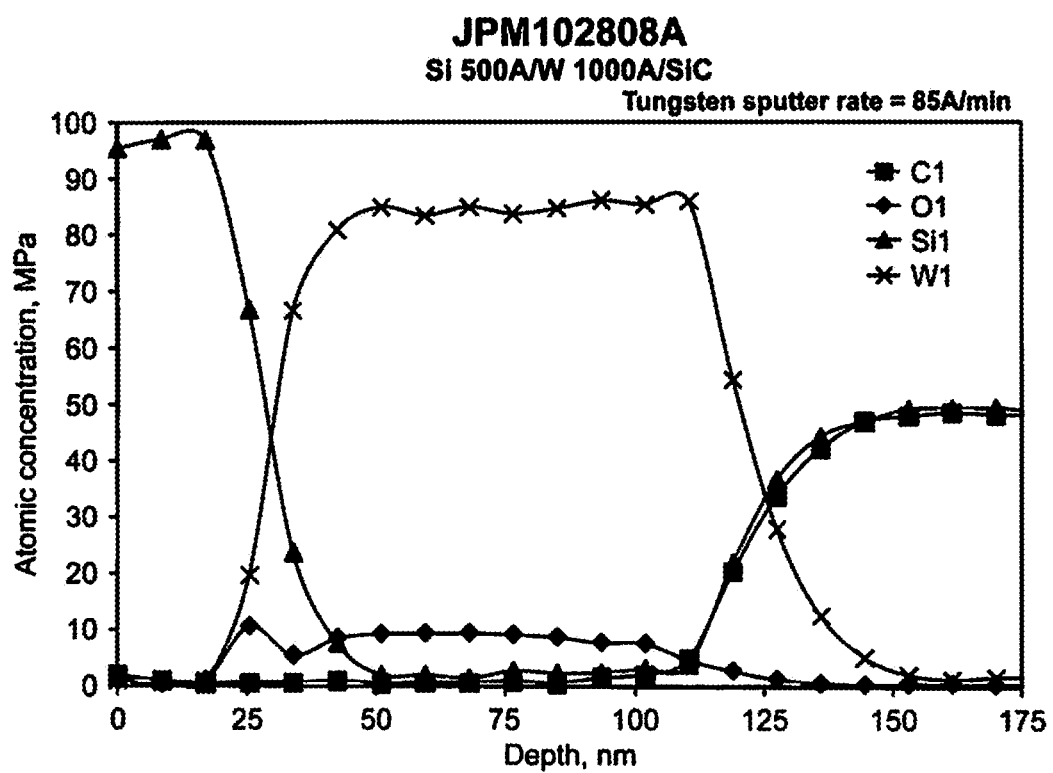
FIG. 5 illustrates an example Auger Electron Spectroscopy graph in accordance with a Si uniformity experiment in accordance with the innovation.
Figure 6:
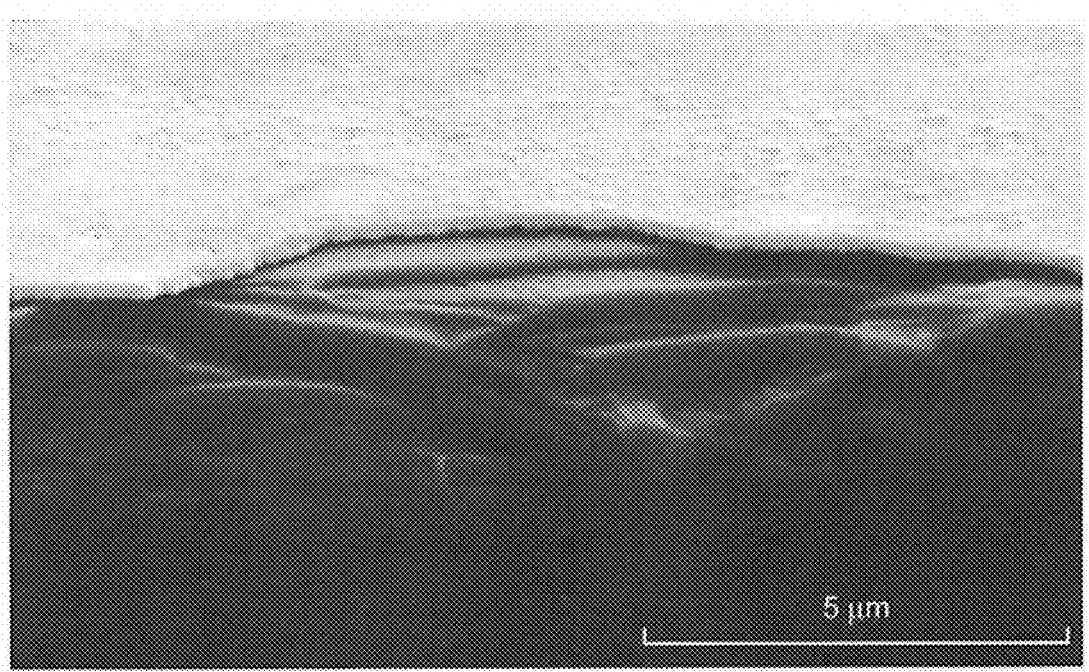
FIG. 6 illustrates an example photograph of a W/Si annealing experiment in accordance with the innovation.
Figures 7A, 7B, 7C:
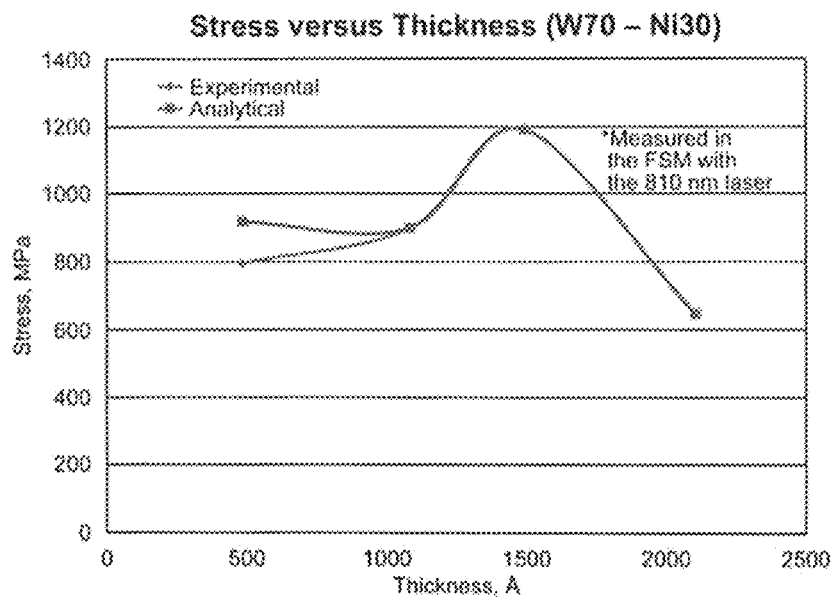
FIGS. 7A-7C illustrate example stress results in accordance with an aspect of the innovation.
Figures 8A, 8B, 8C:
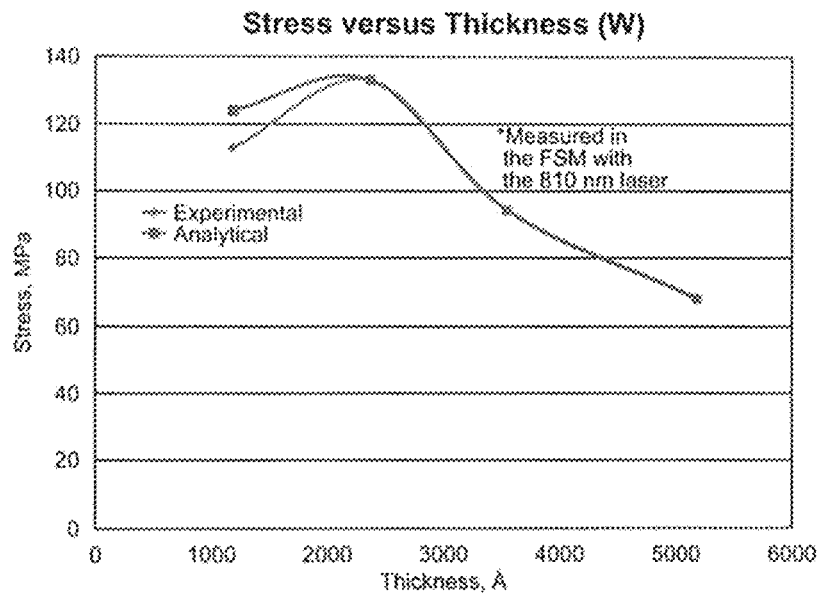
FIGS. 8A-8C illustrate example stress results in accordance with an aspect of the innovation.
Figure 9:
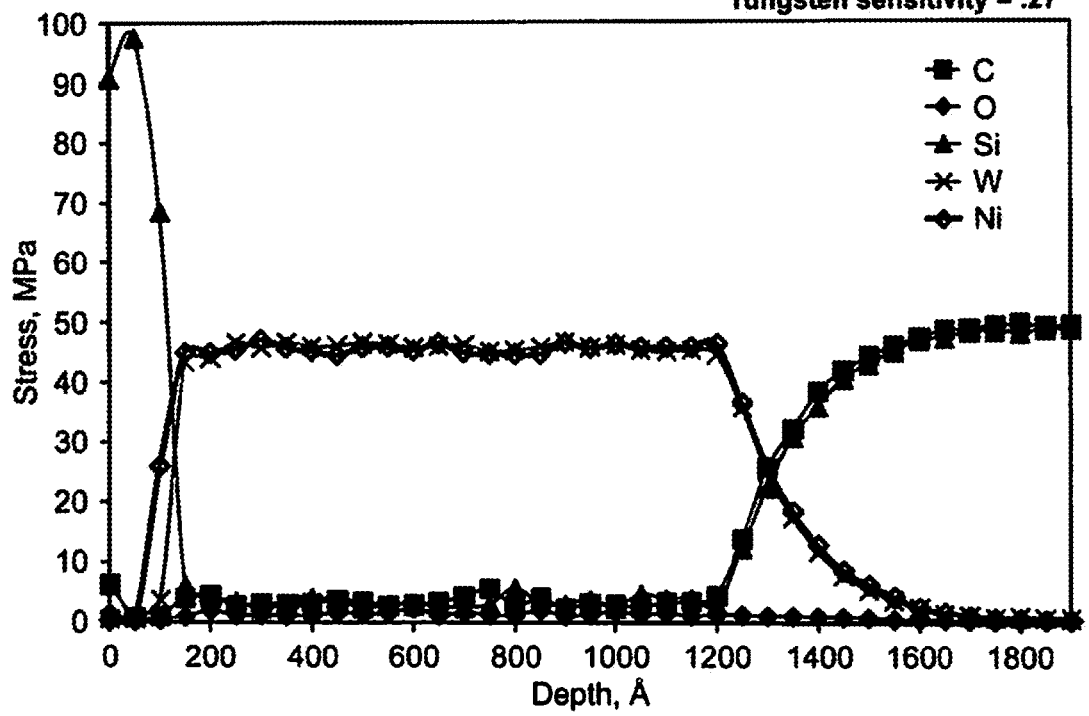
FIG. 9 illustrates example Auger data in accordance with an aspect of the innovation.
Figure 10:
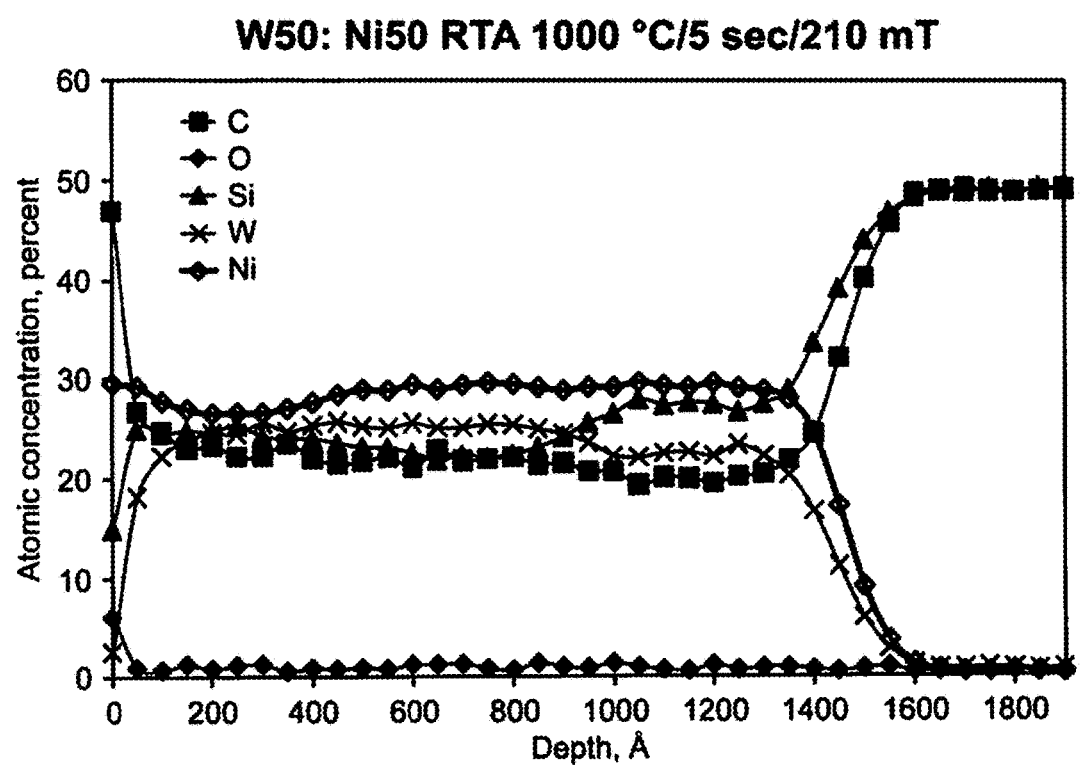
FIG. 10 illustrates example results following annealing in accordance with an aspect of the innovation.
Figures 11A, 11B, 11C:
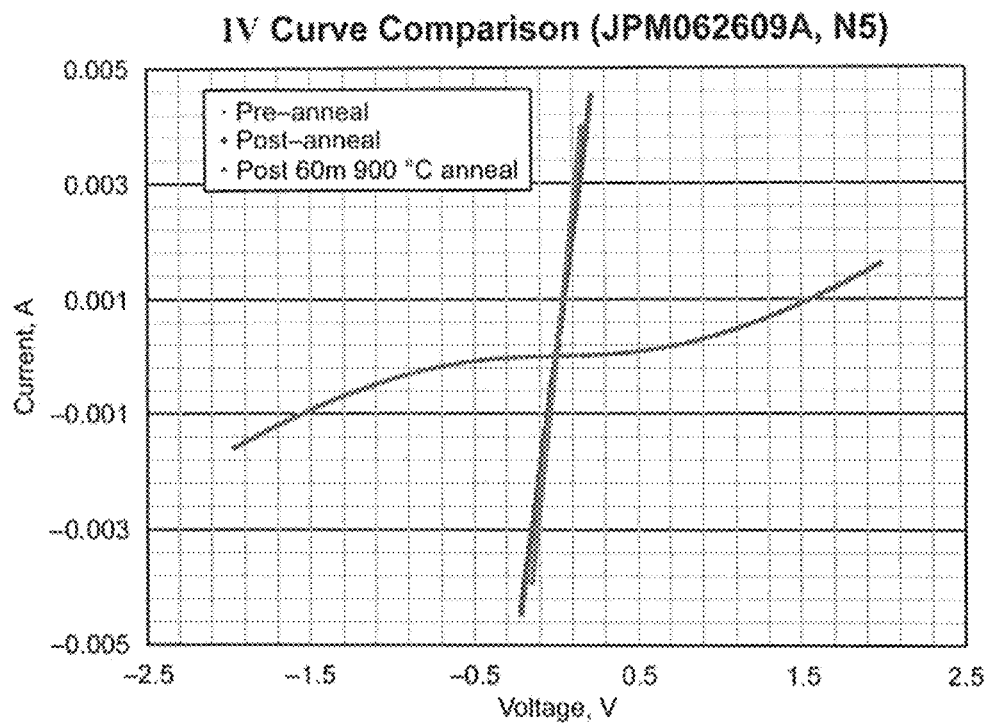
Figures 12A, 12B, 12C:
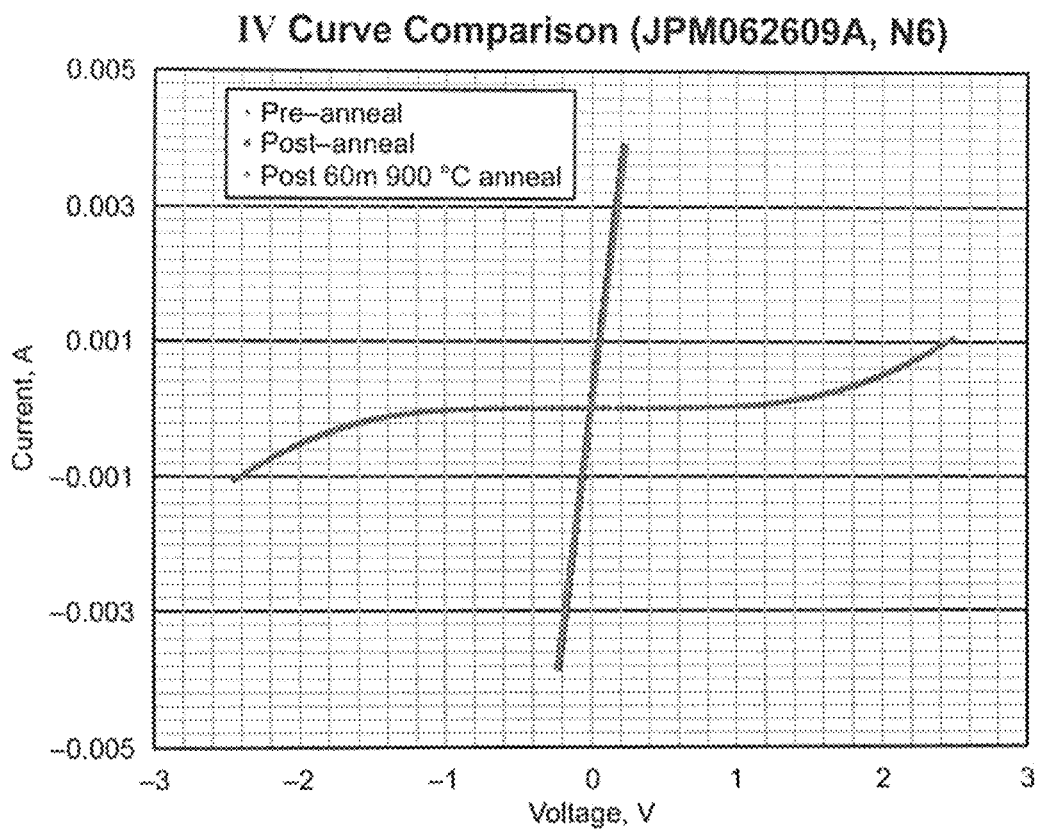
Figures 13A, 13B, 13C:
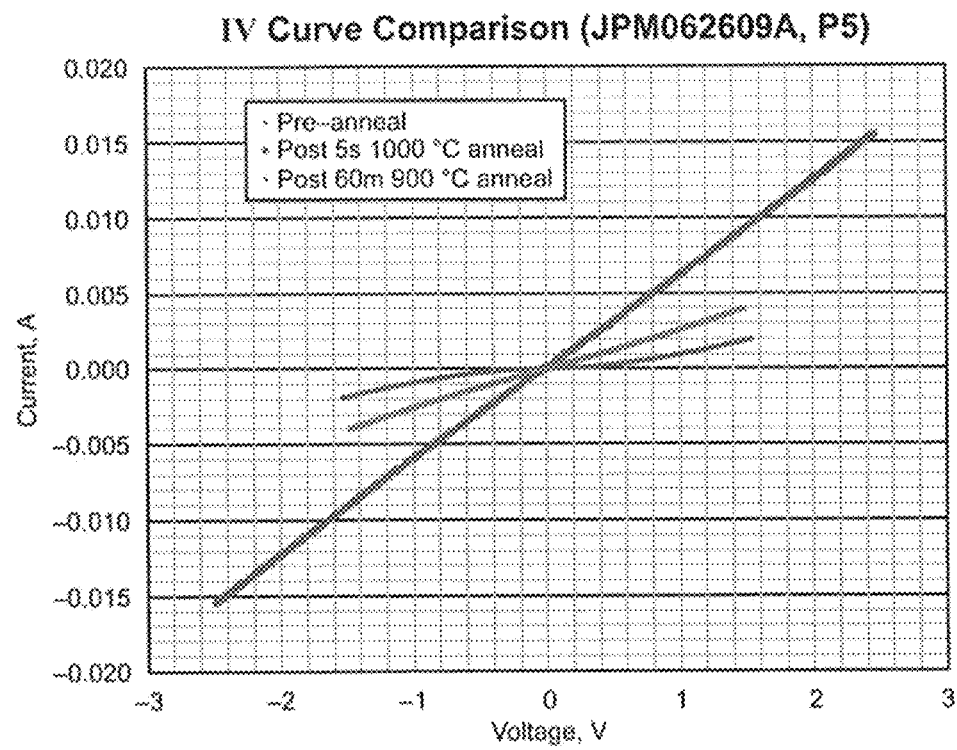
Figures 14A, 14B, 14C:
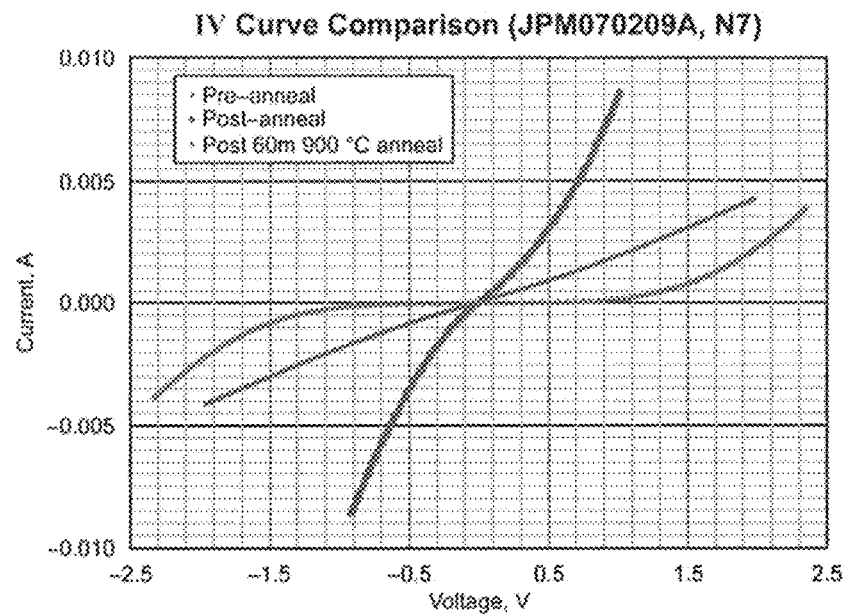
Figures 15A, 15B, 15C:
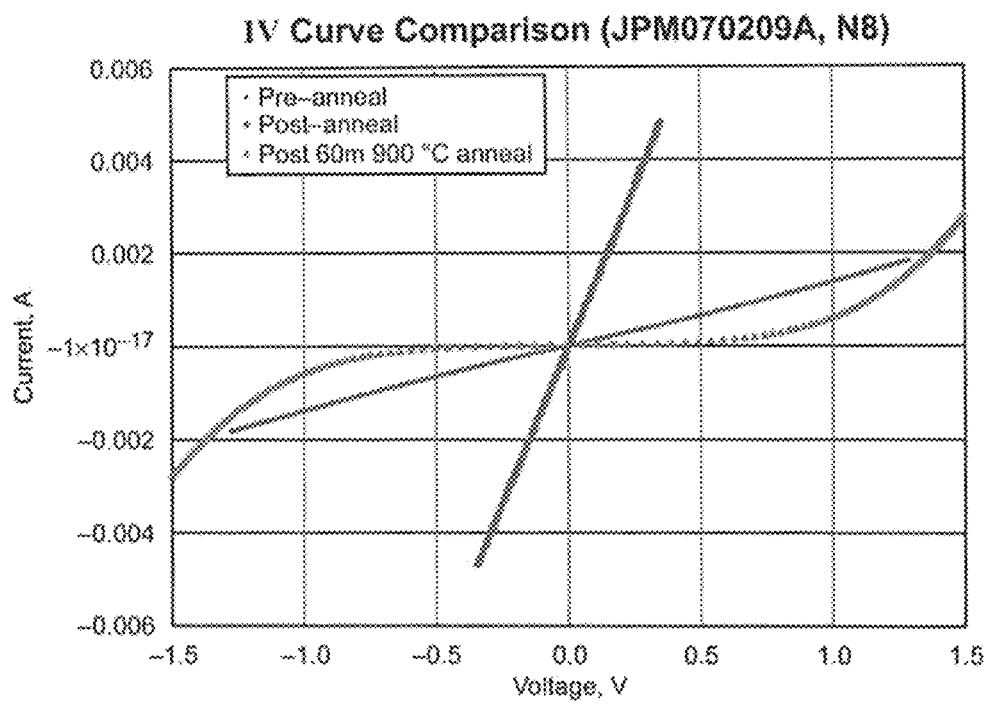
Figures 16A, 16B, 16C:
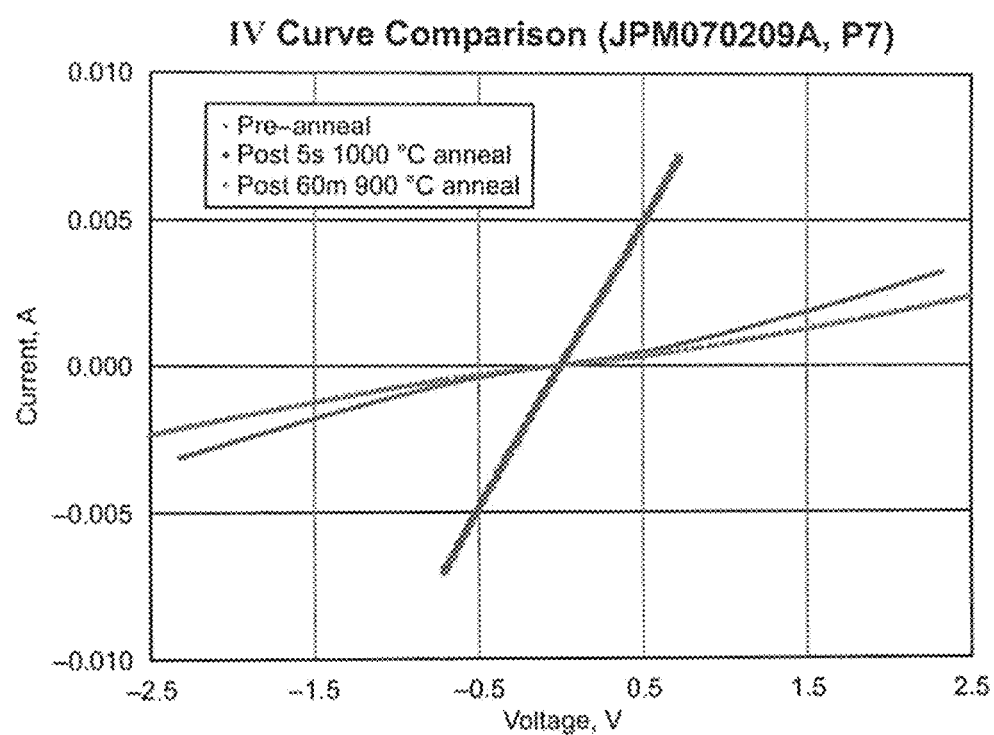
Figures 17A, 17B, 17C:
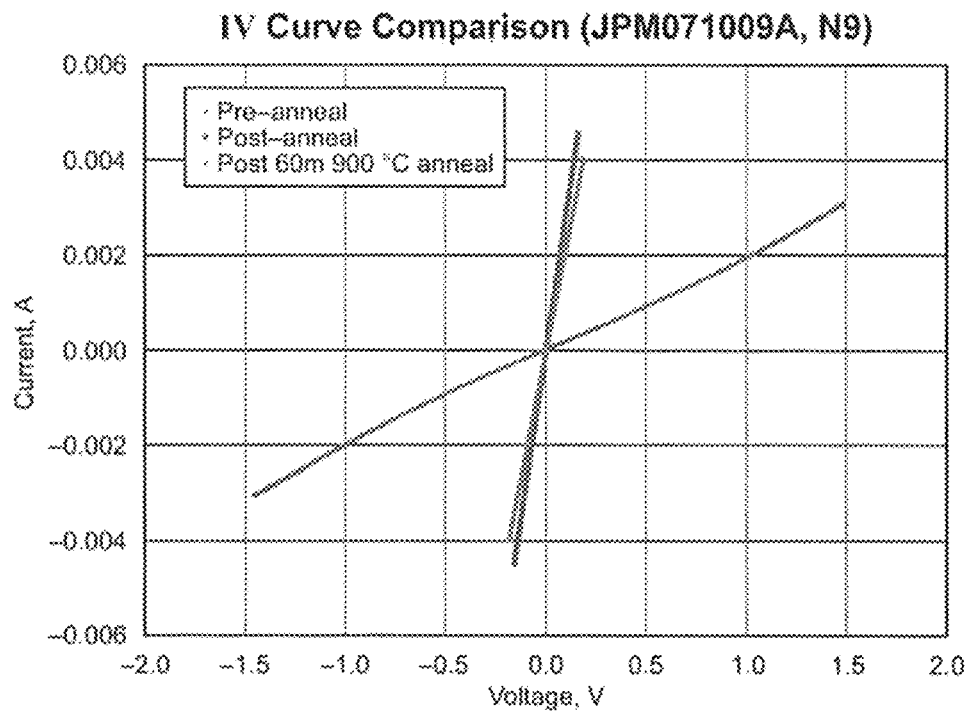
Figures 18A, 18B, 18C:
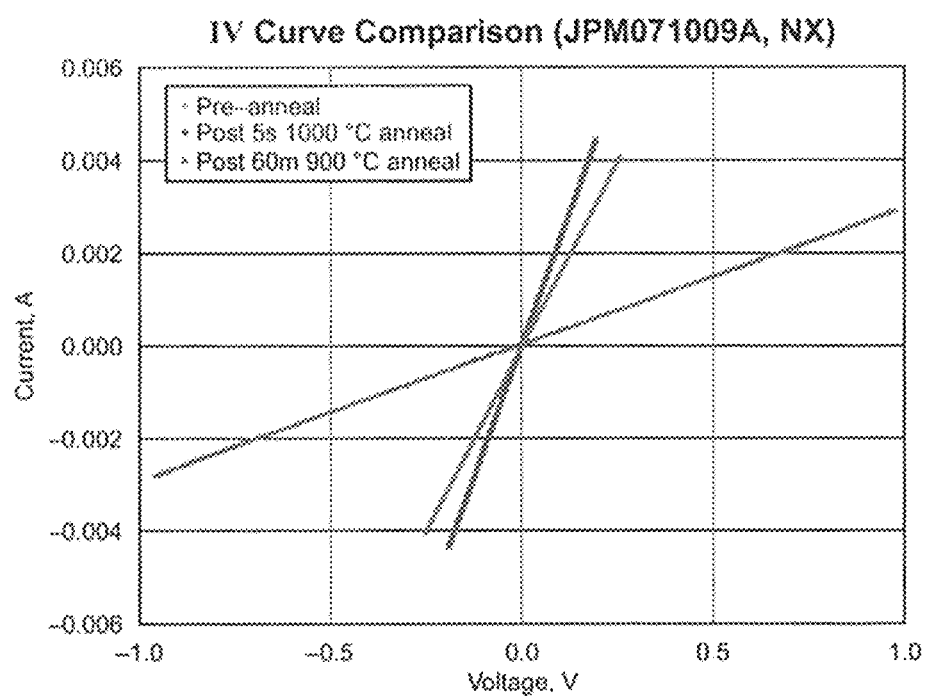
Figures 19A, 19B, 19C:
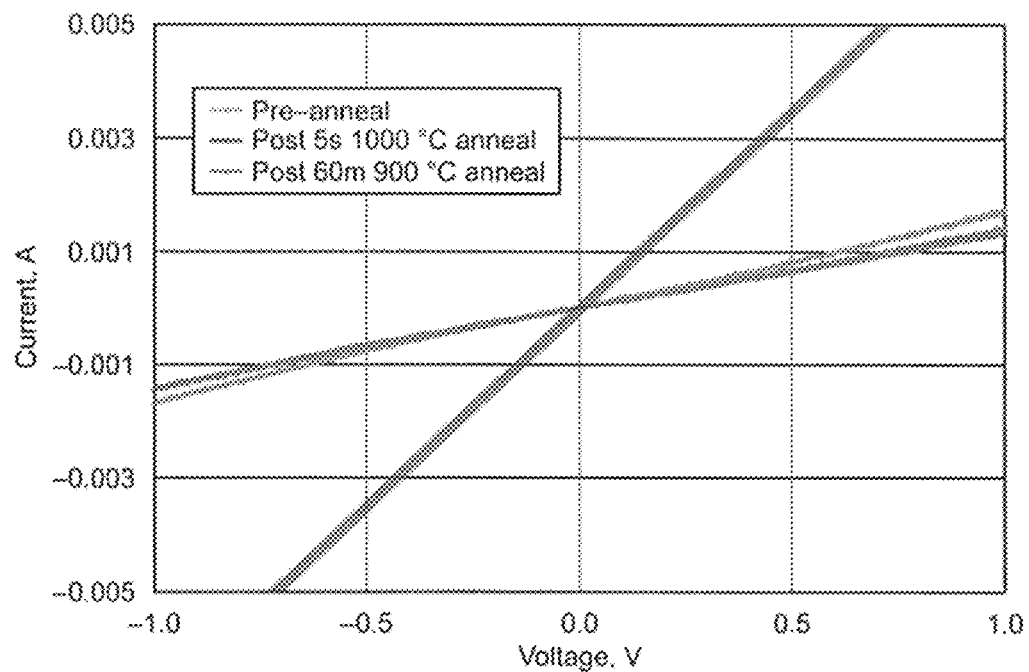

The following terms are used throughout the description, the definitions of which are provided herein are included to assist in understanding various aspects of the subject innovation. The definitions are not intended to limit the scope of this specification in any manner.

Chemical etching refers to a process of using acids, bases or other chemicals to dissolve unwanted materials such as metals or semiconductor materials;

Current-Voltage Characteristic (I-V Curve) refers to a relationship, typically represented as a chart or graph, in which an electric current is measured as function of voltage;

Electron beam evaporation refers to a process of deposition in which an electron beam is directed at a crucible of metal. The electron beam causes atoms from the target to transform into the gaseous phase. These atoms then precipitate into solid form coating everything in the vacuum chamber with a thin layer of the material;

Glow discharge refers to a conduction of electricity in a low-pressure gas, producing a diffuse glow;

Photoelectron spectroscopy refers to energy measurement of electrons emitted from solids, gases or liquids by the photoelectric effect, in order to determine the binding energies of electrons in a substance. There are two types described infra, Auger Photoelectron Spectroscopy and X-Ray Photoelectron Spectroscopy (XPS);

Physical vapor deposition refers to a general term used to describe most any of a variety of methods to deposit thin films by the condensation of a vaporized form of the material onto various surfaces;

Probe station is used to acquire signals from the internal nodes of a semiconductor device. In the following discussion, a probe station is used to measure I-V Curves;

Rapid Thermal Anneal (RTA) refers to a semiconductor manufacturing process that heats a substrate and the thin film on it to high temperatures in several seconds or less. During cooling, wafer temperatures are decreased slowly in order to prevent the breaking of the substrate;

Scanning Electron Microscope (SEM) refers to a type of electron microscope that images a sample surface by scanning it with a high-energy beam of electrons in a raster scan pattern;

Semiconductor is a material that has an electrical resistivity between that of a conductor and an insulator. Semiconductor properties are often affected by the environment they are in, e.g., in a high temperature environment a semiconductor's resistivity will generally be lower;

Sputtering refers to a process that uses ions of an inert gas to dislodge atoms from the surface of a crystalline material, the atoms then being electrically deposited to form an extremely thin coating on a glass, metal, plastic, or other surface;

Substrate refers to a supporting material on which a circuit is formed or fabricated, e.g., where the atoms from the target are collected as a thin film;

Target refers to a circular object made of the material that is to be sputtered; and Work function refers to the minimum amount of energy required to remove an electron from the surface of a metal.

A dual ohmic contact to n- and p-type silicon carbide is described in U.S. patent application Ser. No. 12/791,276, now U.S. Pat. No. 8,373,175, the entirety of which is incorporated herein by reference.

The basic building block of complex semiconductor integrated circuits is the p-n junction, which in conventional practice, requires successive fabrication steps to separately form ohmic contacts to the p-type and n-type conductivity contact regions. Under the Mott-Schottky rule if the metal has a high work function (WF) relative to the p-type semiconductor electron affinity, it will be ohmic and rectifying on the n-type. Conversely, metals with low WF, relative to the n-type affinity will be ohmic while rectifying on the p-type. In the absence of Fermi level pinning, and if the semiconductor is non-degenerately doped, the charge transport across the metal/semiconductor interface is dominated by thermionic emission (TE) or field-emission (FE) mechanisms. The dominance of one over the other is determined by the metal WF in relation to that of the semiconductor and the thickness of the depletion region as controlled by the doping level. Under the above conditions, to achieve ohmic contacts to both n and p conductivity regions typically requires two separate metallization schemes, which are conventionally obtained by performing multiple and repeated fabrication process steps. Presently, to circumvent this time consuming and costly practice, and also to further reduce the metal/semiconductor contact resistance (hence reducing junction power loss), the semiconductor is degenerately doped by high energy ion implantation and subsequent high temperature implant anneal. This allows tunneling to be the dominant charge transport mechanism over TE and FE, thereby circumventing the Mott-Schottky rule and permitting the use of a single metallization scheme in realizing simultaneous ohmic contacts (SOC) to the two conductivity contact regions.

While silicon carbide (SiC) semiconductor device technology also suffers the above costly and time consuming traditional practice, the financial impact is more dramatic, starting with the high cost of the SiC wafers. Unlike silicon-based devices that mostly utilize low cost and short duration wet etching process technology, the batch fabrication of SiC relies solely on reactive ion etching (RIE) to realize microelectromechanical and electronic devices. The resulting non-planar topography obtained from such RIE process is generally not friendly to subsequent multiple surface fabrication process steps, thereby leading to non-uniform device-to-device performance characteristics and reduced yields. Also, since the ion implantation process has a high energy physical impact on the semiconductor, lattice damage is common occurrence, which would usually require high temperature (>1200° C.) post implant anneal to reverse some of the damage.

As the operation of certain class of semiconductor electronic and sensing devices is extended to temperatures greater than 500° C., the degradation of the contact metallization to these devices tend to increase at near exponential rate. The resultant outcome is the correspondingly gradual operational degradation of the devices, eventually leading to premature catastrophic failure. The primary mechanisms responsible for such failures are: (1) oxidation of the contact metallization by adventitious oxygen diffusion into the metallization from outside, which leads to increase in the resistance of the metallization; (2) the inter-mixing of the multiple metallization layers that constitute the metallization system leads to micro-structural phase transformations, void formation, Kirkendall vacancies, and grain boundary nucleation, which all cooperatively act to degrade the electrical functional characteristics of the metallization; and (3) intermetallic diffusion to the semiconductor interface, forming a new interfacial layer with the semiconductor, thus changing the metal/semiconductor interface electronic characteristics from either ohmic to Schottky or Schottky to ohmic contacts.

Conventional semiconductor pressure sensors are typically rated up to 125° C. One reason is because this class of semiconductors, such as silicon, is limited by their material properties at higher temperatures and enhanced surface reactivity with the contact metallization. Extending the device operation beyond its operating temperature limit leads to the degradation of performance and eventual catastrophic failure in a very short time. In the absence of alternative devices that can operate at higher temperatures, various cooling strategies have been deployed, which extends sensor operation to ~350° C. However, by applying this strategy new challenges are introduced. For example, water cooling can compromise signal integrity, since it couples externally sourced cold temperature and the turbulence generated by the flowing coolant with the temperature of the test environment to distort the actual reading. Alternatively, the pressure sensors are recessed a few inches to feet away to a lower temperature location via an infinite tube. The disadvantages of this strategy include the introduction of propagation delays of the pressure waves to the sensor. Considering that the infinite tube is essentially an acoustic filter, the attenuation of critical thermos-acoustic frequencies that are responsible for the instabilities could be missed, thus making it difficult to detect and mitigate such instabilities that might damage engine components. The bulkiness that is typically associated with the water- or gas-cooled sensors makes it difficult to be inserted deeper into the environment.

Semiconductor metallizations are typically divided into four functional categories: ohmic contacts, diffusion barrier, interconnect, and bond pad. Conventionally, the appropriate metallization that possesses one of the above functional attributes is applied in the course of device implementation. For the ohmic contact, low specific contact resistance (SCR) on both the n- and p-type semiconductor are highly desirable in order to minimize junction power losses and excessive heating. Also, lowering the SCR ensures optimal output in semiconductor based sensors. The diffusion barrier metallization should be capable of preventing the migration of gold (Au) and oxygen (O) or other elements that are deleterious to the integrity of the ohmic contacts. With regard to the interconnect, one crucial attribute is to have low resistivity in order to minimize line power loss over long distances. The ohmic contact characteristic of a metal is driven largely by its work function, assuming the absence of Fermi level pinning surface states. The process of sequential formation of ohmic contacts on both semiconductor conductivities results in higher production costs, longer processing time, and fabrication complexity that could reduce yield.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details.

Wide-bandgap materials generally offer nearly ideal properties for fast, hot, high-power electronics. They have attractive properties but have high melting points that are greater than that of silicon and gallium arsenide, and they have taken the semiconductor industry the longest to understand and produce commercially. They have benefited from much of the development in silicon electronics, but silicon-based products are much less expensive to manufacture. Therefore, wide-bandgap electronics have to compete in those niches where silicon and other solutions are inferior.

The innovation discloses a dual ohmic contact metallization scheme that can enhance the performance of semiconductor SiC sensors and electronics for the purpose of improved safety, efficient operation, and reduction of costs associated with premature equipment down time, future aero-engines, manufacturing processes, and environmental monitoring. These applications are commonly characterized by temperatures greater than 600° C. which require more proximal insertion of sensors and electronics. For example, combustion chambers of jet engines and rocket engines operate at temperatures at and above 1000° C. The proximal insertion of these devices in the high temperature sections could provide real time monitoring of changes that are occurring, thereby allowing for a faster decision making process to mitigate events that are predetermined to be undesirable and could lead to a catastrophic result if not sufficiently controlled.

The innovation discloses generation and implementation of a simultaneous electrical ohmic contact to n- and p-type silicon carbide (SiC) semiconductor material. In accordance with aspects, such ohmic contact metallization can be thermally stable at extreme temperatures, e.g., beyond 600° C. The supporting theory is based on the use of a combination of material work functions as a basis for non-discriminatory charge transport across the metallurgical junction of the metal and the semiconductor.

Generally, in the absence of Fermi level pinning, ohmic contact formation is favored when a metal or metal compound having a work function that is lower than the work function (or electron affinity) of the n-doped (donor-type) semiconductor is deposited on such semiconductor. However, when such metal or metal compound is deposited on the p-doped (acceptor-type) semiconductor with a greater work function, a rectification occurs. Conversely, a metal or metal compound with a work function greater than the work function of a p-doped semiconductor favors an ohmic contact formation, but would rectify on the n-doped layer. It will be understood that a "work function" refers to the minimum energy (e.g., electron volts) needed to remove an electron from a solid to a point immediately outside the solid surface. In other words, a "work function" can refer to the energy required to move an electron from the Fermi level into vacuum.

Based on the above brief theoretical description of metal-semiconductor charge transport on which this innovation is based, it is desired to simultaneously form ohmic contact on both n-type and p-type SiC. By a careful selection of the appropriate combination of metal carbides/silicides with work functions greater than the work function of p-type SiC and another combination metal carbides/silicides with work functions less than the work function of n-type SiC, and then mixing both combination together, simultaneous ohmic contacts on both n- and p-type surfaces can be favored.

Work functions of metal carbides and silicides can be employed to identify materials that theoretically support the concept of simultaneous forming ohmic contact on both n- and p-type SiC. One such combination of metals that was selected for the proof of concept is a mixture of Tungsten (W) and Nickel (Ni), which when annealed (i.e., heated) on SiC would form metal compounds of tungsten carbide, tungsten silicide, and nickel silicide. It is stated in the literature that the work function of tungsten carbide ranges between 5 and 6.3 eV while the work function of tungsten silicide varies from 4.3 to 5.2 eV. The work function of nickel silicide is between 4.5 and 4.93 eV.

As a further observation, tungsten silicide is being observed alongside tungsten carbide and nickel silicide as reaction products. The presence of high tungsten silicide is being observed at the silicon carbide interface, which could be playing a significant role in the formation of the dual ohmic contact.

Figure 25:
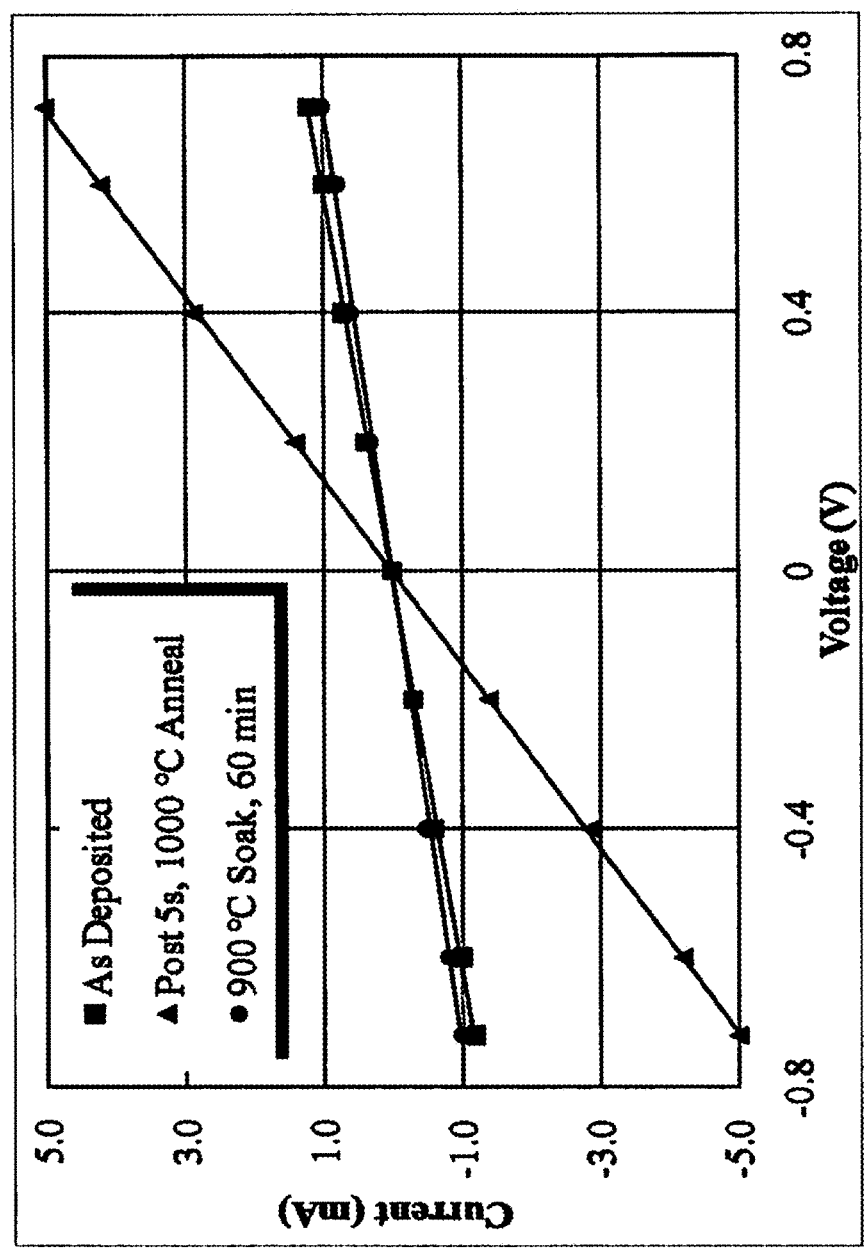
FIG. 25 illustrates a plot depicting as-deposited, post-RTA, and post 900° C., 60 min. soak, I-V characteristics of W50:Ni50 alloy metallization on non-TLM p-type 4H—SiC epilayers having doping level of $N_a > 2 \times 10^{19}$ cm$^{-3}$.

While WNi aspects are described in detail, it is to be understood that other metal silicides and carbides can be employed in alternative aspects of the innovation. FIG. 25 illustrates an example table of metal silicides and carbides having work functions that may satisfy the work function characteristics and rules as described herein. These example metal silicides and carbides are to be included within the scope of this disclosure and claims appended hereto.

For n-type SiC, the work function is about 4.75 eV while the work function of p-type SiC is about 4.85 eV. Therefore, ohmic contact is favored when variations of nickel silicide with work functions less than that of n-type SiC are used. On the other hand, ohmic contact on p-type SiC is favored when the work functions of variations of tungsten carbide is greater than that of the p-type SiC. The above theory was validated and reproduced by using a combination of tungsten and nickel as described in greater detail.

As illustrated and described in detail infra, test data confirms that simultaneous ohmic contact can be formed on n-type and p-type 4H—SiC. For the n-type, ohmic contact was demonstrated for doping level starting from $1.4 \times 10^{19}$ $cm^{-3}$ and higher. For the p-type, ohmic contact was demonstrated for doping levels greater than $2 \times 10^{19}$ $cm^{-3}$. It will be appreciated that lower doping levels can be employed in alternative aspects.

The following discussion performs a characterization of selected thin films for the purpose of developing enhanced electrical contacts (ohmic contacts) to SiC. The discussion references characteristics of different materials in order to suggest which ones would be suitable for the desired solution. These characterizations include deposition uniformity, deposition rate, film composition, stress analysis, electrical analysis (pre- & post RTA), and several other analytical processes. It will be appreciated that these characteristics are important in creating a stable contact. Using this information, development can begin regarding the metallization that can establish an enhanced ohmic contact that can survive and be stable at temperatures of about 1000° C.

The innovation can be used to develop a new ohmic contact metallization that would enable semiconductor functionality at about 1000° C. Essentially, as will be understood upon a review of the discussion that follows, the innovation can characterize a new high temperature metallization scheme, demonstrate ohmic contact to n- and p-type SiC, and demonstrate a thermally stable ohmic contact to SiC. The findings can be implemented into enhanced devices such as sensors or the like.

W—Ni Experiments (Patterning, Annealing, & Electrical Analysis)

In order to test the metallization electrical characteristics, several processes were performed. The tests employed three different WNi compositions, $W_{90}Ni_{10}$, $W_{75}Ni_{25}$, and $W_{50}Ni_{50}$. They would be tested using four samples each with different doping levels. $W_{75}Ni_{25}$ would be done first and its samples would be labeled N5, N6, P5, and P6. $W_{90}Ni_{10}$ would be done second and its samples would be labeled N7, N8, P7, and P8. $W_{90}Ni_{50}$ would be done third and its samples would be labeled N9, NX, P9, and PX.

The odd-numbered n-type samples were of the doping level $>2\times10^{19}$ cm$^{-3}$. The even-numbered n-type samples were of the doping level $1.4\times10^{19}$ cm$^{-3}$. The odd-numbered p-type samples were of the doping level $>2\times10^{19}$ cm$^{-3}$. And the even-numbered p-type samples were of the doping level $1.6\times10^{19}$ cm$^{-3}$. The steps in the process would include Photolithography with photoresist (PR), Aluminum (Al) deposition, Al/PR liftoff, WNi deposition, and WNi/Al liftoff. After performing all of these steps, next is to test the initial (pre-annealed) contact. Thereafter, each sample was diced into quarters and select quarters underwent an annealing process after which they were again tested electrically. The photolithography process was completed using the deep reactive ion etching test mask and AZ5214E photoresist.

After the PR was patterned, using the Telemark E-Beam, 5000 Å of Al were deposited onto each sample. Immediately following the cool down, the samples were unloaded and placed in an Acetone and Isopropanol bath to liftoff the PR and the Al deposited on top of it to reveal the reversed image of the desired pattern.

The samples were then placed into a two chamber Lesker sputtering system and received 1000 Å of WNi according to which composition they were assigned. Each sample was given a 200 Å Si Cap. After the deposition and the appropriate cool down time, the samples were placed in a bath of hot phosphoric acid at 50° C. This process lifts off the Al and the WNi/Si on top to leave the desired test pattern of WNi/Si. After liftoff the samples were evaluated by taking I-V characteristic measurements. Thereafter, a layer of PR was placed on each sample to protect the surface during dicing.

The samples were taken and diced into quarters at which point one quarter of each sample was annealed at 1000° C. for 5 sec under vacuum with a pressure of 239 mTorr, after which I-V characteristic measurements were again taken. After these measurements were taken and compared, the samples that displayed an ohmic contact (N5, N6, N7, N8, N9, NX, P5, P7, P9) went back into the RTA for an aging process to test the durability of each sample. They were annealed for 60 minutes at 900° C. under Ar with a flow rate of twice the normal rate. After each of these steps, the samples were taken and analyzed. The comparative graphs for each sample (N5, N6, N7, N8, N9, NX, P5, P7, P9) and their three different measurements are displayed in the results section of FIGS. 11A, 12A, 13A, 14A, 15A, 16A, 17A, 18A, and 19A respectively.

Re-Annealing Experiment

When viewing the results of the anneal and realizing that the lowest doped p-type samples were not ohmic, it was decided to do the same annealing run again on those three samples (P6, P8, & PX) to determine if perhaps the reaction was not complete yet and if 5 more seconds would positively alter the results. For P6 and P8 the cut in voltage was decreased slightly after re-annealing. However for PX the re-anneal only hindered the contact.

Argon Annealing Experiment

After reviewing the results of the initial annealing test, one quarter from P6, P8, and PX were then annealed for 5 seconds at 1000° C. under Ar. This was done to attempt to make an ohmic contact to the lower doped p-type sample that in the last test was not ohmic. This proved to be an unfruitful experiment, as the electrical tests revealed that after annealing with Ar, not even the cut in voltage on the rectifying curve was decreased.

1200° C. Annealing Experiment

Figures 21A, 21B, 21C:
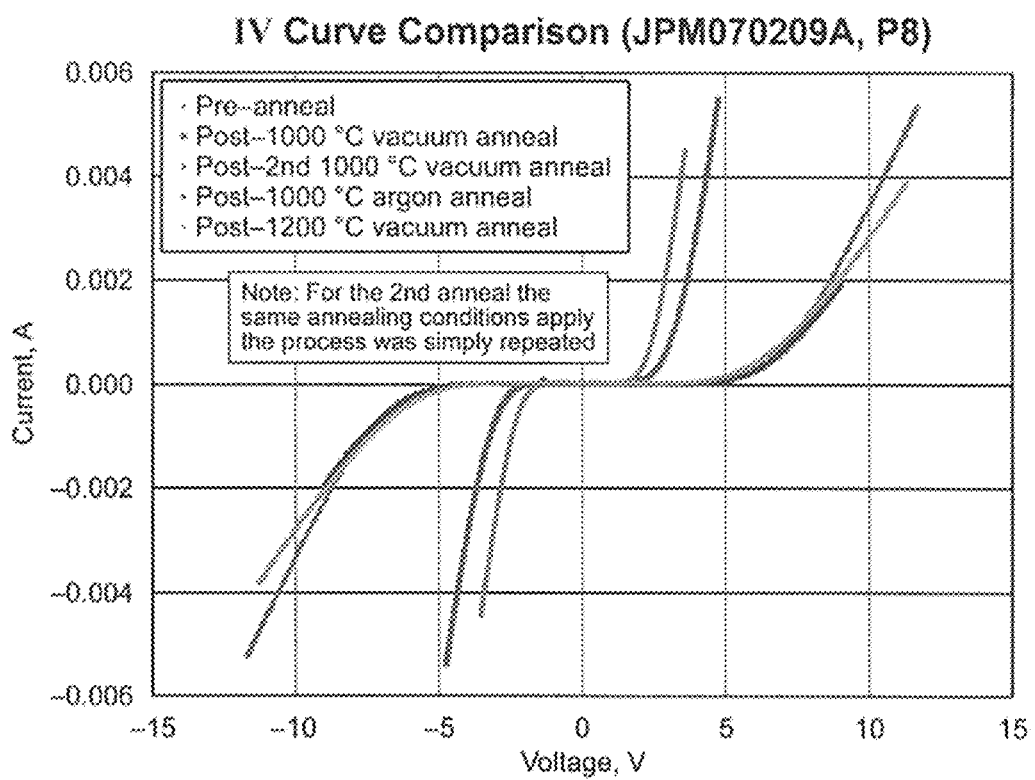
FIGS. 21A-21C illustrate example results from sample P8 after several annealing attempts in accordance with aspects of the innovation.
Figures 22A, 22B, 22C:
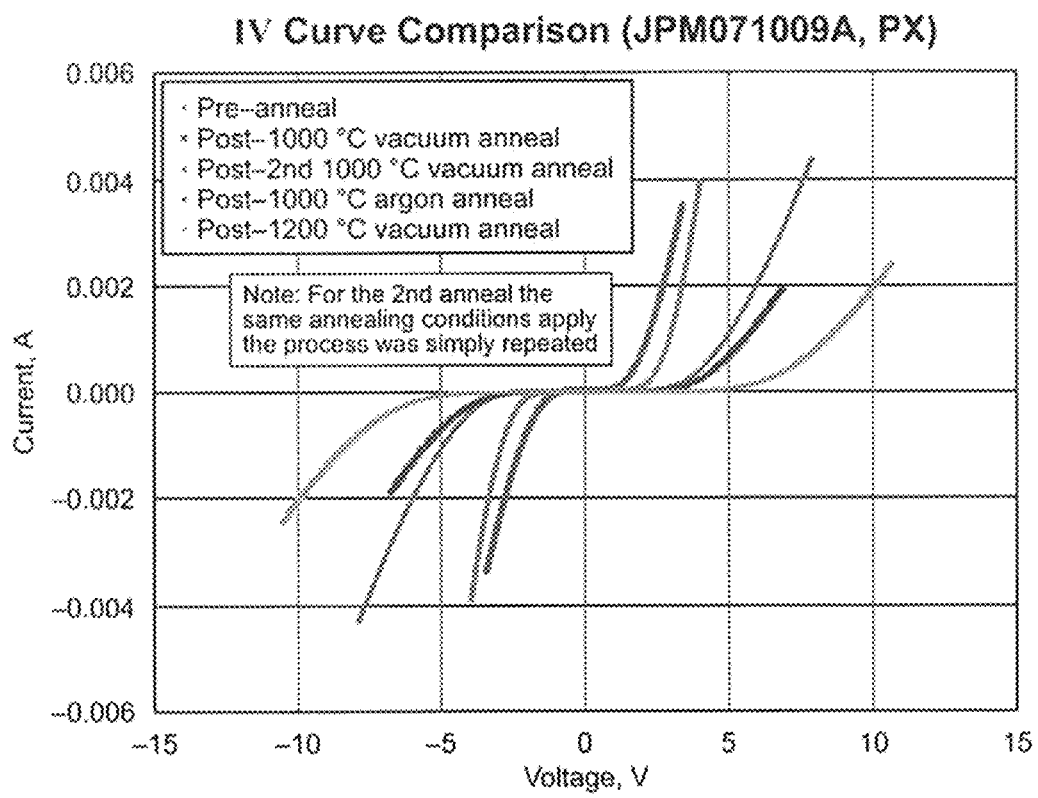
FIGS. 22A-22C illustrate example results from sample PX after several annealing attempts in accordance with aspects of the innovation.

After reviewing the results of the Argon anneal, it was decided to again take a sample from P6, P8, and PX and anneal at 1200° C. for 5 sec under vacuum. This was done at a pressure of 239 mTorr. This was also not a fruitful experiment other than realizing that neither annealing in Ar or at 1200° C. in vacuum will aid in making the lower doped p-type samples ohmic. Graphs comparing the results as deposited, initial anneal, re-anneal, Ar anneal, & 1200° C. anneal electrical measurements are displayed in the results section of FIGS. 20A, 21A and 22A.

N5 (FIG. 11A) was doped at $>2\times10^{19}$ cm$^{-3}$ n-type and has $W_{50}Ni_{50}$ (1000 Å) and a Si cap (200 Å). It was first annealed for 5 seconds at 1000° C. and then for 60 minutes at 900° C. N6 (FIG. 12A) was doped at $1.4\times10^{19}$ cm$^{-3}$ n-type and has $W_{50}Ni_{50}$ (1000 Å) and a Si cap (200 Å). It was first annealed for 5 seconds at 1000° C. and then for 60 minutes at 900° C. Both n-type samples from the $W_{75}Ni_{25}$ composition turned out to be ohmic only after annealing but showed signs of stability after 60 min at 900° C.

P5 (FIG. 13A) was doped at $>2\times10^{19}$ cm$^{-3}$ p-type and has $W_{50}Ni_{50}$ (1000 Å) and a Si cap (200 Å). It was first annealed for 5 seconds at 1000° C. and then for 60 minutes at 900° C. N7 (FIG. 14A) was doped at $>2\times10^{19}$ cm$^{-3}$ n-type and has $W_{90}Ni_{10}$ (1000 Å) and a Si cap (200 Å). It was first annealed for 5 seconds at 1000° C. and then for 60 minutes at 900° C. The p-type sample although ohmic after the first anneal increased in resistance after the second anneal. The n-sample for $W_{90}Ni_{10}$ lost its ohmic contact completely.

N8 (FIG. 15A) was doped at $1.4\times10^{19}$ cm$^3$ n-type and P7 (FIG. 14) was doped at $>2\times10^{19}$ cm$^{-3}$ p-type. They both have $W_{90}Ni_{10}$ (1000 Å) and a Si cap (200 Å). It was first annealed for 5 seconds at 1000° C. and then for 60 minutes at 900° C. N8 shows similar results to N7 in that it was initially going ohmic but after 60 minutes at 900° C. the contact became rectifying. P7 however retained its ohmic contact but only slightly. In all three $W_{90}Ni_{10}$ cases the resistance began to rise during the 60 minute Anneal at 900° C.

N9 (FIG. 17A) was doped at $>2\times10^{19}$ cm$^{-3}$ n-type and NX (FIG. 18) was doped at $1.4\times10^{19}$ cm$^{-3}$ n-type. They both have $W_{50}Ni_{50}$ (1000 Å) and a Si cap (200 Å). It was first annealed for 5 seconds at 1000° C. and then for 60 minutes at 900° C. Both N9 and NX decreased significantly in resistance after the first anneal. However, after 60 minutes at 900° C. the contact appeared to begin to gain resistivity. Although in comparison to other metallizations, $W_{50}Ni_{50}$ changed the least after the second anneal/aging process.

Figures 20A, 20B, 20C:
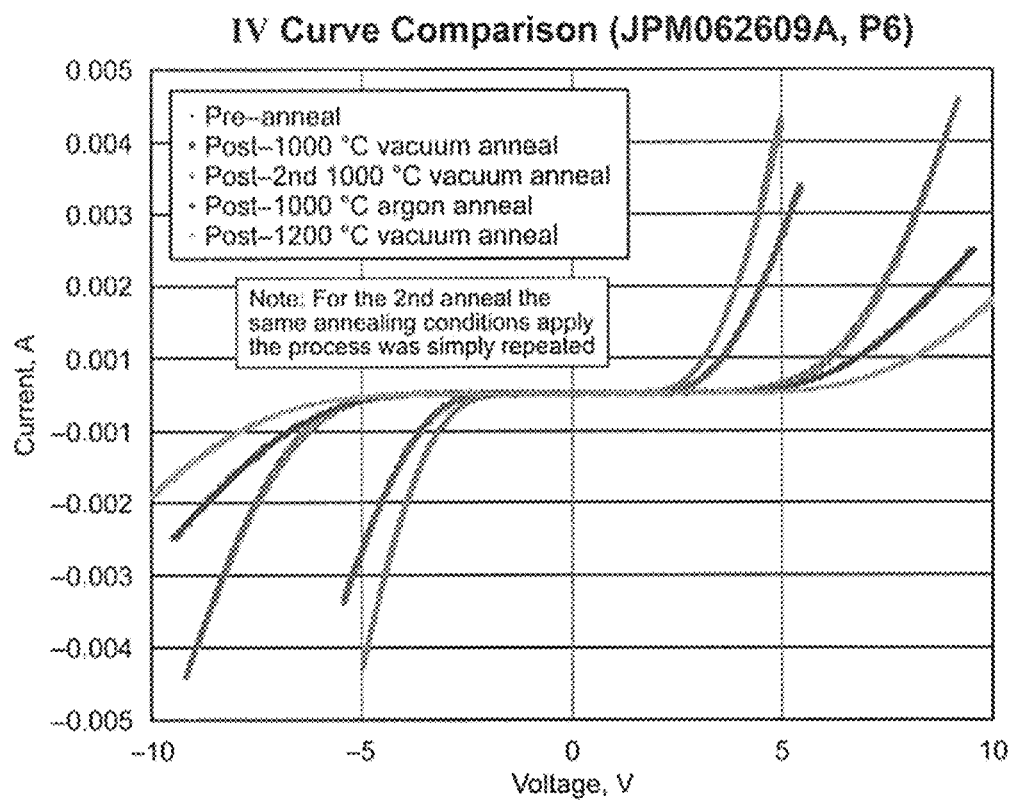
FIGS. 20A-20C illustrate example results from sample P6 after several annealing attempts in accordance with aspects of the innovation.

P9 (FIG. 19A) was doped at $>2\times10^{19}$ cm$^{-3}$ p-type and has a film containing $W_{50}Ni_{50}$ (1000 Å) and a Si cap (200 Å). It was first annealed for 5 seconds at 1000° C. and then for 60 minutes at 900° C. While remaining ohmic throughout all steps, the resistance values decreased significantly after the first anneal and then increased back past the pre-anneal resistance after the second anneal/aging process. FIG. 20A illustrates the results from sample P6 after several different annealing attempts. It turned out that none of the annealing methods attempted could make an ohmic contact to this lower doped p-type sample with the $W_{75}Ni_{25}$ metallization scheme deposited. Several of our attempts ended with the cut in voltage increasing which was the opposite desired effect.

P8 ($W_{90}Ni_{10}$ Metallization) (FIG. 21A) and PX ($W_{50}Ni_{50}$ Metallization) (FIG. 22A) are very similar to that of P6. No ohmic contacts were demonstrated on these the lowest doped p-type samples. In all three cases the 1000° C. Argon anneal and the 1200° C. vacuum anneal proved to be very ineffective in that they only increased the cut in voltage. However, through the auger analysis, it was anticipated to establish some possible answers to these issues. The only other question to arise was why the re-anneal lowered the cut in voltage on $W_{75}Ni_{25}$ and $W_{90}Ni_{10}$, but not $W_{50}Ni_{50}$. However, this does not matter too much because they were still not ohmic.

FIGS. 23A-23C illustrate a chart that summarizes one important aspect of the innovation directed to the new contact metallization scheme of WNi. The ohmic contact analysis at various points throughout the process is a main focus of the specification. The pre-anneal instance shows the contact formed by having WNi at the SiC interface. After annealing, the contact is dependent on the newly formed compounds of Tungsten Carbide and Nickel Silicide. After the aging process, it is dependent upon the stability of the compounds formed and whether they will continue to change structure or remain Tungsten Carbide and Nickel Silicide. These results are very pleasing especially in the cases of $W_{75}Ni_{25}$ and $W_{50}Ni_{50}$. As shown, it is to be understood that both of these compositions are stable at least unto 60 minutes of exposure to a temperature of 900° C. It will be appreciated that, this data alone can be used to support that this new contact metallization is stable enough to use in several applications.

As illustrated and described in detail supra, it is a good indication that because of the high stress in the $W_{70}Ni_{30}$, it will not make the desired optimum stable contact. However, it was not taken up to temperature and it cannot be stated for sure what an annealed sample will measure.

The stress in the W would have been acceptable, but as previously stated, W (100 at. %) makes an ohmic contact with p-type and not n-type. After further testing of W—Ni alloys, it is shown that a good, stable contact has been established. Some results have displayed just what was expected while others have not at this stage. Although more research would be done, the overall result, in terms of proving the concept of dual ohmic contact was successful.

With all of this said and the data presented, it is clear that innovation describes development of a metallization out of the ordinary. More particularly, the innovation demonstrates an ohmic contact to both n- and p-type Silicon Carbide. Though the doping level for the p-type needs to be relatively high, most conventional devices have their p-type epi-layer doped at $1\times10^{20}$ cm$^{-3}$ or higher. The findings illustrate that the new metallization can be implemented into most devices. Essentially, the innovation discloses development of a contact that is ohmic that can survive, and be stable on both n- and p-type SiC at temperatures nearing 1000° C.

It will be appreciated that the innovation can be practiced in contacts to lower doped p-type samples as well as lower doped n-type samples. Additionally, other aspects employ different W—Ni alloys, most likely ones with higher Ni concentration levels, because of the reactions desired with the SiC, and possibly some other alloys after extensive literature searches. The testing will include all of the same processing as has been set forth in detail throughout this specification.

In summary, in accordance with the innovation, it is possible to use a single metallization scheme to form ohmic contact on n- and p-type SiC, particularly in bi-polar devices where traditional approaches require utilization of different contact metallization that is exclusive of the doping. Traditional schemes are characterized by sequences of fabrication process steps that are time consuming and costly. Additionally, these traditional schemes do not support device operation as temperature increases beyond 600° C.

In accordance with aspects of the innovation, because of the ability to deposit a non-discriminatory ohmic contact metallization on both n- and p-type SiC, ion implantation and subsequent high temperature (>1100° C.) implant anneal need not be performed. It is known that conventional ohmic contact schemes employ ion implantation and high temperature implant annealing to activate the dopants, which tend to damage the layer. As evinced below, test data also shows that the non-discriminatory contact metallization on n- and p-type SiC have been tested and found stable after soaking at 1000° C. in argon for approximately 4 hours minutes.

Among others, the innovation can be employed in many scenarios including, but not limited to high temperature sensors and electronics (e.g., in excess of 600° C.) as well as high power devices. Additionally, the innovation can be employed in low-power transistors for temperatures above 300° C.

The specification describes advancements in technologies related to gas sensors, physical sensors, and silicon carbide (SiC) technology generally. In particular, the specification describes SiC as a material for advanced semiconductor electronic device applications. One advantage of this technology is that SiC electronics and sensors are capable of withstanding very hostile environments up to and exceeding 600° C. It will be appreciated that this is an advancement because most silicon (Si) based devices are limited to 350° C. maximum.

With the use of SiC, electronics will be more capable in terms of operating at higher temperatures, higher power, and even in high radiation conditions. These electronic devices could reach a large variety of areas including: aircraft, automotive, communications, power, and spacecraft industries, among others. As SiC is grown in a much more efficient way than conventionally possible, a dramatic decrease in cost, which is the main issue with SiC, can be realized.

For example, SiC-based sensors can be employed in many environments and their capabilities can include detecting hydrogen, hydrocarbons, nitrogen oxides, carbon monoxide, oxygen, carbon dioxide, etc. Clearly these capabilities offer a wide spectrum of application for an improved sensor technology. In other aspects, the innovation can be employed in the development of harsh environment physical sensors and technologies for safer aircraft and spacecraft. For example, research areas in these physical sensors include novel thin film sensors, advanced embedded sensors, and MEMS (Micro Electro-Mechanical Systems) radiation detectors, among others.

Conventional devices, however, are constrained in their ability due to the 600° C. limit. For at least this reason, the innovation discloses research in developing even higher temperature contacts (ohmic contacts) in these devices. It will be appreciated that devices capable of withstanding temperatures of about 1000° C. would have much more wide variety of application. For instance, pressure sensors in jet engines could be closer to the engines, thereby removing the delay in readings that occurs from sensing at a distance. Closer sensing would offer more reliable readings and faster response times. One factor of creating high temperature devices is creating a reliable and stable ohmic contact at the SiC interface. In accordance with the innovation, this is done with a variety of metallization schemes. The innovation can provide a stable ohmic contact at temperatures around 1000° C.

It will be understood that SiC is available in two doped types, n-type and p-type. Further, those skilled in the art will appreciate that, conventionally, a material that makes an ohmic contact with n-type will not make an ohmic contact with p-type and vice versa. An ohmic contact is defined as a metal-semiconductor contact that has a negligible contact resistance relative to the bulk or spreading resistance for the semiconductor. The innovation discloses a contact metallization that establishes a low resistance, thermally stable, ohmic contact on both n- and p-type SiC. In other words, the innovation discloses a simultaneous formation of electrical ohmic contacts to SiC semiconductor having donor and acceptor impurities (n- and p-type doping).

Additional Experimental Description

A novel tungsten-nickel ohmic contact metallization on 4H— and 6H—SiC capable of surviving temperatures as high as 900° C. is reported. Preliminary results revealed the following: i) ohmic contact on n-type 4H—SiC having net doping levels, $N_d$, of 1.4 and $2 \times 10^{19}$ cm$^{-3}$, with specific contact resistance $\rho_{sNd}$ of $7.69 \times 10^{-4}$ and $5.81 \times 10^{-4}$ Ω-cm$^2$, respectively, after rapid thermal annealing (RTA), and $5.9 \times 10^{-3}$ and $2.51 \times 10^{-4}$ Ω-cm$^2$, respectively, after subsequent soak at 900° C. for 1 hr in argon, ii) ohmic contact on n- and p-type 6H—SiC having $N_d > 2 \times 10^{19}$ cm$^{-3}$ and $N_a > 1 \times 10^{20}$ cm$^{-3}$, with $\rho_{sNd} = 5 \times 10^{-5}$ and $\rho_{sNa} = 2 \times 10^4$ Ω-cm$^2$, respectively, after RTA, and $\rho_{sNd} = 2.5 \times 10^{-5}$ and $\rho_{sNa} = 1.5 \times 10^{-4}$ Ω-cm$^2$ after subsequent treatment at 900° C. for 1 hr in argon, respectively.

Silicon carbide (SiC) sensors and electronics have been demonstrated to operate at 600° C. and 500° C., respectively. However, the need to instrument engines at higher temperatures demands more robust and reliable devices. A major impediment to such an objective is the non existence of an ohmic contact metallization scheme to SiC that can operate reliably for prolonged time periods at temperatures higher than 600° C. Rastegaeva et al. studied a W/6H—SiC (n-type) scheme up to 677° C. and reported ohmic contact, with specific contact resistivity, $\rho_s$, of between $2 \times 10^{-3}$ and $7 \times 10^{-4}$ Ωcm$^2$.

However, time dependent evaluation was not performed to determine the long-term stability of the contacts. A report by Marinova used X-ray photoelectron spectroscopy (XPS) to investigate the interface chemistry and measured electrical contact characteristics of separate Ni based metallization on n-doped 6H— ($N_d = 1$-$1.8 \times 10^{18}$ cm$^{-3}$) and 4H—SiC ($N_d = 10^{19}$ cm$^{-3}$) after annealing at 950° C. in nitrogen ambient. They showed that ohmic contact was formed after annealing and remained relatively stable after aging in nitrogen ambient for 100 hrs at 500° C. Kakanakova-Georgieva reported annealed WN/4H—SiC up to 1200° C. and used XPS to study the interface chemistry. The formation of W2C and $W_5Si_3$ was reported, with the contacts becoming rectifying. In the work reported by Liu et al., Ni/W metallization was sequentially deposited on p-type 4H— and 6H—SiC ($N_a = 10^{19}$ cm$^{-3}$) epilayers.

The $\rho_s$ values obtained are in relative agreement with those reported in this letter. In addition, the authors aged one of the samples (polytype not reported) in vacuum for 300 hours at 600° C. and showed slight decrease in $\rho_s$.

This letter presents the preliminary results of the investigation of W50:Ni50 alloy metallization, with the primary goal of demonstrating a simultaneous ohmic contact to both n- and p-type 4H— and 6H—SiC, in addition to achieving stability at 900° C. Ohmic contact to p-type epilayers is traditionally enhanced by ion implantation by creating a degenerately doped layer. However, this process is known to be costly and time consuming. It also induces damage to the lattice and implant activation is sometimes incomplete, thus resulting in ohmic contact degradation.

Tungsten-Nickel (W50:Ni50 at. %) alloy contacts were fabricated on commercially grown 2 μm thick homo-epitaxial 4H— and 6H—SiC epilayers of n- and p-type conductivities on high resistivity (3-11 Ω-cm) p-type substrates. For the n-type 4H— and 6H—SiC and p-type 6H—SiC, the common transfer length method (TLM) test structure was used to evaluate the contacts fabricated on the epilayer mesas. For the p-type 4H—SiC ($N_a > 2 \times 10^{19}$ and $N_a = 1.6 \times 10^{19}$ cm$^{-3}$), the metallization was fabricated directly on the epilayers without TLM structures to allow for only the qualitative evaluation of the I-V characteristics. In all cases, irrespective of the epilayer resistivity, the p-type substrates used always had a much higher resistivity than the epilayer in order to minimize substrate leakage current paths that could skew the results. The epilayer impurity concentrations were as reported by the SiC wafer vendor. The TLM structure consisted of 5 rectangular contact pads. Each sample set has three TLM subsets, with each subset having rectangular dimensions/(edge-to-edge distances) of 100×40 μm$^2$/(35, 70, 105, and 140 μm), 100×45 μm$^2$/(30, 60, 90, and 120 μm), and 100×50 μm$^2$/(25, 50, 75, and 100 μm). The TLM isolation mesas were patterned with a parallel-plate reactive ion etcher using SF$_6$ and Ar chemistry and an Al mask. The samples were solvent cleaned, immersed in equal volume of $H_2O_2$:$H_2SO_4$ solution for 15 minutes, HF for 1 minute, and followed by wet oxidation at 1000° C. to obtain an oxide layer of approximately 2000 Å. Contact vias were etched into the oxide to expose the SiC epilayer. The contact metal was then deposited from a tungsten-nickel (W50:Ni50 at. %) alloy target, patterned and etched to form the desired electrical contact to the SiC epilayers. The contact metal evaluated consisted of sputter deposited 100 nm film, followed by a 20 nm Si capping layer to prevent premature oxidation of the alloy. The samples were annealed in a Rapid Thermal Annealer (RTA) at 1000° C. for 5 sec, at a pressure of 210 mTorr, after initial argon purge. A series of current-voltage (I-V) and $\rho_s$ measurements were conducted on each TLM subset as-deposited, after RTA, and after aging over time at 900° C. in Ar ambient. Only I-V measurements were performed on non-TLM samples.

Results and Discussion

The summary results of the specific contact resistance measurements and the I-V characteristics are shown in Table 1 (Qualitative and Quantitative Electrical Characteristics of W50:Ni50 Metallization on N- and P-Type 4H— and 6H—SiC After Various Process Steps). Ohmic contact was achieved after RTA in all the subsets, except one sample set, for all the metallization runs. The $\rho_s$ values reported were obtained by averaging across the three TLM subsets from each sample. The $\rho_s$ values for the highly doped n-type 4H—SiC (>2×10$^{19}$ cm$^{-3}$) and 6H—SiC (>2×10$^{19}$ cm$^{-3}$) samples improved significantly after the RTA processes, and remained relatively unchanged after subsequent thermal treatment at 900° C. for 1 hr in argon ambient.

TABLE I

| Polytype/Doping Level (cm$^{-3}$) | $\rho_s$ ($\Omega$-cm$^2$) | | |
|---|---|---|---|
| | As Deposited | Post-RTA | Post 900° C., 60 min. |
| 4Hn/>2 × 10$^{19}$ | 1.7 × 10$^{-1}$ | 5.81 × 10$^{-4}$ | 2.51 × 10$^{-4}$ |
| 4Hn/1.4 × 10$^{19}$ | 1.6 × 10$^{-2}$ | 7.69 × 10$^{-4}$ | 5.9 × 10$^{-3}$ |
| 4Hp/>2 × 10$^{19}$ | Ohmic | Ohmic | Ohmic |
| 4Hp/1.6 × 10$^{19}$ | Ohmic | Rectifying | Rectifying |
| 6Hn/>2 × 10$^{19}$ | Rectifying | 5 × 10$^{-5}$ | 2.5 × 10$^{-5}$ |
| 6Hp/>1 × 10$^{20}$ | 5 × 10$^{-3}$ | 2 × 10$^{-4}$ | 1.5 × 10$^{-4}$ |

Results obtained on the p-type 6H—SiC epilayers also showed improved $\rho_s$ after 900° C. soak for 1 hr. For the two p-type non-TLM 4H—SiC epilayer samples, ohmic contact was achieved on the less doped ($N_a$=1.6×10$^{19}$ cm$^3$) in as-deposited condition, but became rectifying after RTA and thereafter. However, the heavily doped sample (N>2×10$^{19}$ cm$^{-3}$) exhibited ohmic characteristics throughout, as shown in the I-V plot of FIG. 1. In these cases, the absence of TLM structures precluded quantification of $\rho_s$. The observed $\rho_s$ increase on the lesser doped n-type 4H—SiC, and the decrease in the I-V slope of the p-type 4H—SiC after the 900° C. soaks are currently not understood. Fermi level pinning effect could only be speculated.

The W50:Ni50 alloy, upon annealing, appeared to exhibit a pseudo amphoteric ohmic contact behavior by virtue of its simultaneous ohmic contact formation on both n- and p-type SiC. It is not yet clear if this behavior could be attributed to enhanced field-emission. A report by Pelletier found the Fermi energy (FE) level to be approximately 0.29 eV above the valence band for p-type 6H—SiC having doping level of about 1×10$^{19}$ cm$^{-3}$.

Also, using the effective hole mass of $1.2m_o$ for p-type 4H—SiC ($m_o$=1.67×10$^{-27}$ kg) from a report by Raynaud, the FE corresponding to $N_a$>2×10$^{19}$ cm$^{-3}$ was approximately 0.31 eV above the valence band. These values would suggest non-degenerate doping levels in p-type 6H— and 4H—SiC, respectively. The work functions (WF) of $W_xC_y$ compounds have been reported to be between 4.9 and 6.3 eV, which are greater than the WF of p-type 6H—SiC doped >2×10$^9$ cm$^3$ that was reported to be about 4.85 eV. This would in principle satisfy the basic condition for $W_xC_y$ to form ohmic contact to p-type 6H—SiC, assuming the absence of interface charge pinning. Based on these arguments, it would appear that a combination of enhanced tunneling and thermionic-emission charge transport mechanisms co-exist. Conversely, nickel silicide compounds, such as reported in literature, form ohmic contacts to n-type SiC. Auger Electron Spectroscopy (AES) analyses described in detail below indicate the existence of a $W_xC_y$—$Ni_xSi_y$ composite matrix at the SiC interface after RTA. Although yet to be fully understood, the presence of $W_xC_y$ and $Ni_xSi_y$ mixtures at the n- or p-type SiC interface appears to satisfy the condition for pseudo amphoteric ohmic contact. The formation of simultaneous ohmic contact to n- and p-type SiC would have a significant impact in terms of reducing the cost and process time associated with the fabrication of SiC based bi-polar devices.

Figure 26A:
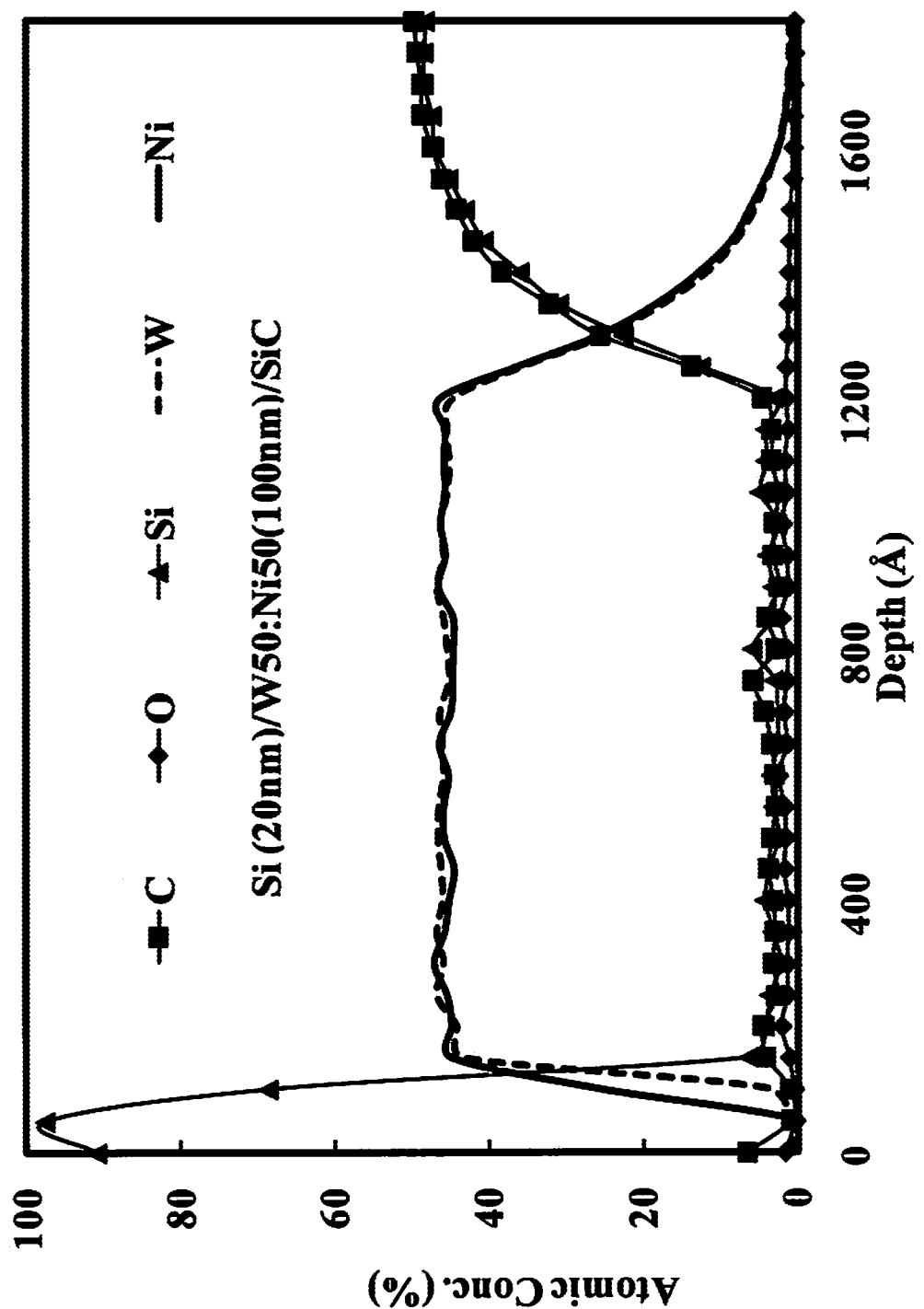
FIGS. 26A-26C illustrate AES depth profiles (a) AES depth profile of as deposited W50:Ni50 alloy metallization on n-type SiC epilayer. The top silicon layer prevents the oxidation of tungsten; (b) AES depth profile of rapid thermal annealed W50:Ni50 metallization on n-type SiC epilayer. The SiC reaction zone indicates the formation of nickel silicide and tungsten carbide; (c) AES profile of sample after RTA and 1 hr furnace soak at 900° C. in Ar ambient. The SiC reaction zone shows that the nickel silicide and tungsten carbide remain intact.

The AES depth profile of the as-deposited metallization is shown in FIG. 26A. After RTA at 1000° C. for 5 seconds at 210 mTorr evacuated argon, the AES depth profile shown in FIG. 2B indicates that the nickel in the alloy had reacted with both the top surface Si layer and the SiC substrate to form $Ni_xSi_y$, thus freeing the carbon which reacts with tungsten. It is possible that $W_xSi_{1-x}$ was also present, although the thermodynamics favor NiSi and WC formation at 1000° C. temperature. It should be noted, however, that other analytical methods would be required to more specifically identify the carbide and silicide phases that are present at the SiC interface. The Auger depth profile after the 900° C. soak for 1 hr (FIG. 26C) did not show any appreciable changes from the sample analyzed after RTA.

The preliminary results of W50:Ni50 contact metallization demonstrate ohmic contact to highly doped n- and p-type 4H— and 6H—SiC with contact resistivities shown to be stable even after thermal soak at 900° C. for 1 hr. An important aspect of these results was the observed pseudo-amphoteric ohmic contact behavior of this metallization scheme. The fundamental semiconductor physics to explain this behavior is currently being studied and would form the subject of future publication.

The concept of Phase Segregation Anneal (PSA) of co-sputtered Pt—Ti metallization was investigated as a method for realizing SOC on p-type and n-4H—SiC with comparably low specific contact resistance (SCR) and minimizing the need for ion implantation. The PSA is defined as the reaction between two or more compounds or elements such that the stable products are fully or partially separated as a result of the eutectic-liquids-eutectic transitioning of at least one of the products. The products so formed would have unique electronic properties. The desired electronic properties of the products in this invention would have high and low WFs so that it can form ohmic contacts simultaneously on p- and n-type 4H—SiC. The choice of co-sputtered Pt:Ti as a potential candidate for PSA is based on the understanding of the thermodynamic phases and electronic properties of the products formed during the reaction with SiC. It is conceptualized that such reaction would produce silicides and carbides having intrinsically disparate high and low WFs that are fully or partially segregated on p- and n-type conductivity surfaces, thereby permitting ohmic characteristics regardless the conductivity of the 4H—SiC.

It is recognized that the SOC must have low SCR values that are comparable to values obtained in Table II. A good example is the recently reported demonstration of W:Ni alloy based SOC on n- and p-type 4H—SiC in which SCR values in the 10-6 ohm-cm2 range without the need for ion implantation were achieved. Although the robustness of the W:Ni-based SOC scheme has been demonstrated at high temperature for short duration, its durability during extended use without a diffusion barrier against Au and oxygen is under investigation.

TABLE II

Examples of known reports of simutaneous ohmic contacts to 4H-SiC by several groups

| Metallization | $\rho_{p\text{-type}}$ ($\Omega$ cm$^2$) | P-Type/ Conc. (cm$^{-3}$) | $\rho_{n\text{-type}}$ ($\Omega$ cm$^2$) | N-Type/ Conc. (cm$^{-3}$) |
|---|---|---|---|---|
| TiC | $2 \times 10^{-5}$ | $>10^{20}$ | $5 \times 10^{-6}$ | $1.3 \times 10^{19}$ |
| Ni | $10^{-4}$ | $10^{21}$ (implant) | $10^{-6}$ | $10^{19}$ |
| TiW | $4 \times 10^{-5}$ | $>10^{20}$ (implant) | $4 \times 10^{-5}$ | $1.3 \times 10^{19}$ |
| Al/Ti/Ni | $2 \times 10^{-3}$ | $4.5 \times 10^{18}$ | $2 \times 10^{-4}$ | $10^{19}$ |
| Al/Ni | $\sim 10^{-4}$ | $7.2 \times 10^{18}$ | $\sim 10^{-4}$ | $1.3 \times 10^{19}$ |
| Ni/Al | $4 \times 10^{-4}$ | $7.2 \times 10^{18}$ | $1.3 \times 10^{-4}$ | $1.3 \times 10^{19}$ |
| W:Ni | $10^{-4}$ | $>10^{20}$ | $10^{-4}$ | $>2 \times 10^{19}$ |
| Si/Al/Ti | $10^{-4}$ | $2.4 \times 10^{19}$ | $\sim 10^{-6}$ | $2.6 \times 10^{19}$ |
| Ti/N | $10^{-3}$ | $10^{20}$ (implant) | $2 \times 10^{-6}$ | $10^{20}$ (implant) |
| Ni | $10^{-3}$ | $10^{20}$ (implant) | $\sim 10^{-4}$ | $3 \times 10^{20}$ |
| Al/Ti/Ni | $\sim 10^{-5}$ | $2 \times 10^{19}$ | $10^{-5}$ | $10^{19}$ |
| W:Ni | $\sim 10^{-6}$ | $2 \times 10^{19}$ | $10^{-6}$ | $10^{20}$ |

The advantage of the Pt:Ti scheme over the W:Ni is that it has been shown to exhibit additional function of a diffusion barrier against Au and oxygen. This paves the way for the development of a single conductor scheme that possesses the combined attributes of enabling SOC and diffusion barrier on 4H—SiC.

Figure 27A:
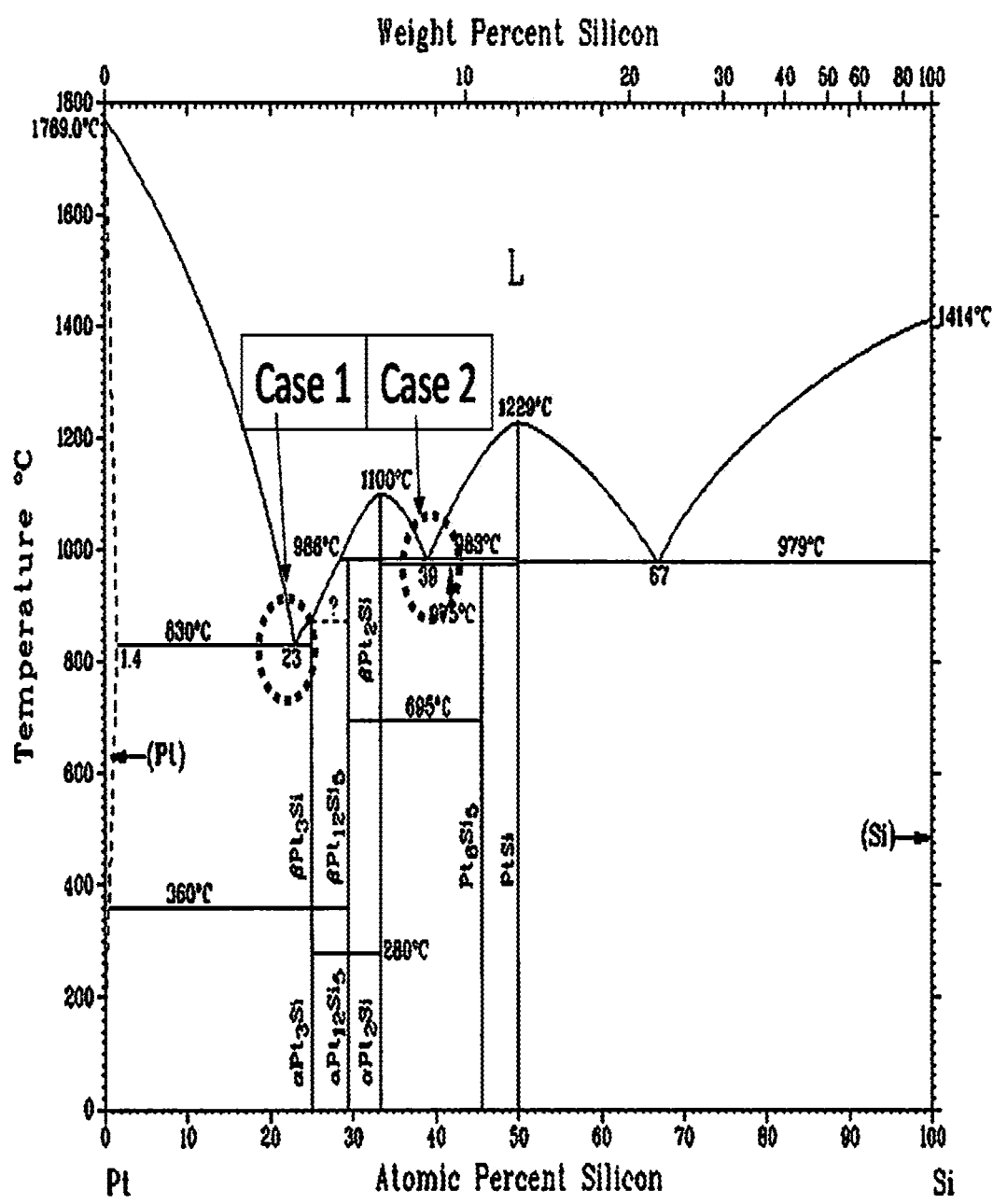
FIGS. 27A-27C depict phase diagrams according to aspects of the innovation.
Figure 27B:
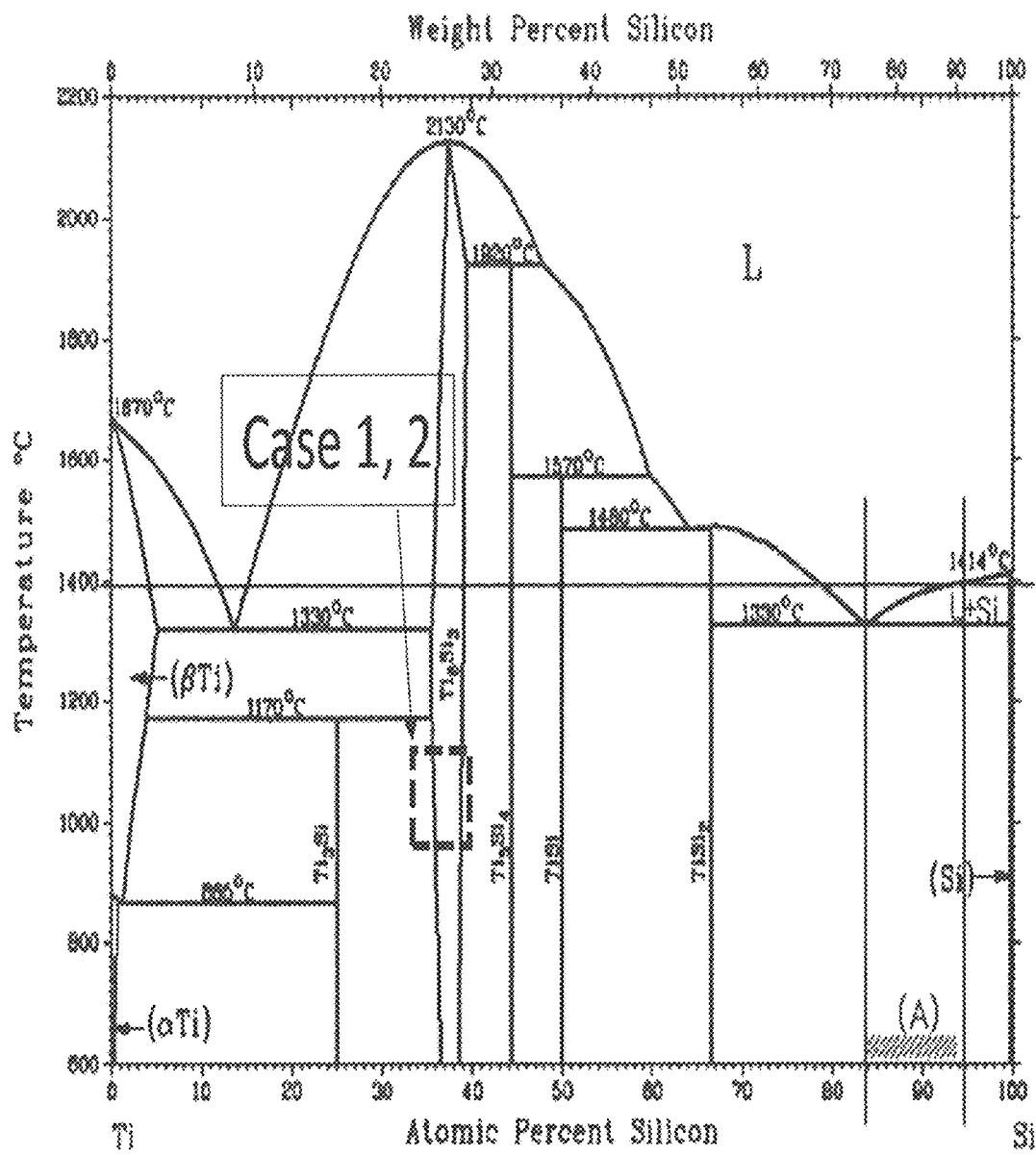
Figure 27C:
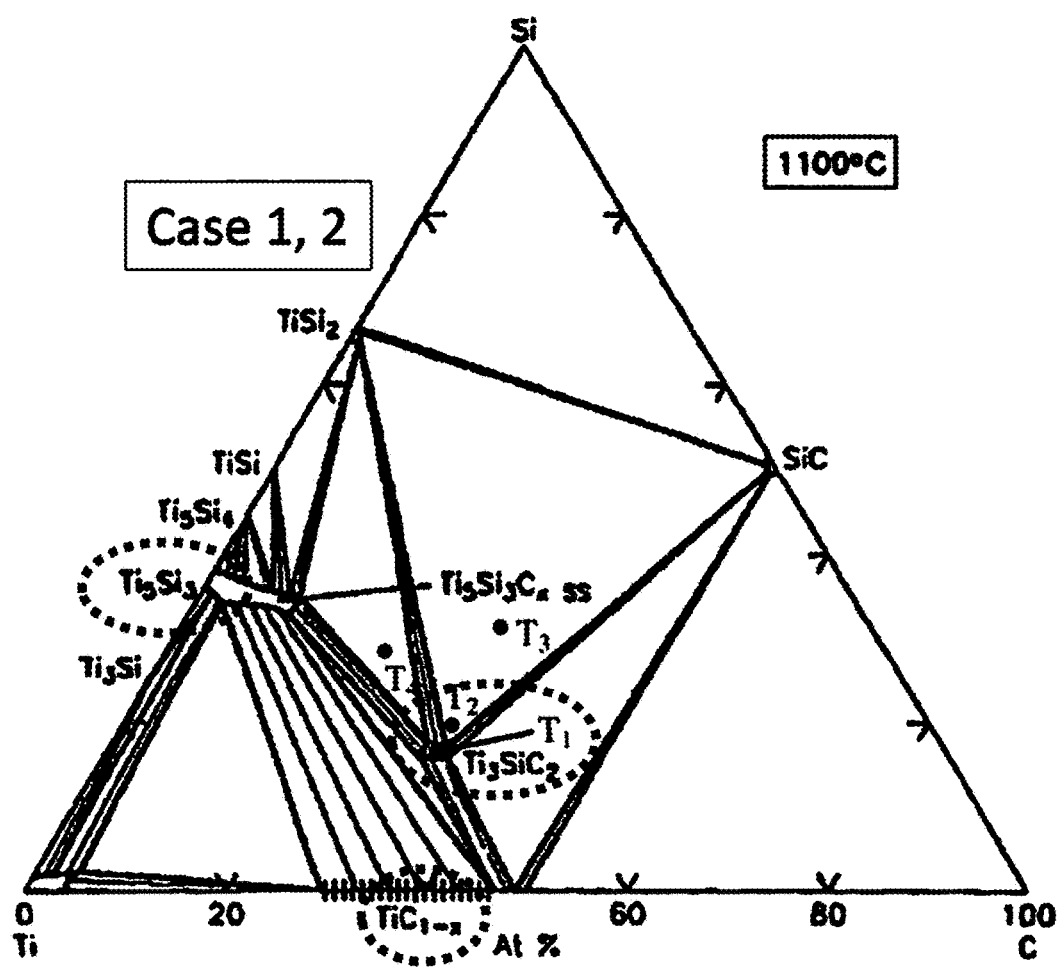
Figure 28:
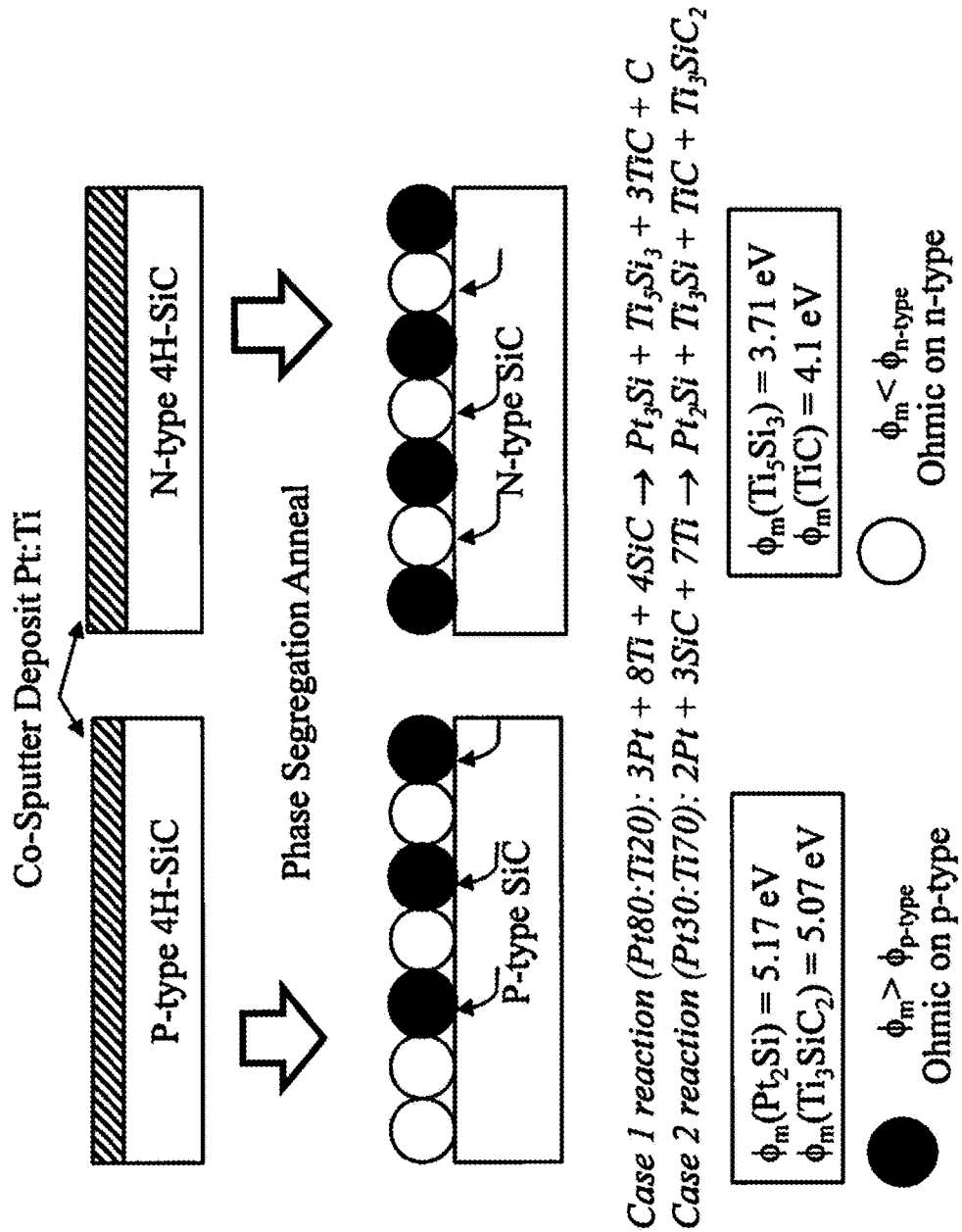
FIG. 28 is an illustrative representation of the PSA model.
Figure 29A:
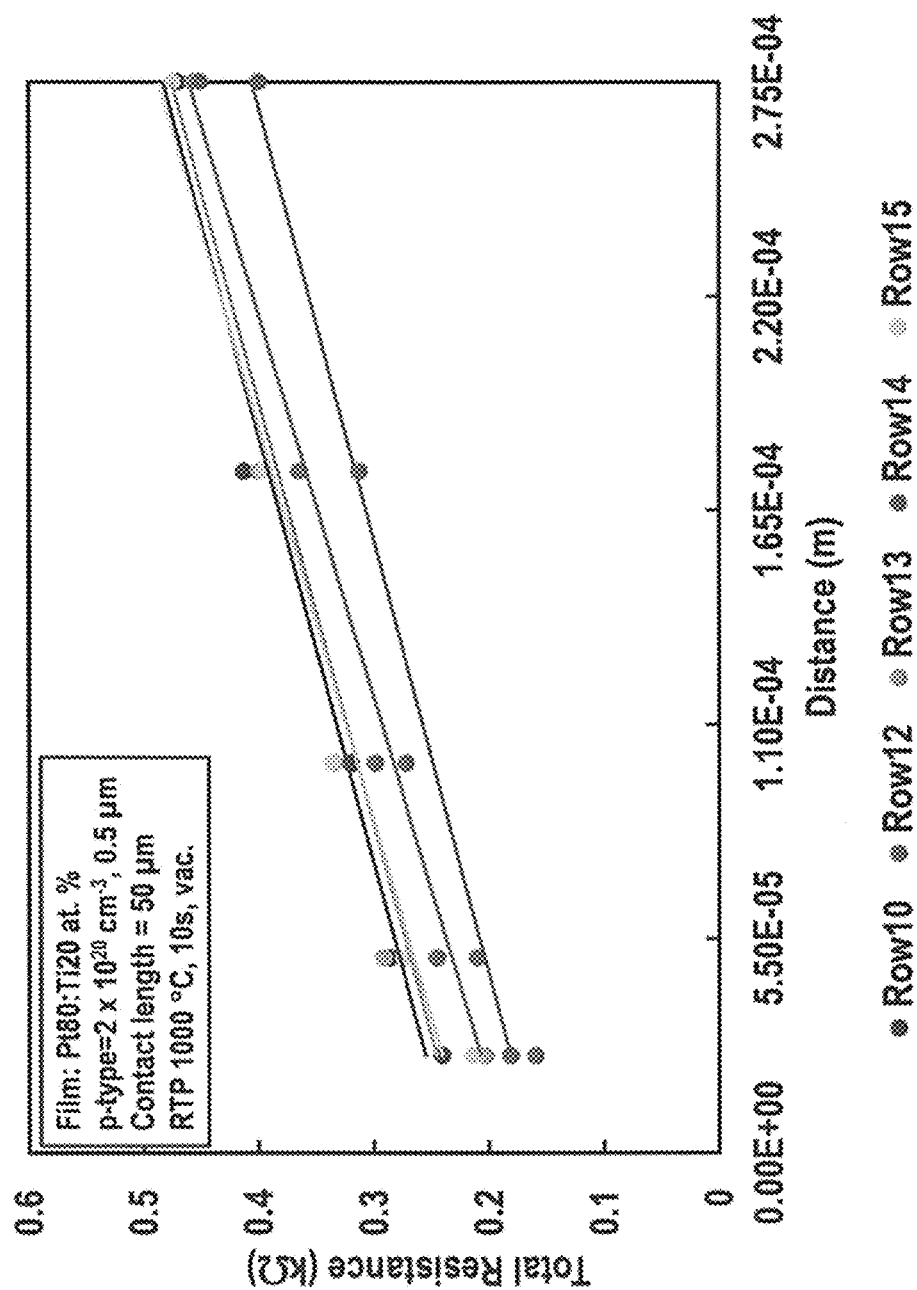
FIGS. 29A-29D are representative plots according to aspects of the innovation.
Figure 29B:
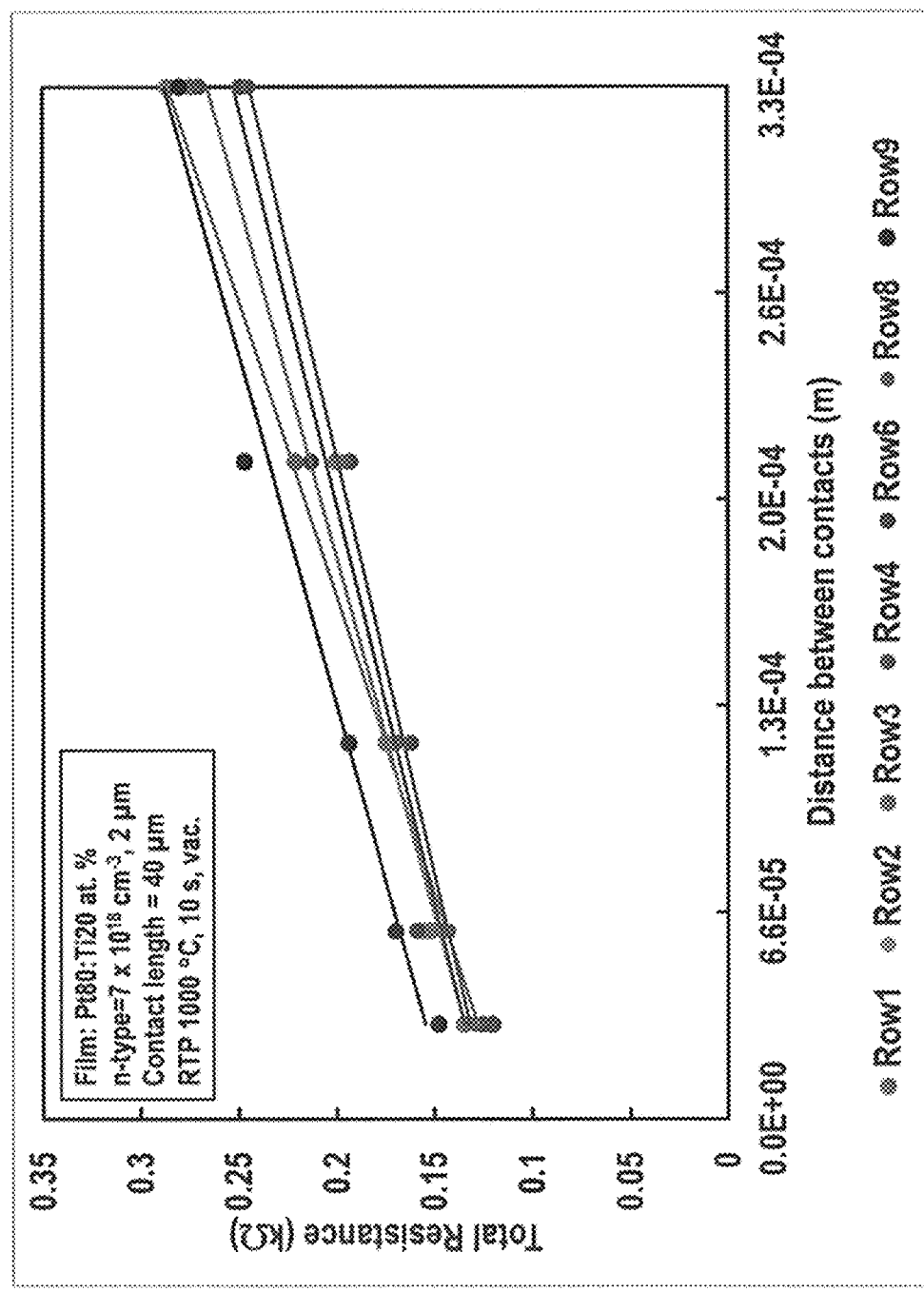
Figure 29C:
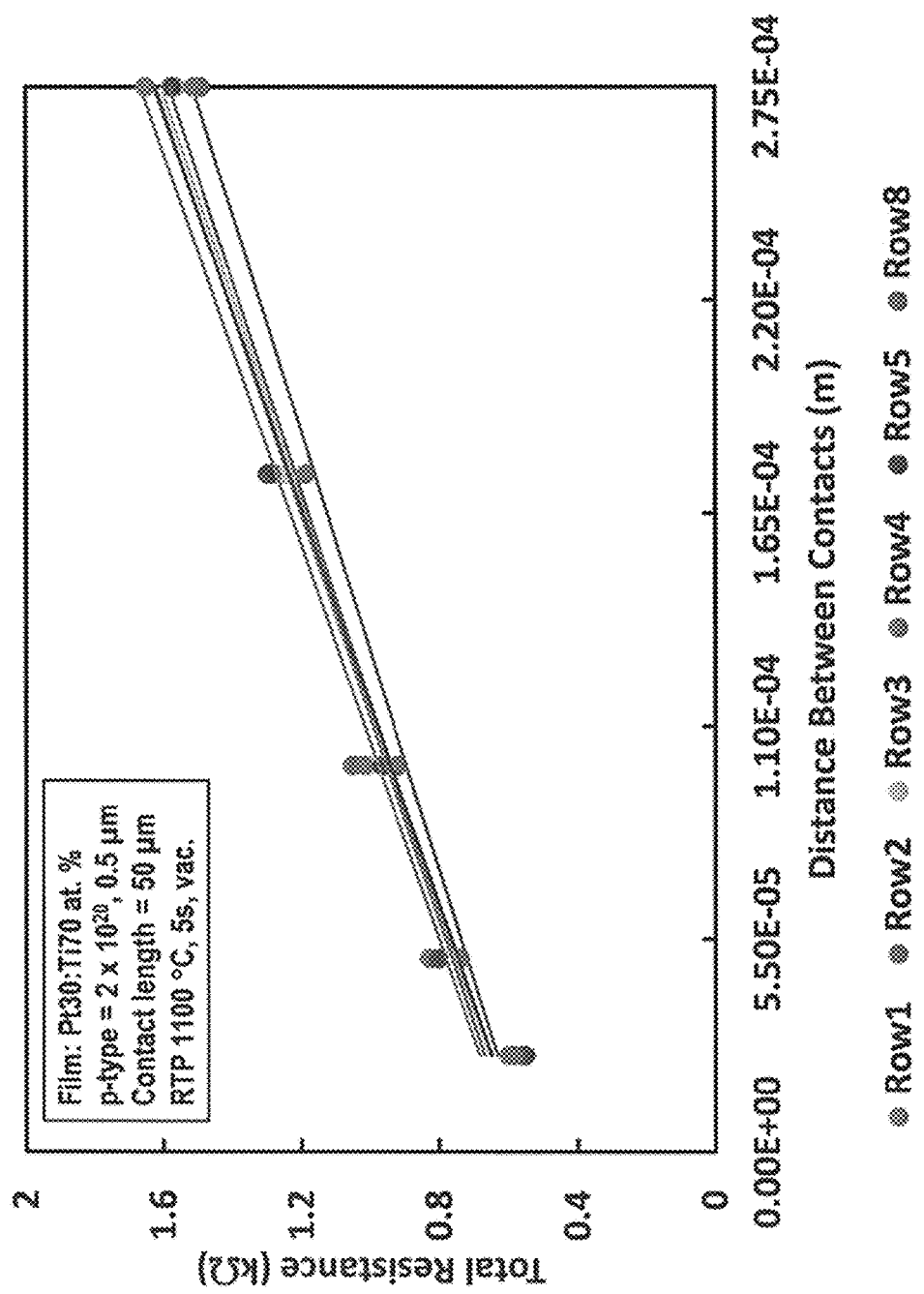
Figure 29D:
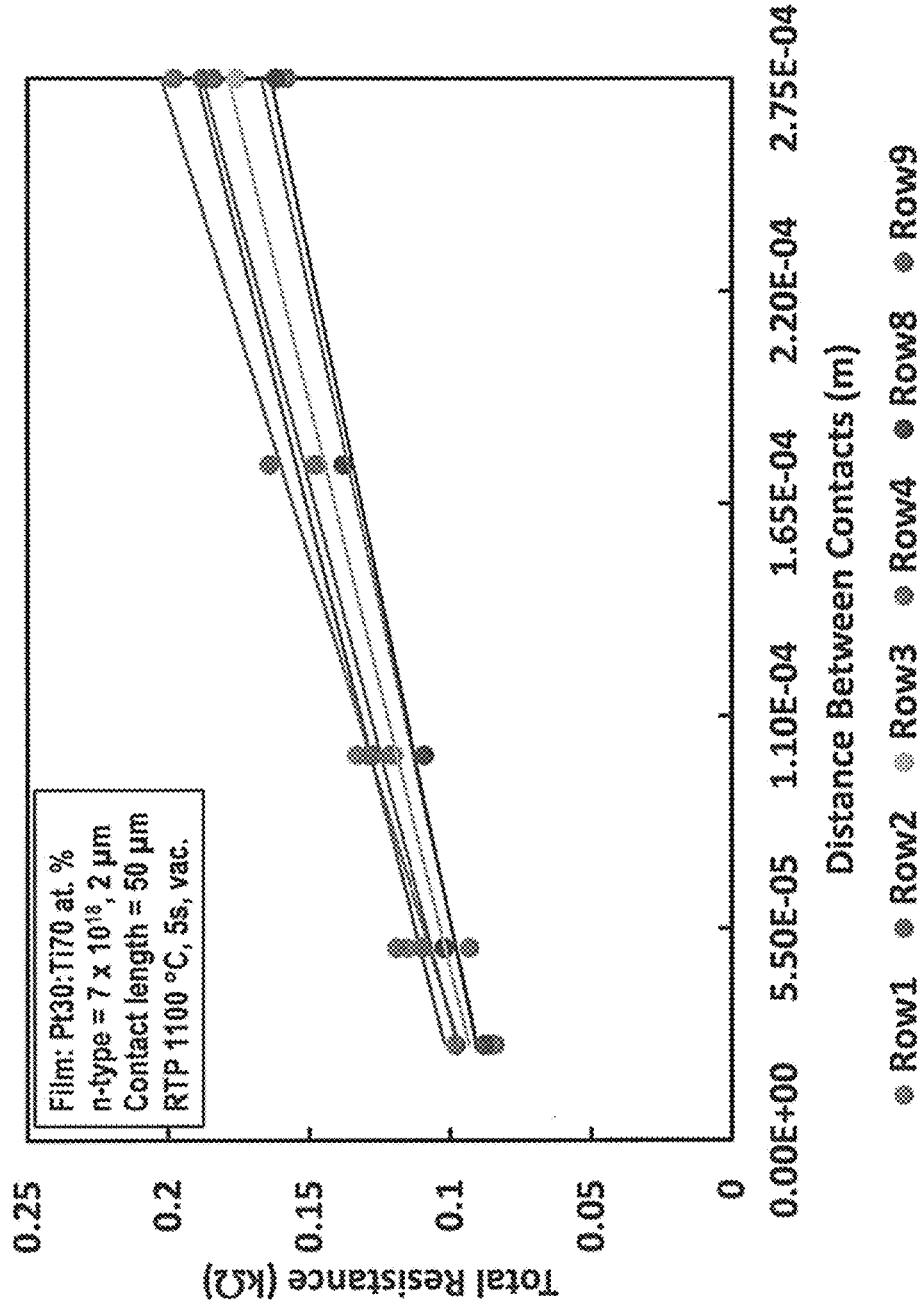

Without being bound by theory, the theoretical concept of PSA is proposed, whereby the Pt:Ti/SiC reaction in eutectic-liquidus-eutectic phase transitions would result in the formation and segregation of stable Pt, Ti silicides and Ti carbide phases having high and low WFs. This would be facilitated by the formation of Pt-silicide at lower temperature, followed by Ti-silicide and carbide at higher temperature, just as the platinum silicide transitions into the liquidus phase. The formation of the silicide and carbide products having the desired WF attributes are dictated by their enthalpies of formation in a Pt:Ti/SiC reaction complex. It is understood from the enthalpies of formation of the products in the Pt:Ti/SiC reaction complex that Pt silicide forms at a lower temperature relative to Ti silicide or Ti carbide. Therefore, with the appropriate Pt:Ti compositional ratio as determined from the phase diagrams, it is possible to drive the Pt:Ti/SiC reaction at the temperature at which eutectic-liquidus-eutectic phases of Pt silicide and solid phases of Ti silicide and Ti carbide are formed and co-exist upon to cooling down. From the binary Pt—Si and Ti—Si, and ternary Ti—SiC phase diagrams shown respectively in FIGS. 27A and 27C, two possible cases of thermodynamically stable phases at the Pt:Ti/SiC reaction zone are likely to exist.

Case 1: Condition for eutectic-liquidus phase transition (Pt:Ti>0.5): In the case of high Pt atomic concentration (approximately 23 and 39 at. % Si on the Pt—Si and Ti—Si phase diagrams, respectively), Pt3Si is favored to first form a eutectic phase at 830° C. The liquidus phase would form with increasing temperature as the Ti5Si3 and TiC solid binary phases emerge. The Ti reacts with what remains of the Si and abundant C to form the corresponding silicide and carbide. Thus, for a Pt:Ti composition ratio >0.5, the Pt:Ti/SiC reaction may be expressed as:

$$3Pt+8Ti+4SiC=Pt3Si+Ti5Si3+3TiC+C \quad (1a)$$

Case 2: Condition for eutectic-liquidus phase transition (Pt:Ti<0.5): For lower Pt concentration (approximately 39 and 25 at. % Si on the Pt—Si and Ti— Si phase diagrams, respectively), another eutectic platinum silicide phase, presumably, Pt2Si, appears at higher temperature (>983 C). The liquidus Pt2Si phase exists above that temperature, in conjunction with the solid Ti3Si, TiC, and possibly silocarbide phases. Therefore, in Case 2, the following reactions are likely to occur:

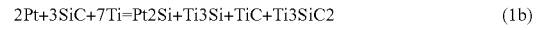

$$2Pt+3SiC+7Ti=Pt2Si+Ti3Si+TiC+Ti3SiC2 \quad (1b)$$

$$4Pt+3SiC+6Ti=2Pt2Si+Ti3Si+3TiC \quad (1c)$$

Depending on the above possible reactions, the desired outcome is to have the solid Ti silicide and carbide phases fully or partially segregate from the liquidus Pt3Si or Pt2Si phases and also have all the ohmic contact enabling reaction products maintain intimate contact with the n- and p-type 4H—SiC surfaces. This proposed model is graphically illustrated in FIGS. 26A-26C in which Pt and Ti are co-sputtered on both p- and n-type 4H—SiC conductivity regions and annealed at the temperature that would promote phase segregation via liquidus-eutectic phase transition. The WF of the reaction products were obtained from published results as follows: Pt2Si—5.17 eV, 28 Ti5Si3—3.71 eV, 29 TiC—4.71 eV, 30 and Ti3SiC2—5.07 eV.31-32 Therefore, in the absence of Fermi level pinning, the above model suggests that the Pt:Ti/SiC reaction will result in products that would promote SOC to the n- and p-type conductivity regions of 4H—SiC.

Figure 26B:
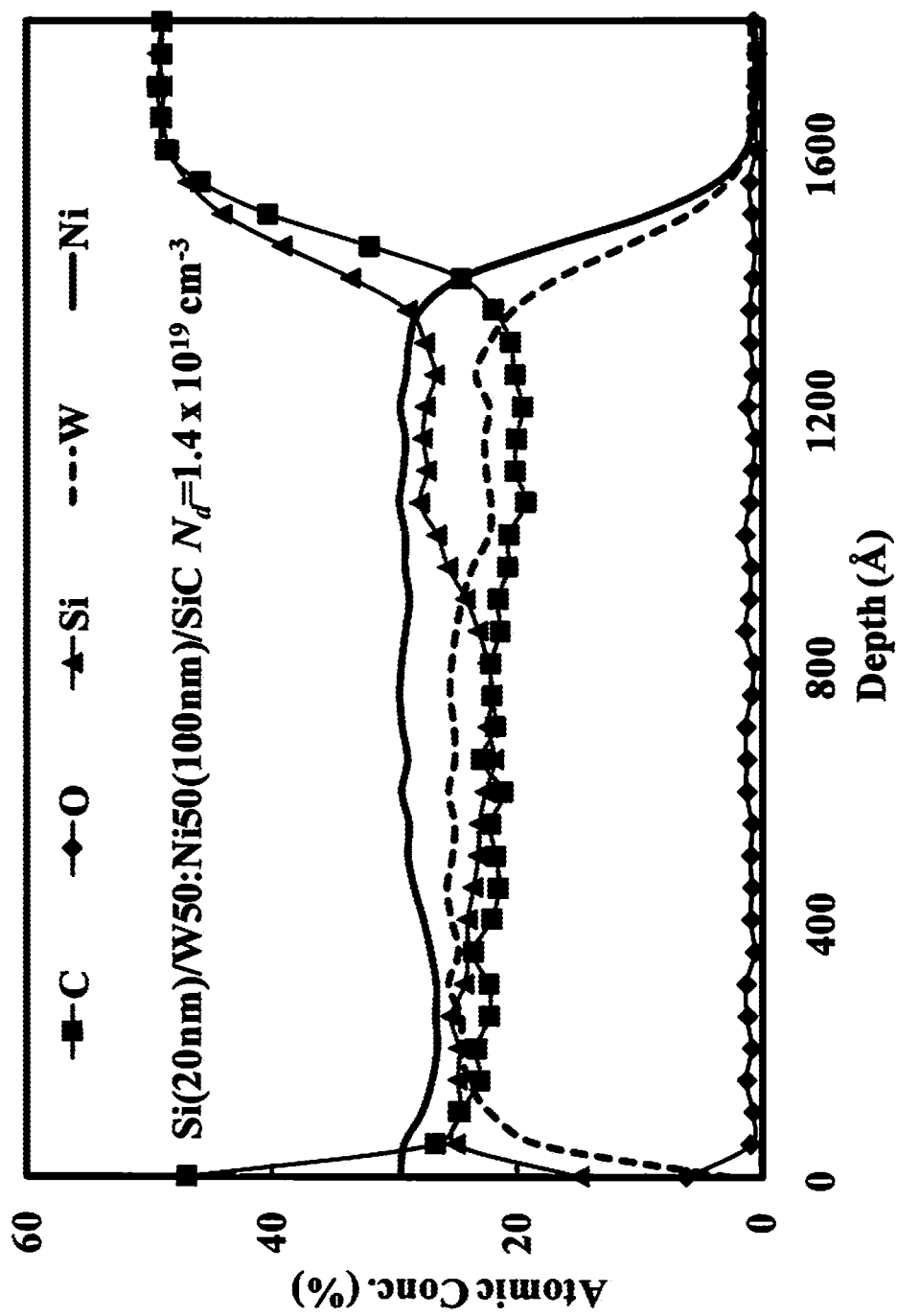
Figure 26C:
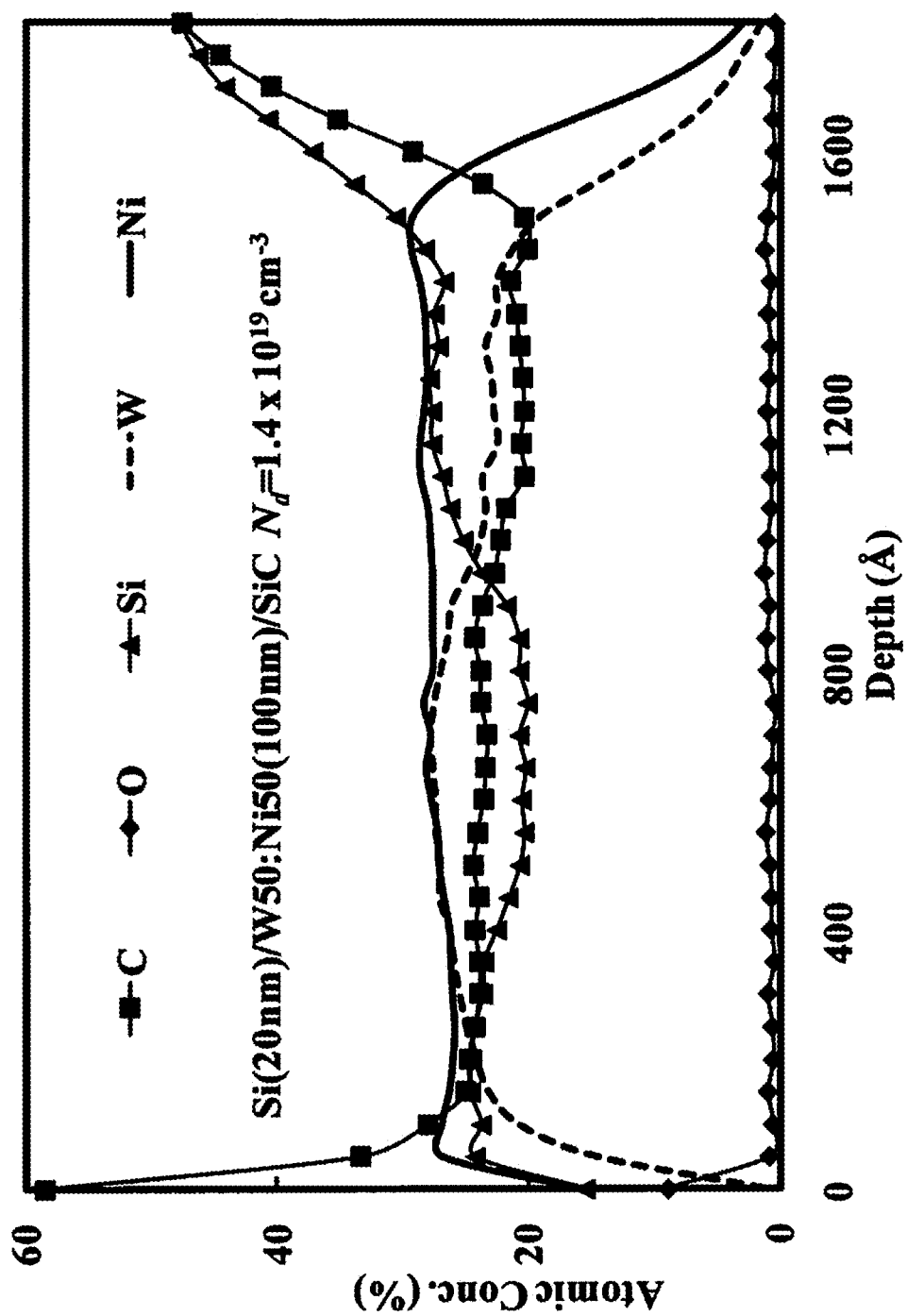

FIGS. 26A-26C illustrate an example of the PSA model according to the innovation. The model depicted in FIGS. 26A-26C show the liquidus-eutectic segregation of Pt-silicides (dark circles) from the Ti-silicides and carbides (light circles). The arrows pointing toward the circles are indicative of the preferential path for the current flow on the basis of Mott-Schottky ohmic contact theory.

FIGS. 29A-29D are representative plots of the total resistance versus distance between contacts for p-type (FIG. 29A) and n-type (FIG. 29B) 4H—SiC epilayers having Pt80:Ti20 at. % contacts annealed at 1000° C. for 10 seconds; p-type (FIG. 29C) and n-type (FIG. 29D) 4H—SiC epilayers having Pt30:Ti70 at. % contacts annealed at 1100° C. for 5 seconds.

Figure 30:
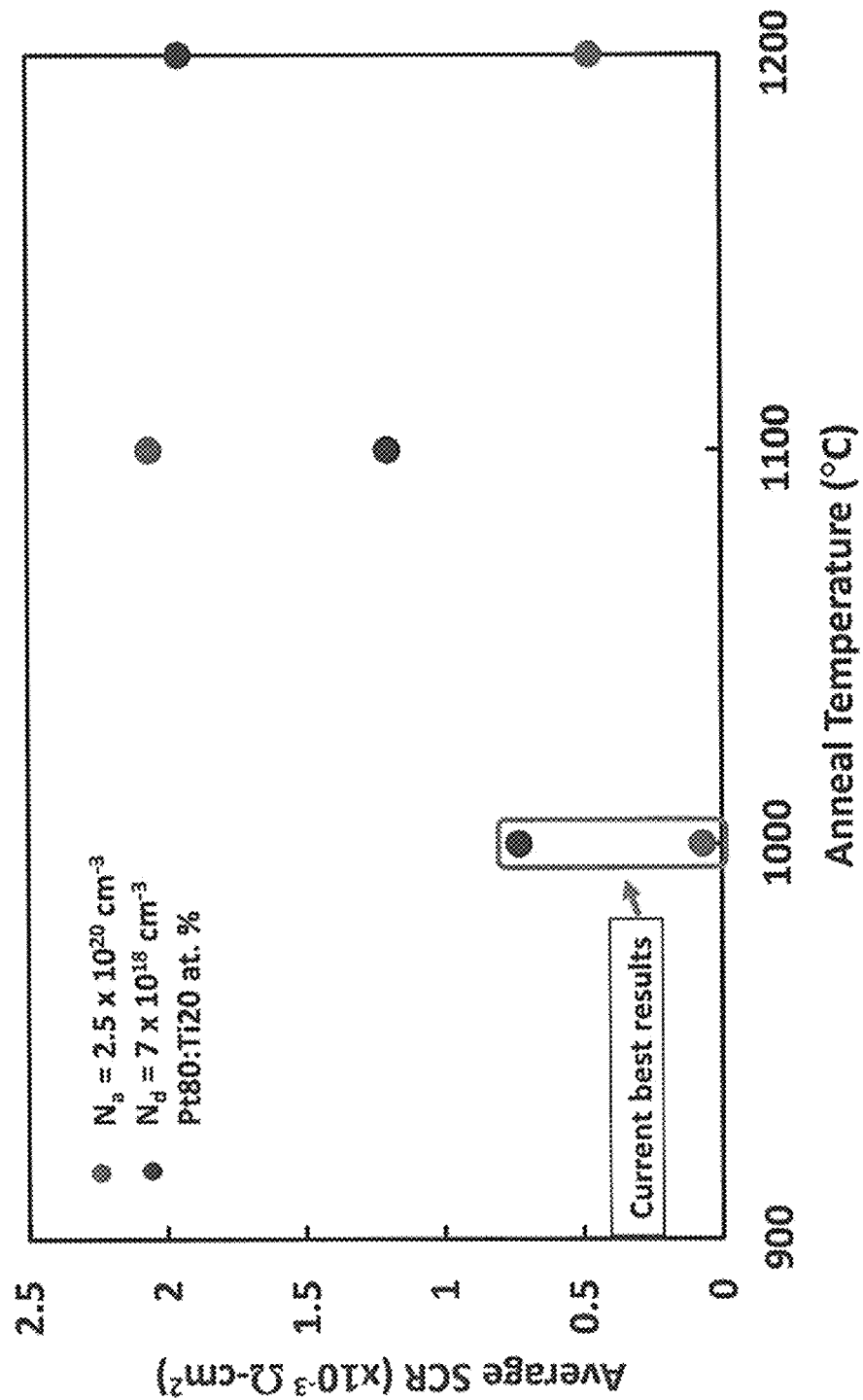
FIG. 30 is a plot of the average specific contact resistance of ohmic contacts according to the innovation.
Figure 31A:
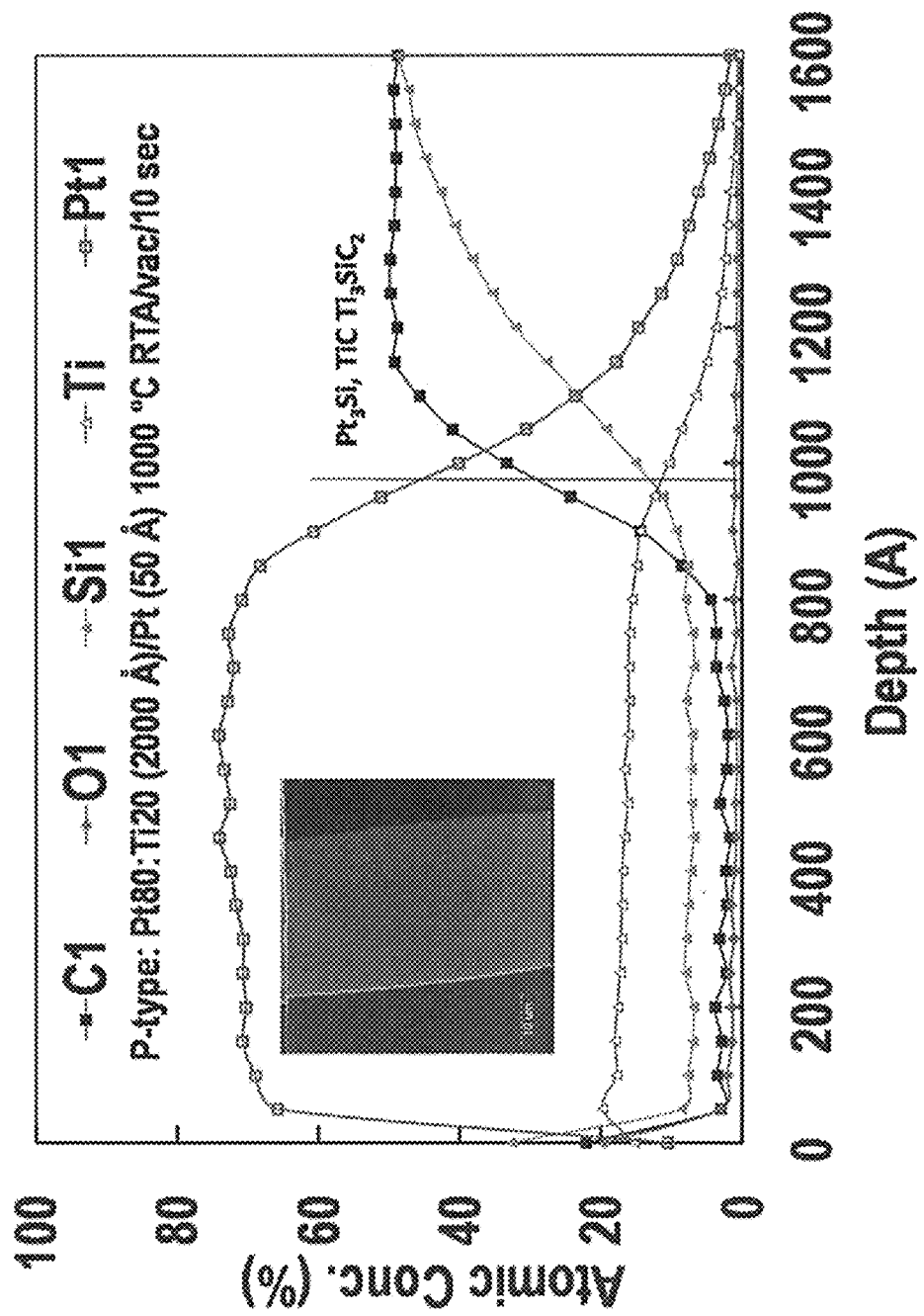
FIGS. 31A-31D depict AES depth profiles (FIGS. 31A and 31B) and cross-section FE-SEM images of example embodiments of according to the innovation (FIG. 31C and FIG. 31D).
Figure 31B:
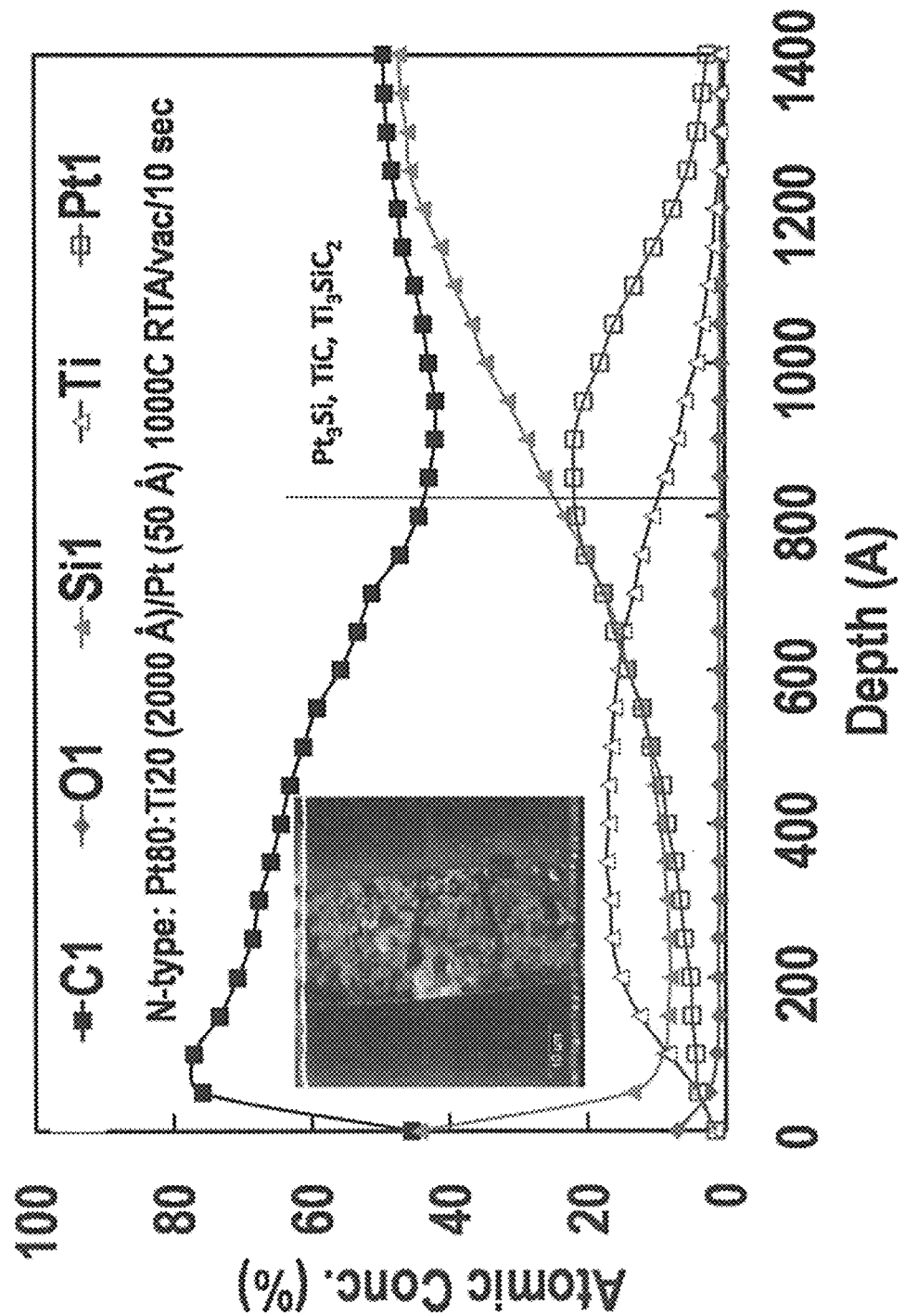
Figure 31C:
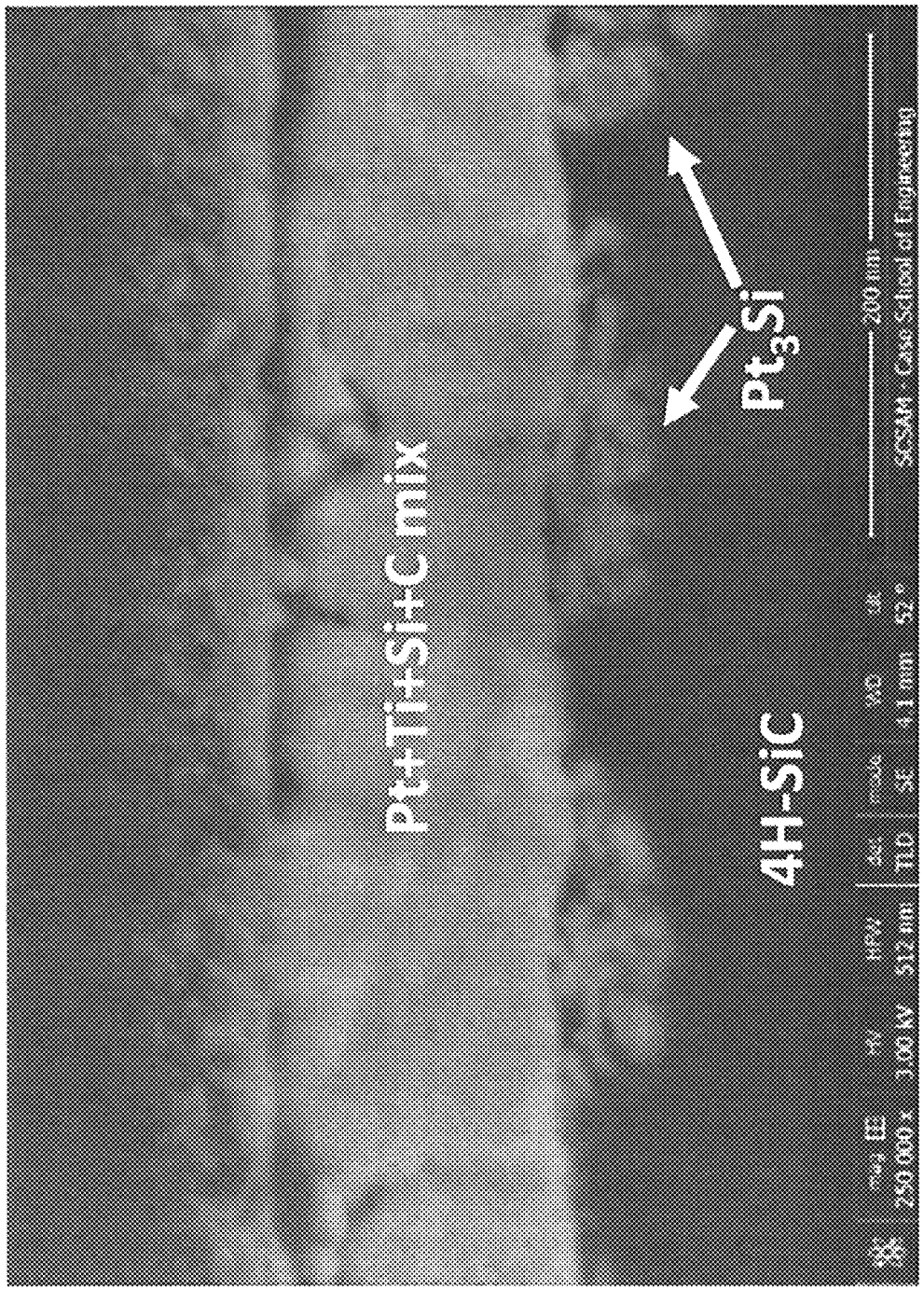
Figure 31D:
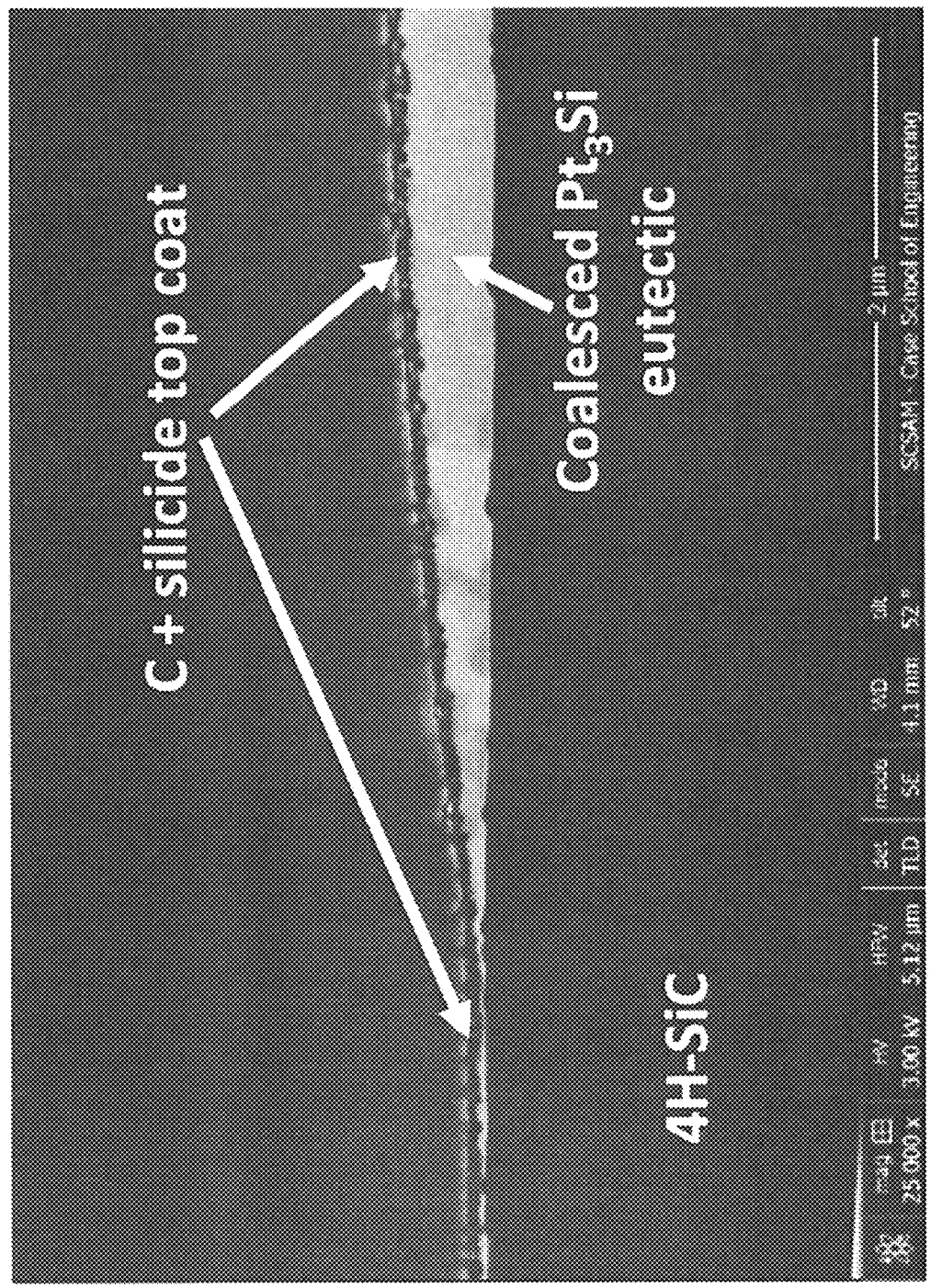
Figure 32A:
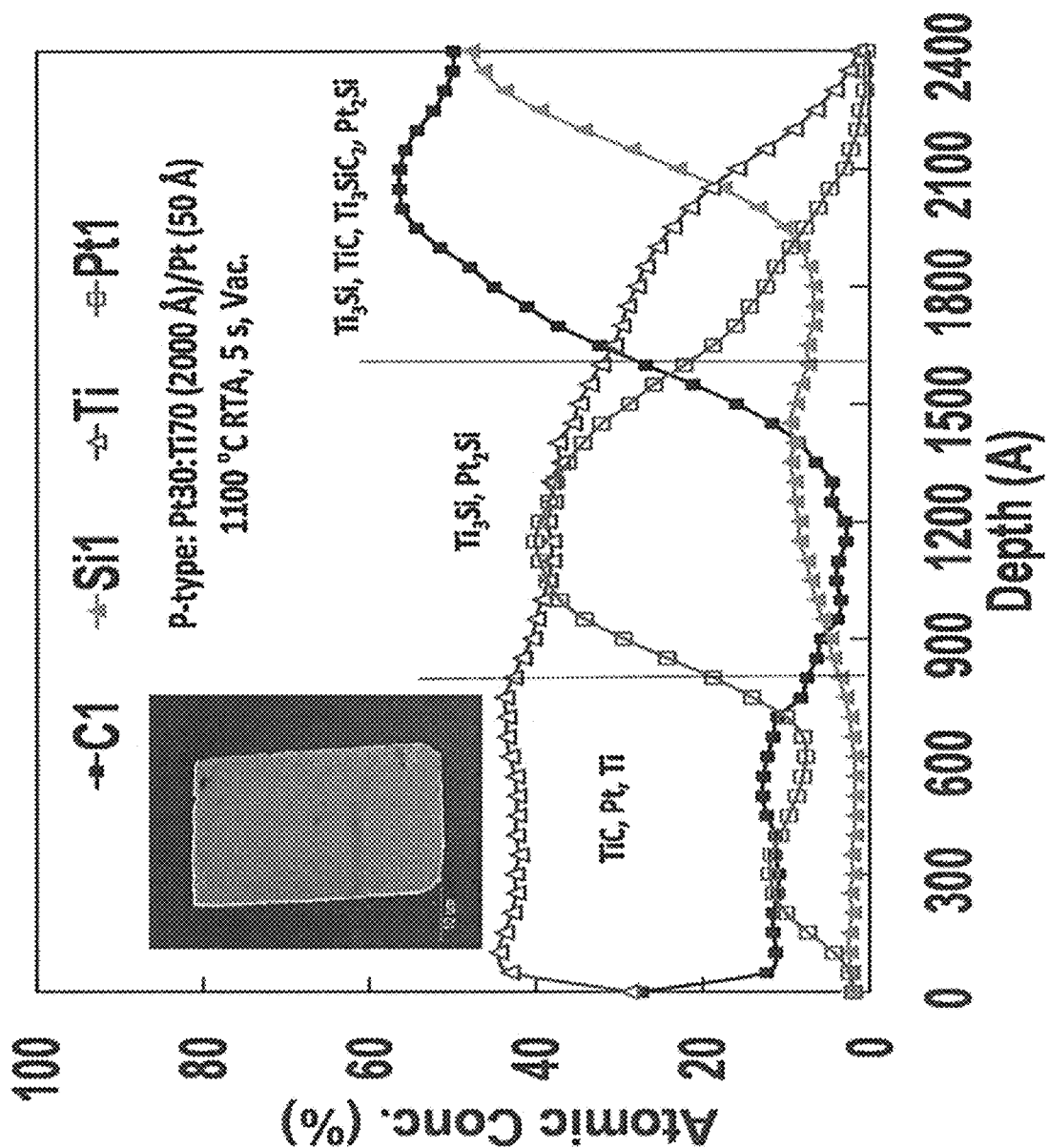
FIGS. 32A-32D depict AES depth profiles (FIGS. 32A and 32B) and cross-section FE-SEM images of example embodiments of according to the innovation (FIG. 32C and FIG. 32D).
Figure 32B:
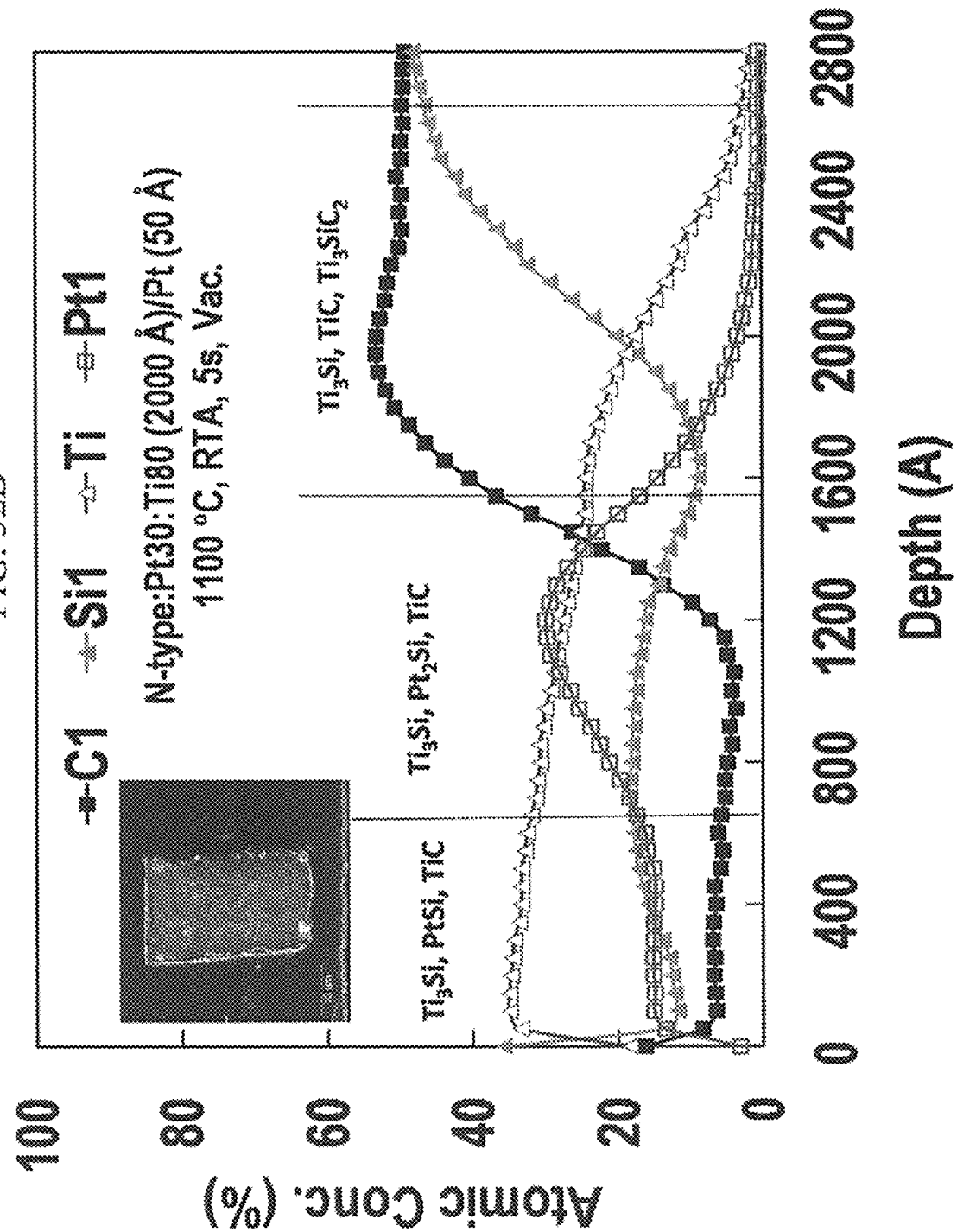
Figure 32D:
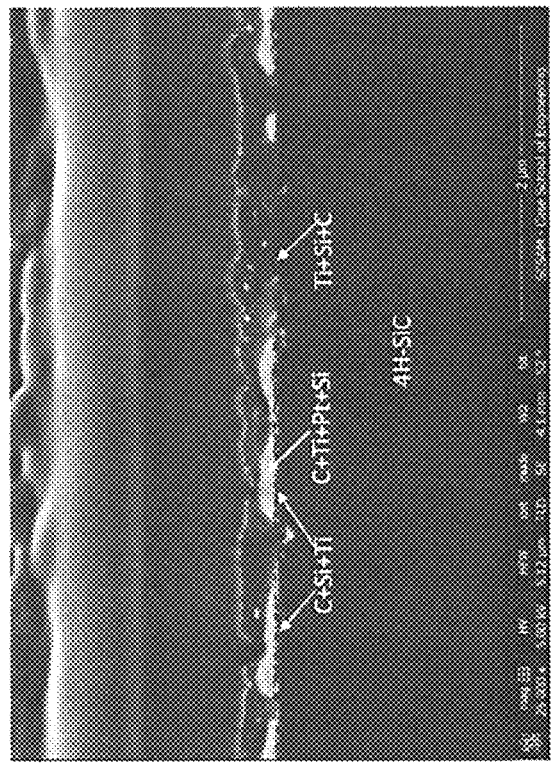
Figure 32C:
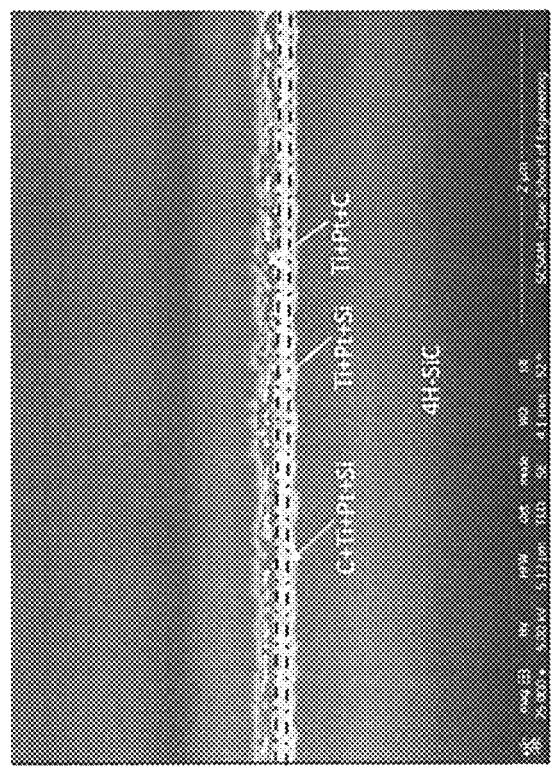

FIG. 30 is the average specific contact resistance of pairs of simultaneous ohmic contacts of the TLM structures to p- and n-type 4H—SiC obtained by the PSA of co-sputtered Pt80:Ti20 at. % metallization at SOC forming RTA temperatures for 10 seconds in vacuum.

FIGS. 31A-31D are the Auger Electron Spectroscopy (AES) depth profiles of co-sputtered Pt80:Ti20 contacts on p-type (FIG. 31A) and n-type (FIG. 31B) 4H—SiC after RTA at 1000° C. for 10 s. Differences in the reaction zone profiles could be observed, as well as in the surface morphology seen in the corresponding SEM image insets. Cross section FESEM images of Pt80:Ti20 vacuum annealed at 1000° C. for 10 seconds, showing intermixing of silicides and coalesced binary Pt3Si at 4H—SiC growth terraces of the p-type sample (FIG. 31C), and liquids-eutectic coalescence of binary Pt3Si and segregated solid phases of TiC and Ti3Si (FIG. 31D), all in contact with the n-type surface.

FIGS. 32A-32D show the AES depth profiles of co-sputtered Pt30:Ti70 contact metallization on p-type (FIG. 32A) and n-type (FIG. 32B) 4H—SiC after vacuum RTA at 1100° C. for 5 s. Differences in the surface morphology between the two contacts can be seen in the corresponding insets FIGS. 32C-32D).

Pt:Ti as a Diffusion Barrier System

In addition to being a good candidate for SOC on n- and p-type 4H—SiC that is realized by PSA, another motivation for the use of Pt:Ti is the low resistivity of Pt/Ti binary layers. The Pt/Ti binary layers have also been determined to be effective in preventing the diffusion of Au and O2 through it. The diffusion barrier characteristics of deposited Pt/Ti were previously studied extensively, particularly for application in silicon technology. The inter-diffusion of Pt/Ti, however, required an intermediary barrier layer such as TiN to mitigate such mixing. In this invention, however, the functional benefits of intermixed Pt:Ti in a deliberately controlled manner was investigated within the context of the PSA model. While co-sputtered Pt:Ti had been used as a base electrode during PZT deposition, extensive literature search indicated that the ohmic contact characteristics on SiC have not been previously investigated.

After the formation of the SOC on the n- and p-type surface using the PSA method on the Pt80:Ti20 compositional ratio, another 200 nm layer of Pt80:Ti20 was deposited on it and patterned, and annealed at 700° C. for 30 minutes in argon ambient. This was followed by the deposition and patterning of 1 micron Au. At the various patterning steps, aluminum layer was used as the contact mask in the pattern etching of the underlying film. The Al was subsequently stripped before the next deposition was performed. It must be noted that the use of Al as the contact etch mask would attract adventitious oxygen that is trapped between layers as aluminum oxide.

FIG. 33 shows the AES depth profile and corresponding cross section FIB-FESEM image of double layered Pt80:Ti20 conductor. The first layer was annealed at 900° C. by vacuum RTA to achieve PSA and form SOC on n- and p-type 4H—SiC, followed by another Pt80:Ti20 layer that was further furnace annealed at 700° C. in argon, and, finally, a sputtered 1 micron Au capping layer, further furnace annealed at 700° C. The smooth surface morphology of the Au capping layer can be seen in the scanning electron microscope image in the insets. The presence of oxygen in at the two interfaces was the result of using Al contact etch mask for patterning, which leads to the formation of aluminum oxide.

Figure 34:
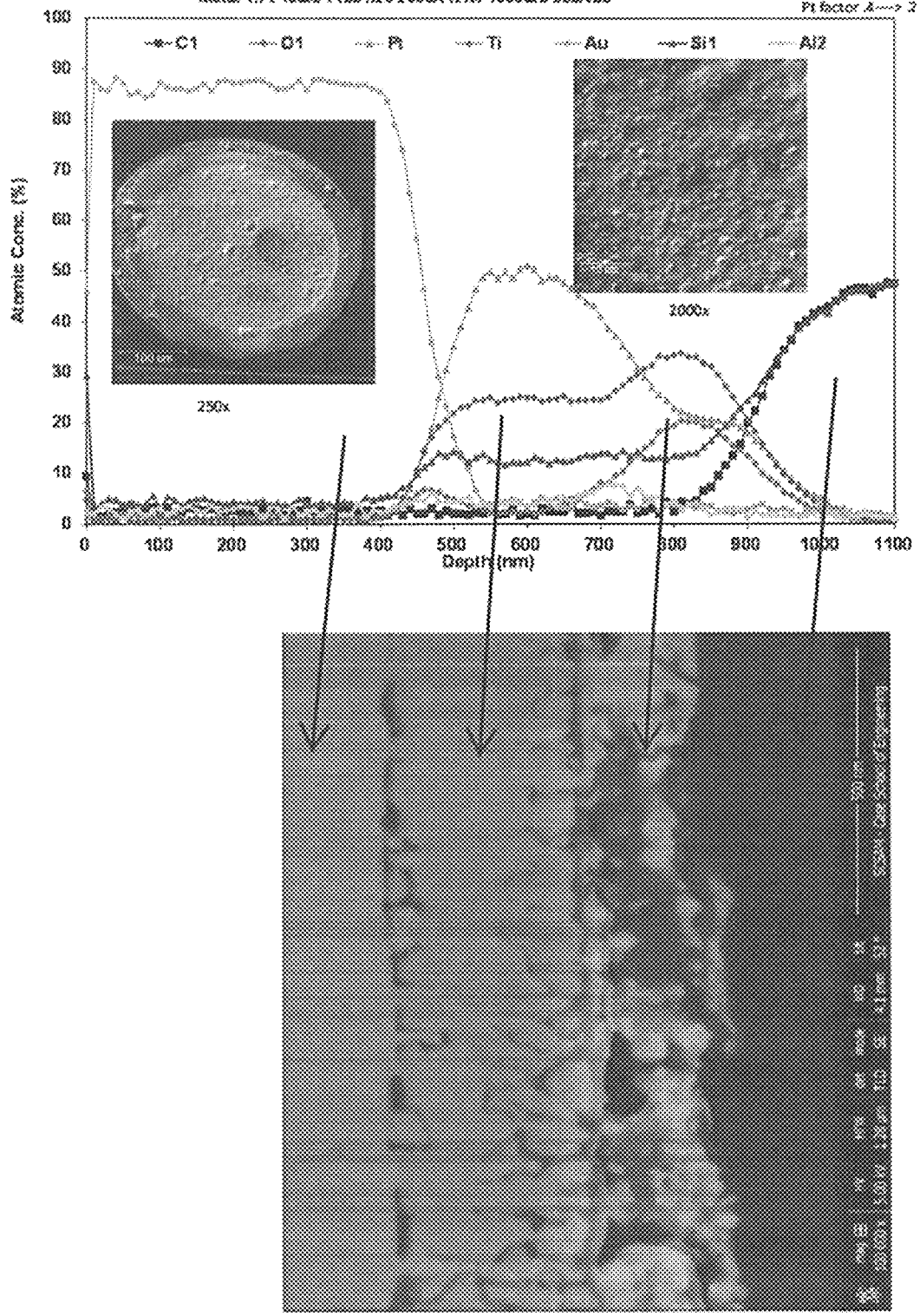
FIG. 34 depicts an AES depth profile and corresponding cross section FIB-FESEM image of an example embodiment according to the innovation.

FIG. 34 shows the AES depth profile and corresponding cross section FIB-FESEM image of double layered Pt80:Ti20 conductor. Following the process describe in FIG. 33, the layer was heat treated at 800° C. in air for 15 minutes. The first (PSA) and portion of the second Pt80:Ti20 layers have now merged, the portion that forms the SOC on the 4H—SiC remains undisturbed. The O2 and Al are artefacts of the fabrication process as described in FIG. 33. The surface morphology of the Au capping layer remains fairly smooth as seen in the scanning electron microscope image in the insets. The Au migration was effectively stopped at the Pt80:Ti20 diffusion barrier layer.

According to an aspect of the innovation, phase segregation annealing (PSA) of compositional Pt:Ti may be used in a method of simultaneously forming ohmic contacts to n- and p-type surfaces. In another aspect, the innovation provides co-sputtered Pt:Ti as a single conductor metallization that possesses the combined attributes of low specific contact resistance (SCR) simultaneous ohmic contacts to n- and p-type 4H—SiC, acts as a diffusion barrier against Au and O, and low resistivity interconnect to enable reliable device operation at high temperature (e.g., in excess of 600° C.). In one embodiment, the single conductor alloy according to the innovation may be utilized to reduce the fabrication process costs, time, and complexity of 4H—SiC sensors and electronics.

In one example according to the innovation, nitrogen-doped (n-type, 2 μm thick, $N_d=1.7\times10^{19}$ cm$^{-3}$) and aluminum-doped (p-type, 0.5 μm thick, $N_a=1\times10^{20}$ cm$^3$) 4H—SiC epitaxial layers were homoepitaxially grown separately by chemical vapor deposition on the Si faces of basal (0001)-plane, 8° off-axis 4H—SiC semi-insulating substrates. Aluminum (2 μm) was sputter deposited on each epilayer and rectangular transfer length method (TLM) patterns were photolithographically defined in the photoresist that was spun on the Al. Wet etching of the Al in $H_3PO_4$ at 50° C. for 3 minutes was performed, followed by photoresist dissolution, then reactive ion etching of the exposed SiC epilayer sections in a mixture of Argon (25 sccm) and $SF_6$ (15 sccm) at 400 W and a base pressure of 25 mT, stopping at the semi-insulating substrate. The residual Al mask was dissolved in hot $H_3PO_4$ and the samples were rinsed in deionized (DI) water. A 500 nm thick quartz ($SiO_2$) was sputter deposited on the samples, followed by standard lithography and reactive ion etching (RIE) to pattern and etch vias in the oxide, thus exposing the SiC contact regions on the TLM structures.

Figure 35A:
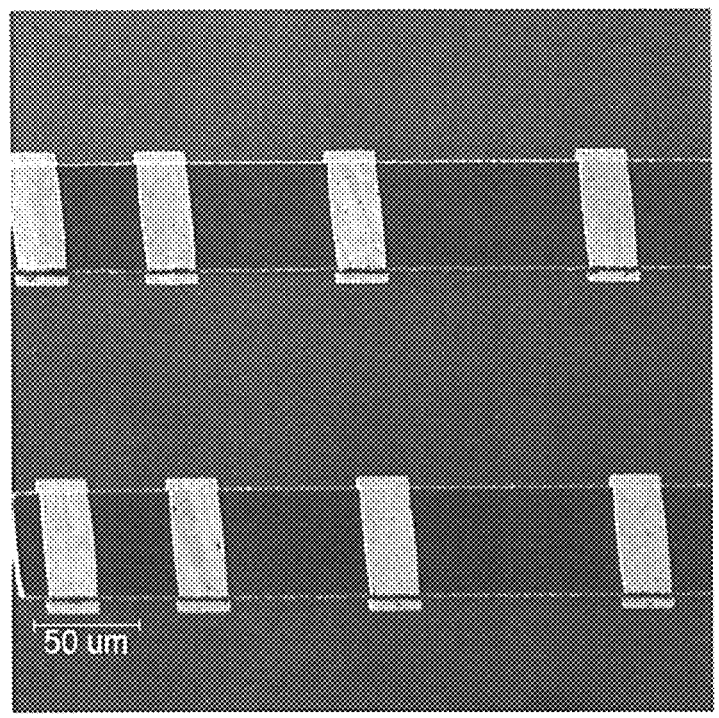
FIGS. 35A-35B depict examples according to the innovation: a) Complete TLM structure with the Au capped Pt:Ti 80:20 at. % ratio ohmic contacts and diffusion barrier layers, and b) schematic cross section of the buried Pt:Ti 80:20 at. % ratio interconnect anchored between two contacts.
Figure 35B:
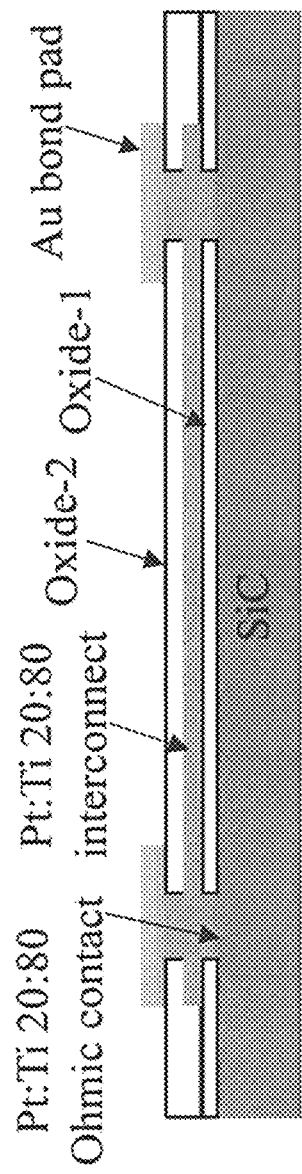

Co-sputtering of a 300 nm film of Pt:Ti of 80:20 at. % ratio was performed, followed by a capping layer of 20 nm Pt to prevent premature oxidation. A 1 μm Al was sputter deposited for use as the etch mask. Photolithography was applied to define and pattern the ohmic contacts in the Al layer, followed by wet etching in $H_3PO_4$ at 50° C. for 2 minutes. The photoresist was then dissolved away in acetone, followed by stripping away of the residual Al in $H_3PO_4$ at 50° C. Annealing of the samples was performed by rapid thermal process (RTP) in near vacuum at 1100° C. for 5 seconds to complete the ohmic contact formation on the n- and p-type samples. For the second metallization, which was to serve as the diffusion barrier and interconnect, another layer of 300 nm layer of Pt:Ti of 80:20 at. % ratio was co-sputtered, followed by the Pt (20 nm) and Al (2 μm) depositions, photolithography, and etching processes described earlier. Finally, RTP annealing was performed at near vacuum and 800° C. for 10 seconds. This final process provided second layer metallization traces to connect to the first layer ohmic contact metallization, which allows for the measurement of the interconnect resistivity between two ohmic contacts. A second 500 nm quartz oxide layer was deposited over the samples and the process of contact photolithography and RIE etch described above was repeated to open contact vias in the oxide, thus exposing the second level metallization. For bond pad metallization, a 100 nm layer of Pt:Ti of 80:20 at. % ratio was co-sputtered, followed by 1 μm Au deposition. The bond pad was patterned in the Au and wet etching was performed in 10:9:1 volume ratio of $H_2O:HCl:HNO_3$ at 40° C. for about 2 minutes. This was followed by RIE to etch the Pt:Ti, and oxygen plasma cleaning of the photoresist to recover the Au surface. The actual and illustrative structures obtained after above processes are shown in FIGS. 35A-35B for the TLM structure, diffusion barrier/buried interconnect, respectively.

Two separate characterizations were performed: measurement of the diffusion of Au and O through the contacts and the measurement of the SCR and the resistivity of the second metallization interconnect (buried between the two $SiO_2$ layers) after thermal soak. For the Au and O diffusion study, samples were initially furnace annealed in Ar at 700° C. for 30 minutes, followed by thermal soak in atmospheric oven at 800° C. for 15 minutes. For the buried interconnect, sub-sets of samples were separately thermally soaked at 700, 800, and 900° C. in pure $O_2$ ambient for 60 minutes.

After the 30 minutes Ar anneal at 700° C. and 15 minutes thermal soak at 800° C. in atmosphere, the SCR from the n- and p-type 4H—SiC TLM structures having doping levels of $N_d=7\times10^{18}$ cm$^{-3}$ and $N_a=2\times10^{20}$ cm$^{-3}$ were $7\times10^{-5}$ and $7.4\times10^{-4}$ Ω-cm$^2$, respectively. The Auger Electron Spectroscopy (AES) depth profile and corresponding Field Emission Scanning Electron Microscopy (FE-SEM) images of the sample after the 700° C. anneal in Ar are shown in FIG. 33. The top Au bond pad layer did not show any significant migration into the underlying co-sputtered Pt:Ti layers. The observed O between Au and the Pt:Ti was the result of Ti oxidation after the etching of the top oxide led to the exposure to atmosphere of the underlying Pt:Ti layer. The Al observed at the broad interface between the two Pt:Ti layers was the residual Al contact mask that was used during the etching of the first Pt:Ti layer. At the SiC interface is a mixture of TiC and silicides of Pt and Ti that forms the simultaneous ohmic contacts by PSA on the n- and p-conductivity surfaces. The AES depth profile of the post-800° C. treatment in air is shown in FIG. 34. A presumed small Au migration (if not AES tailing effect) into the Pt:Ti diffusion barrier, but was effectively contained. The first Pt:Ti (ohmic contact) and the second Pt:Ti (diffusion barrier) layers have merged while the section of the ohmic contact layer on the 4H—SiC surface remains intact. The residue O had shifted to the SiC interface in the form of a conductive oxide and intermixed with silicides of Pt and Ti. However, the measured SCR values remained unchanged. Compared to FIG. 33, the surface morphology of the Au capping layer remained relatively smooth as seen in the inset SEM images.

Figure 36A:
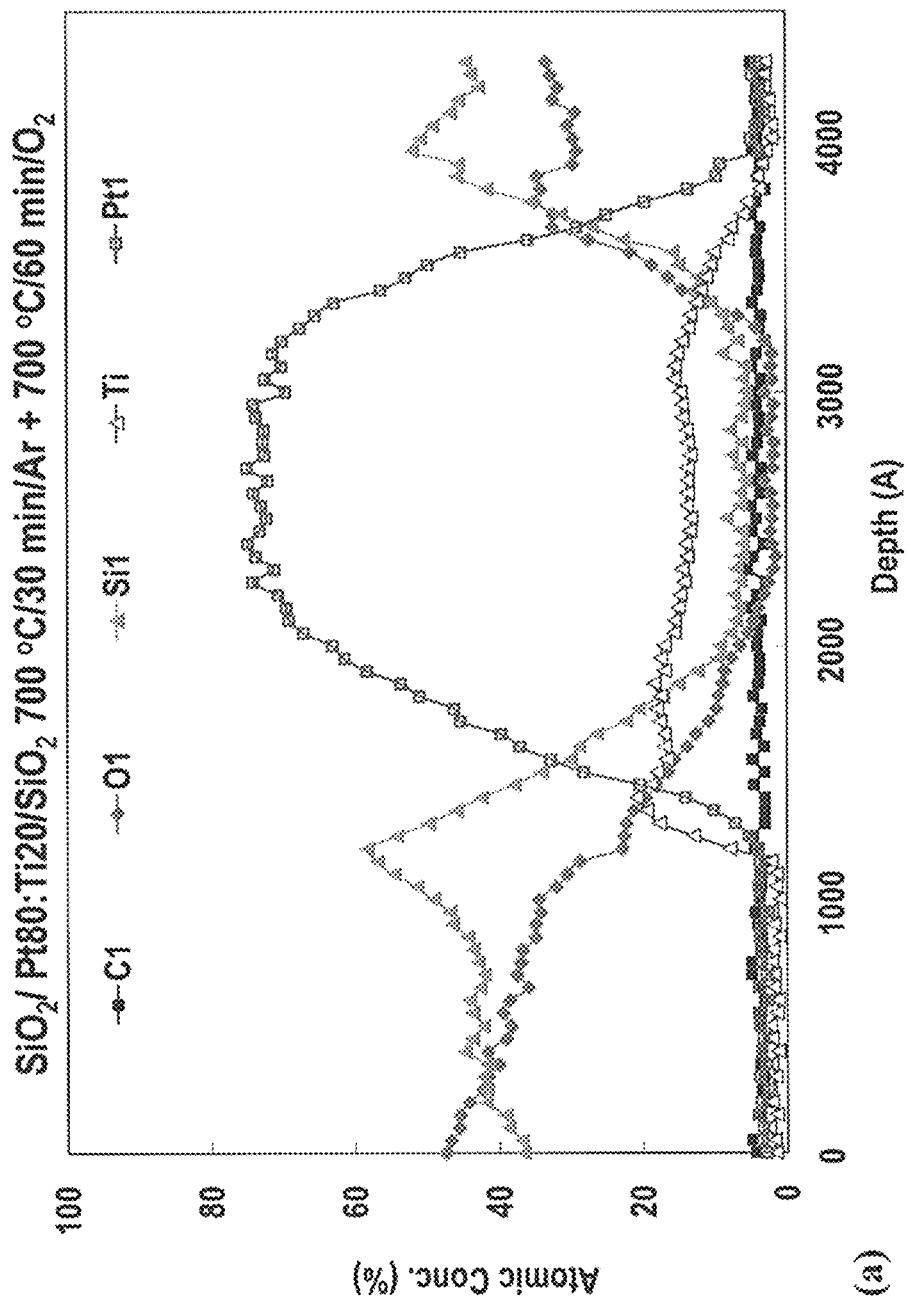
FIGS. 36A-36C: AES depth profiles of the Pt:Ti 80:20 at. % ratio sandwiched between $SiO_2$ layers after 1 hour of thermal treatment in 6 slpm O flow at a) 700° C., b) 800° C., and c) 900° C.
Figure 36B:
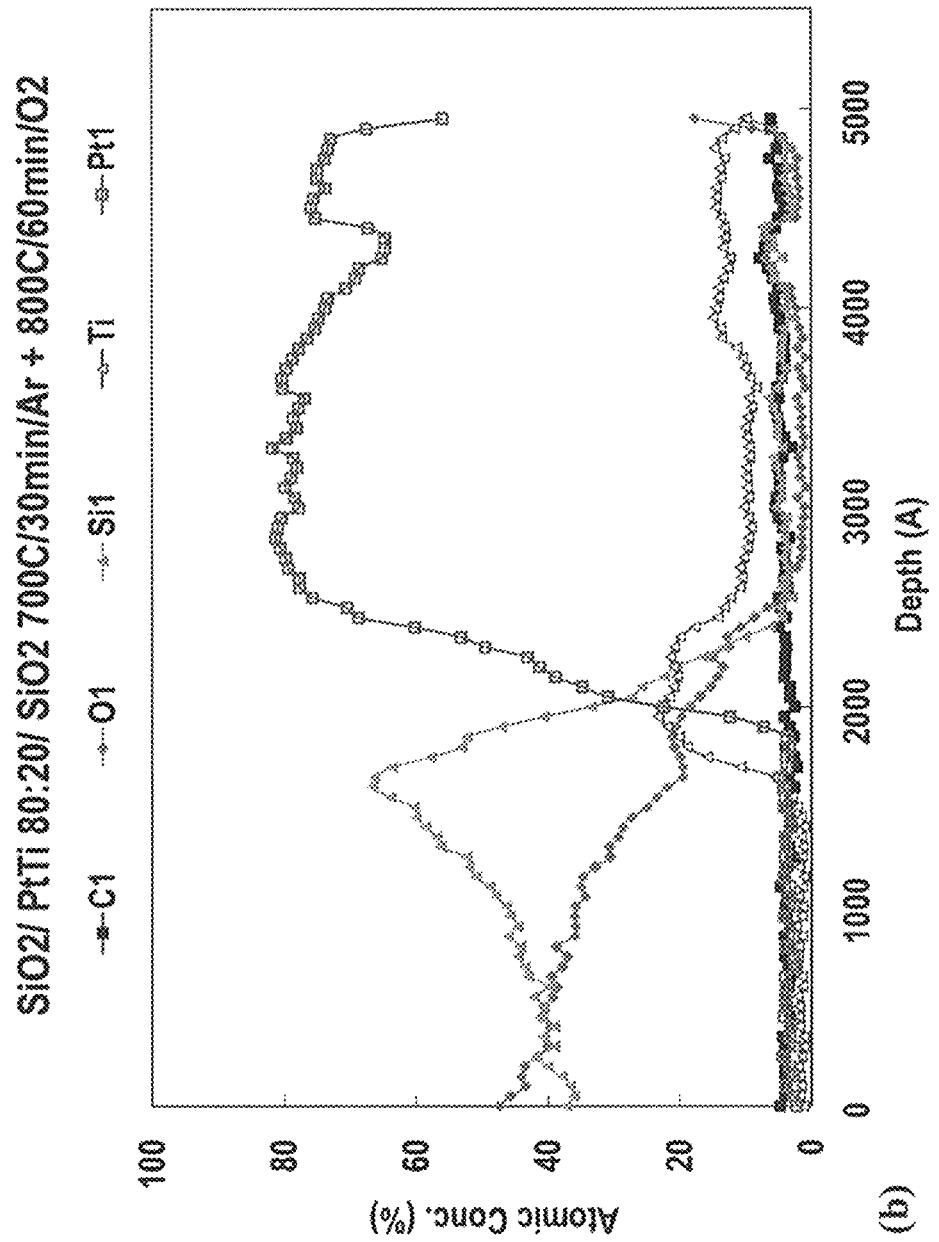
Figure 36C:
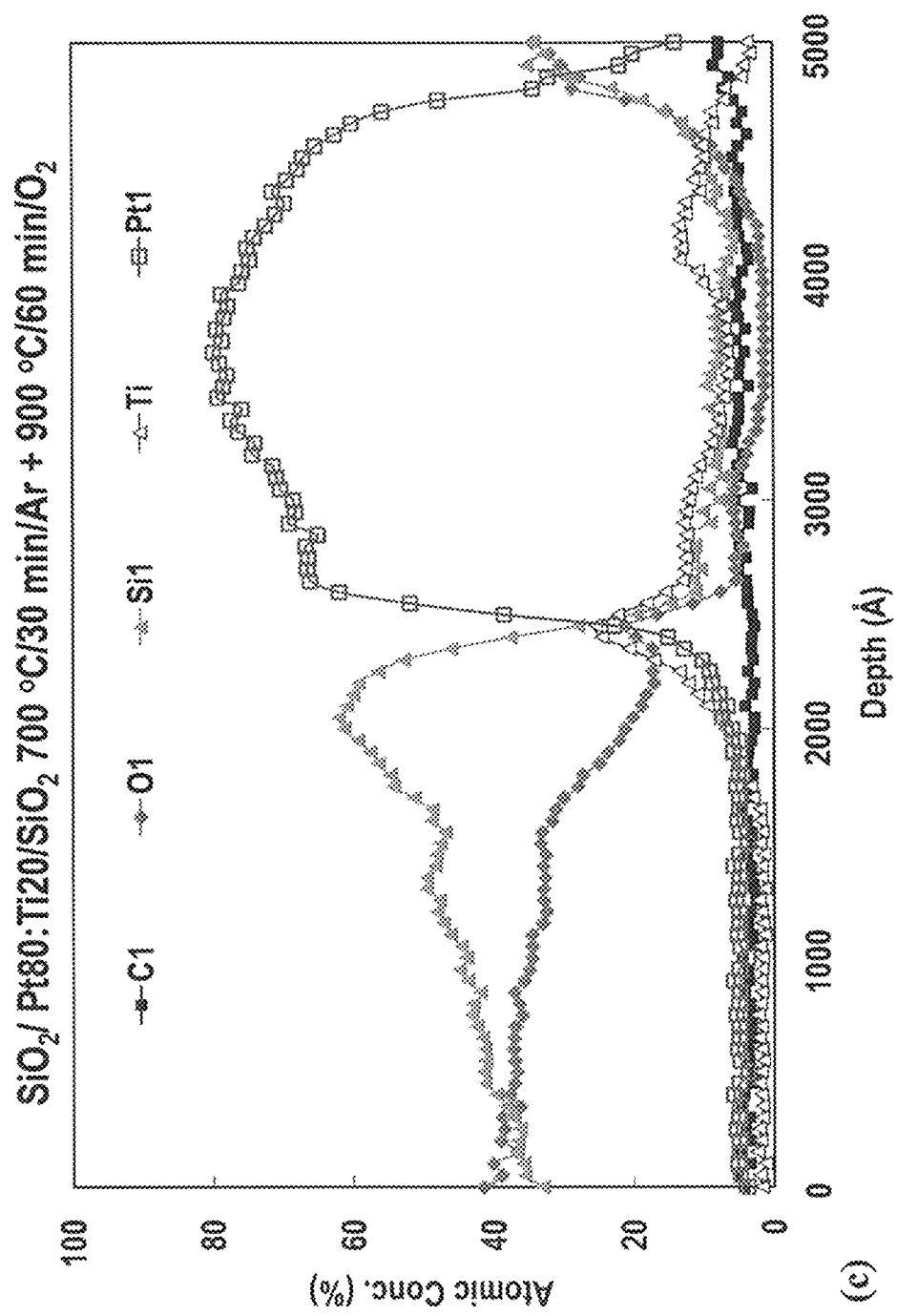
Figure 37:
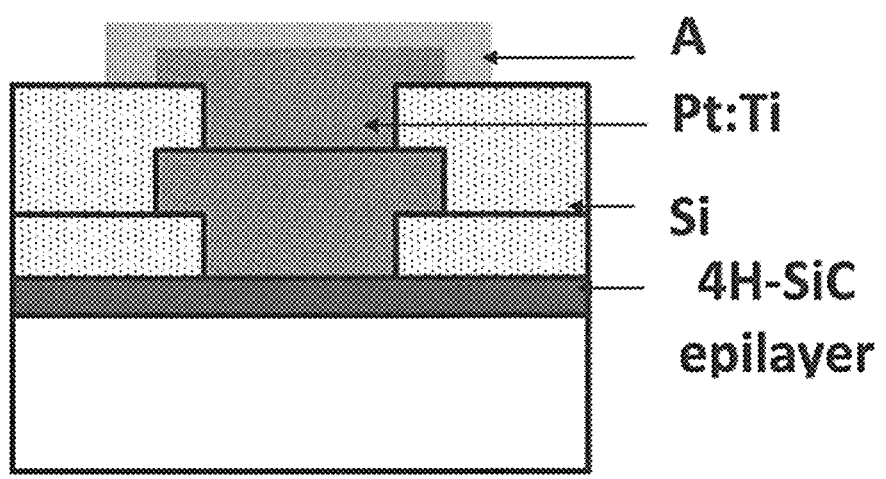
FIG. 37 is an illustration of a single conductor alloy as a diffusion barrier according to an example of the innovation.
Figure 38A:
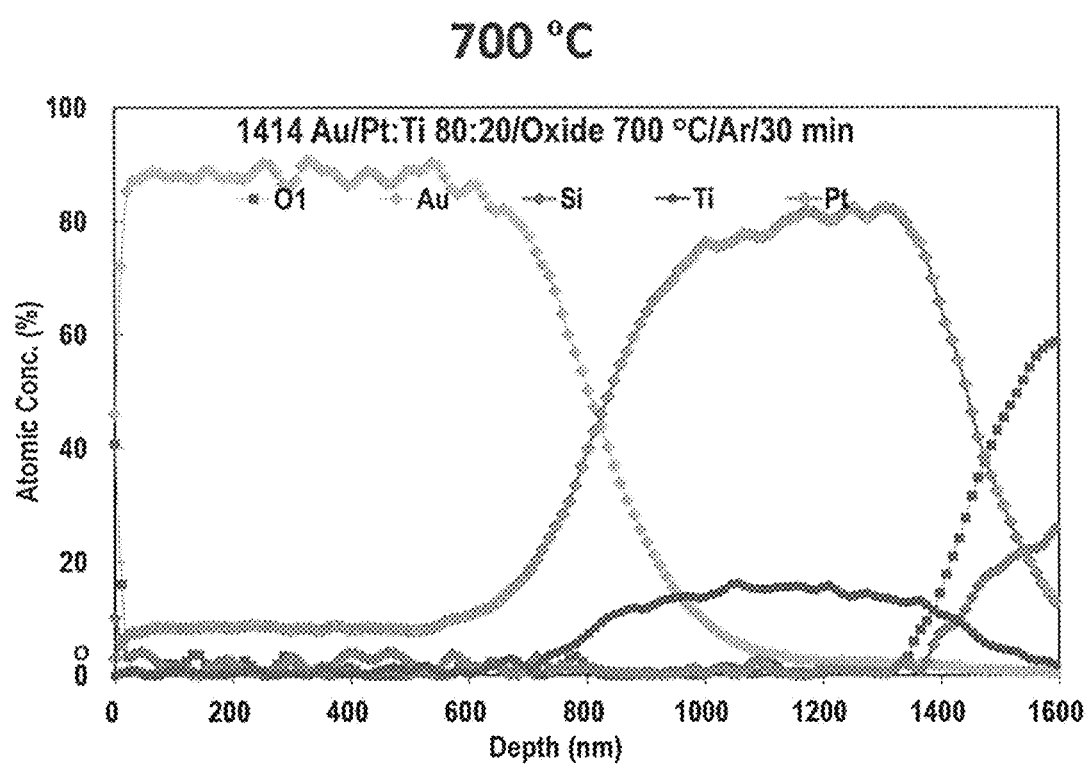
FIGS. 38A-38C are AES depth profiles of according to aspects of the innovation
Figure 38B:
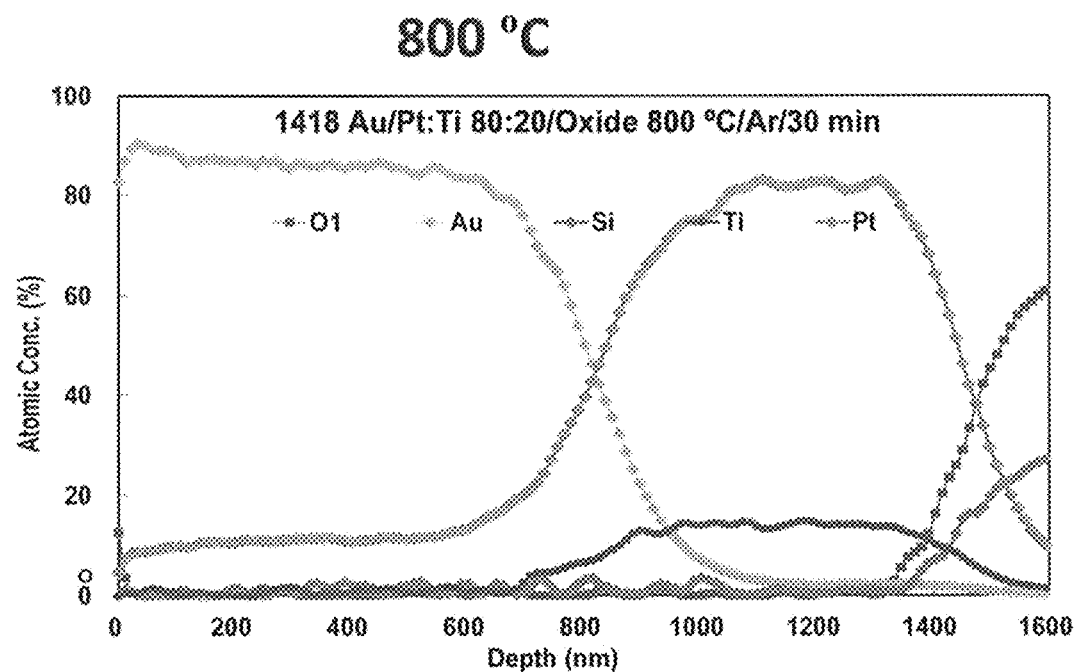
Figure 38C:
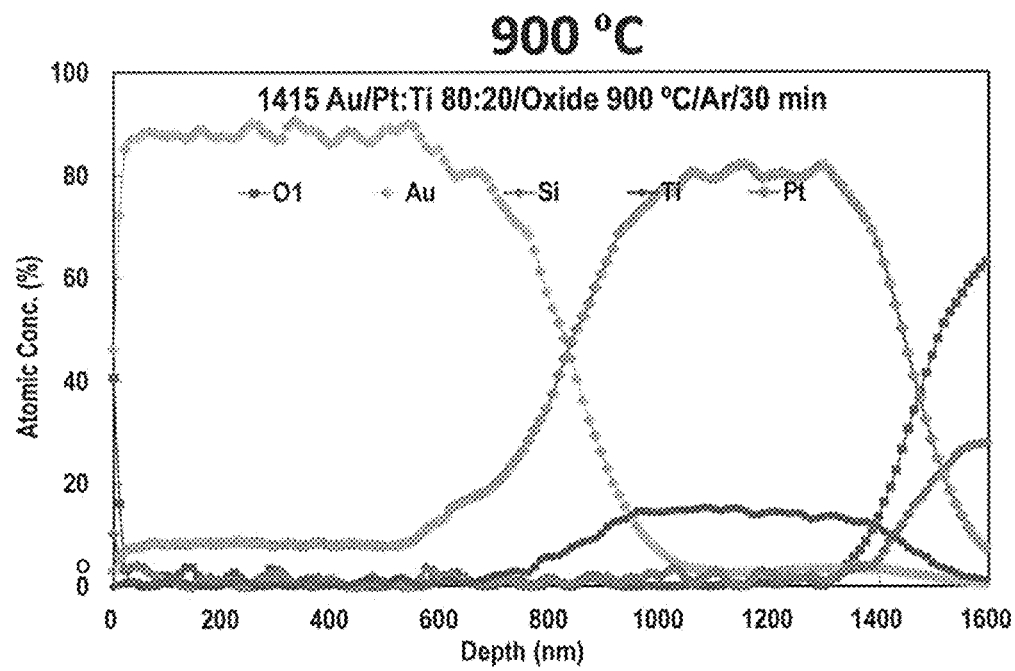

The resistivity of the buried Pt:Ti interconnect after soak at 700, 800, and 900° C. in O ambient for 1 hour was 93.85-, 93.85-, and 75-$\mu\Omega$-cm, respectively. The AES depth profiles after the thermal soaks at the above three temperatures are shown in FIGS. 36A-36C, respectively. The reaction zones are at the Pt:Ti/SiO$_2$ interfaces, and the prominent reaction was between Ti and SiO$_2$ to form titanium oxide and its silicide. This reaction resulted in the gradual depletion of titanium within the Pt:Ti layer as the temperature increased, thereby making the interconnect more Pt rich. This increase in Pt richness after 900° C. correlates well with the decrease in the resistivity of the buried interconnect. For comparison, the resistivity of Pt and Ti are 10.6 and 42 $\mu\Omega$-cm, respectively. However, these metals in elemental forms are either too reactive or have poor adhesion to be used for interconnect metallization.

Thus, according to an aspect, the innovation provides a the single conductor metallization of co-sputtered Pt:Ti 80:20 at. % ratio having the combined attributes of enabling simultaneous ohmic contacts to n- and p-type 4H—SiC, as a diffusion barrier against Au and O at high temperature, and as a promising interconnect metallization. While the resistivity of the interconnect conductor is single-digit times higher than that of Ti and Pt at room temperature, it has a potential application as a low power loss interconnecting conductor, particularly considering its fabrication process compatibility and robustness for high temperature applications. The significance of this result is that it would enable the production of SiC sensors and electronic devices faster at lower production and material costs with minimal penalty in performance.

Figure 39A:
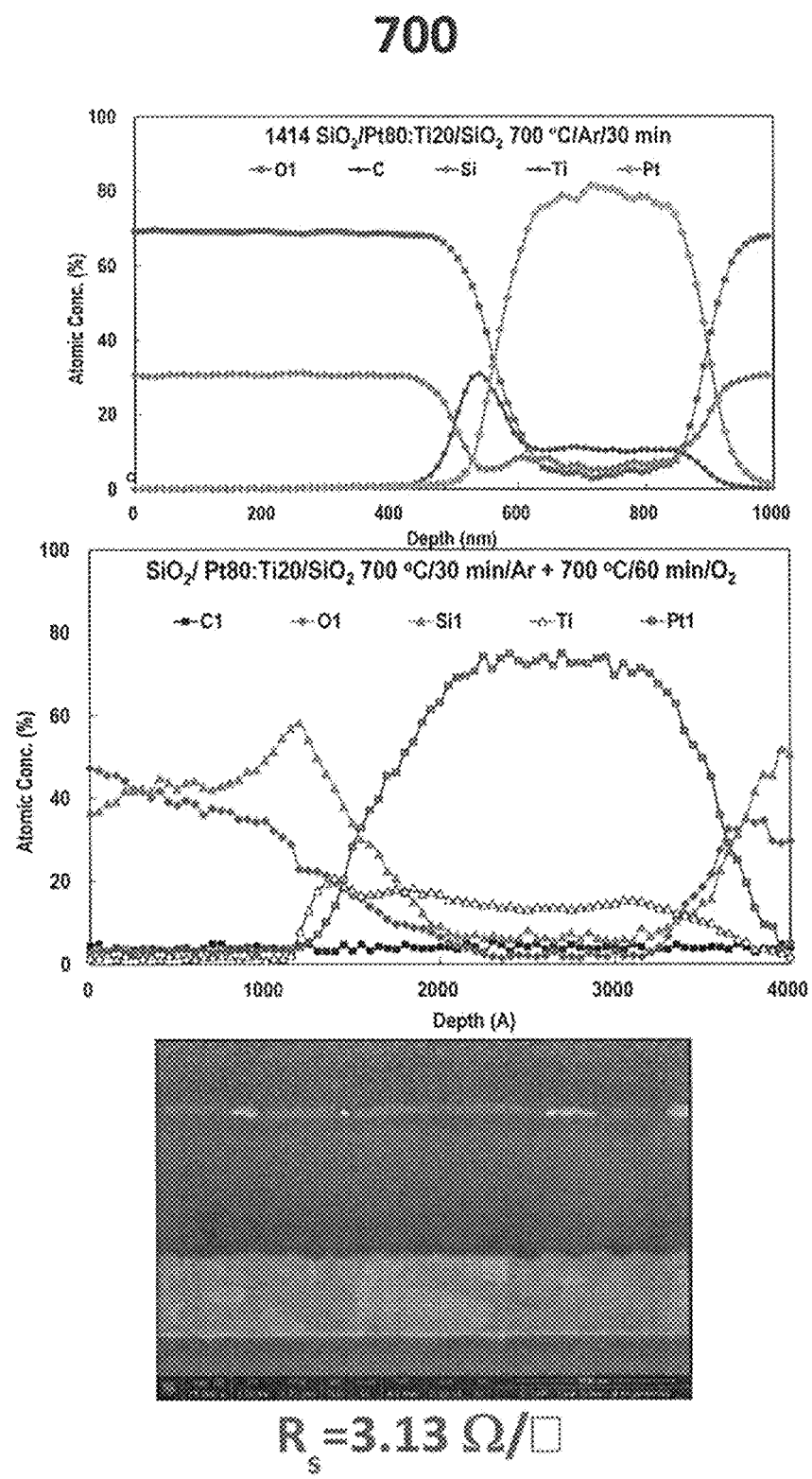
Figure 39C:
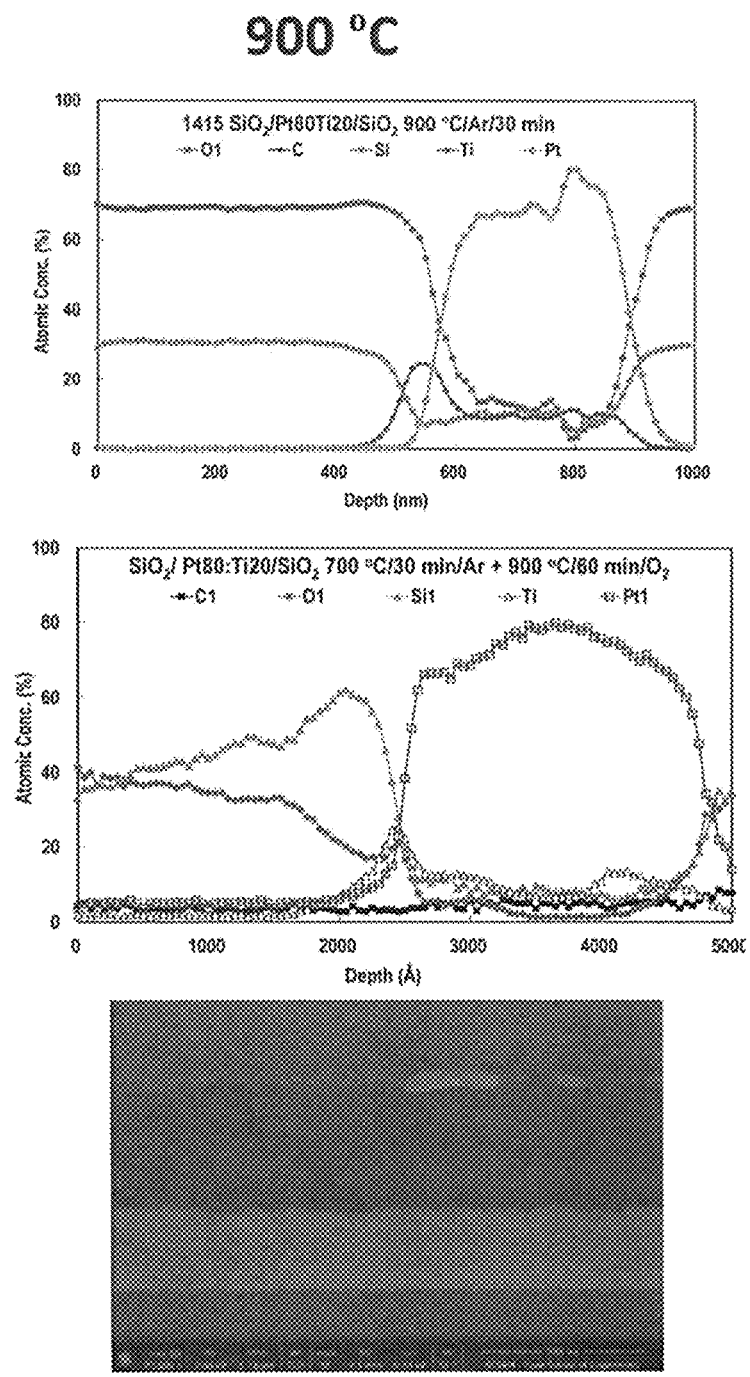

The resistivity of the buried Pt:Ti interconnect after soak at 700, 800, and 900° C. in O ambient for 1 hour was 93.85—(FIG. 39A), 93.85—(FIG. 39B), and 75—(FIG. 39C)$\mu\Omega$-cm, respectively. The AES depth profiles after the thermal soaks at the above three temperatures are shown in FIGS. 39A-39C, respectively. The reaction zones are at the Pt:Ti/SiO$_2$ interfaces, and the prominent reaction was between Ti and SiO$_2$ to form titanium oxide and its silicide. This reaction resulted in the gradual depletion of titanium within the Pt:Ti layer as the temperature increased, thereby making the interconnect more Pt rich. This increase in Pt richness after 900° C. correlates well with the decrease in the resistivity of the buried interconnect. For comparison, the resistivity of Pt and Ti are 10.6 and 42 $\mu\Omega$-cm, respectively. However, these metals in elemental forms are either too reactive or have poor adhesion to be used for interconnect metallization.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An ohmic contact structure comprising:
    a p-type 4H—SiC portion and an n-type 4H—SiC portion; and
    a metallization layer comprising a single alloy conductor comprising co-sputtered platinum and titanium (Pt—Ti) that simultaneously forms ohmic contact on the p-type and n-type 4H—SiC portions,
    wherein the single alloy conductor forms a diffusion barrier against gold and oxygen.

2. The ohmic contact structure of claim 1, wherein the metallization layer is stable at temperatures in excess of 800° C.

3. The ohmic contact structure of claim 1, wherein the metallization layer comprises a first metal carbide/silicide with a work function greater than the work function of the p-type SiC portion and a second metal carbide/silicide with a work function lower than the work function of the n-type SiC portion.

4. The ohmic contact structure of claim 1, wherein the metallization layer comprises a composition of Pt80-Ti20.

5. The ohmic contact structure of claim 1, wherein the metallization layer comprises a composition of Pt70-Ti30.

6. The ohmic contact structure of claim 1, wherein the co-sputtered Pt—Ti results in an intermixed metallization layer.

7. The ohmic contact structure of claim 3, wherein the metallization layer comprises a mixture of the first metal carbide/silicide and the second metal carbide/silicide.

8. The ohmic contact structure of claim 1, wherein the co-sputtered Pt—Ti is co-sputtered by phase segregation annealing (PSA).

9. The ohmic contact structure of claim 8, wherein PSA is achieved by annealing the single alloy conductor by vacuum RTA.

10. The ohmic contact structure of claim 1, wherein the co-sputtered Pt—Ti forms a film.

11. The ohmic contact structure of claim 1, wherein the diffusion barrier is about 200 nm thick.

12. The ohmic contact structure of claim 11, wherein the diffusion barrier is annealed in argon.

13. The ohmic contact structure of claim 12, wherein the diffusion barrier utilizes an aluminum layer as a contact mask for pattern etching.

14. The ohmic contact structure of claim 1, further comprising a second layer of a single alloy conductor annealed in argon.

15. The ohmic contact structure of claim 1, further comprising a sputtered capping layer.

16. The ohmic contact structure of claim 15, wherein the capping layer comprises gold.

* * * * *